(12) United States Patent
Tobita

(10) Patent No.: US 6,919,743 B2
(45) Date of Patent: Jul. 19, 2005

(54) DRIVE CIRCUIT WITH LOW CURRENT CONSUMPTION

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 118 days.

(21) Appl. No.: 10/355,286

(22) Filed: Jan. 31, 2003

(65) Prior Publication Data

US 2004/0160258 A1 Aug. 19, 2004

(30) Foreign Application Priority Data

| Feb. 20, 2002 | (JP) | ......... | 2002-043548 |
| Jul. 10, 2002 | (JP) | ......... | 2002-201519 |
| Nov. 8, 2002 | (JP) | ......... | 2002-325885 |

(51) Int. Cl.$^7$ ............................................. H03K 3/00
(52) U.S. Cl. .................. 327/108; 327/333; 326/62
(58) Field of Search .................. 327/108–112, 333; 326/62–82

(56) References Cited

U.S. PATENT DOCUMENTS

| 4,475,050 A | 10/1984 | Noufer |
| RE34,290 E | 6/1993 | Tobita |
| 5,892,390 A | 4/1999 | Tobita |
| 5,952,847 A * | 9/1999 | Plants et al. .................. 326/80 |
| 6,384,628 B1 * | 5/2002 | Lacey et al. .................. 326/41 |
| 6,583,647 B2 * | 6/2003 | Kim et al. .................... 326/81 |
| 6,664,943 B1 | 12/2003 | Nakajima et al. |

FOREIGN PATENT DOCUMENTS

| JP | 61-221812 | 10/1986 |
| JP | 10-254412 | 9/1998 |
| JP | 2000-194323 | 7/2000 |

* cited by examiner

Primary Examiner—Kenneth B. Wells
(74) Attorney, Agent, or Firm—Leydig, Voit & Mayer, Ltd.

(57) ABSTRACT

A drive circuit includes a first level shift circuit outputting a potential higher than an input potential by a prescribed voltage; a pull-up circuit outputting to an output node a potential lower than an output potential of the first level shift circuit by the prescribed voltage; a second level shift circuit outputting a potential lower than the input potential by the prescribed voltage; a pull-down circuit outputting to the output node a potential higher than an output potential of the second level shift circuit by the prescribed voltage; and a capacitor connected between output nodes of the first and second level shift circuits. Accordingly, through-current is reduced.

21 Claims, 79 Drawing Sheets

DRIVE CIRCUIT WITH LOW CURRENT CONSUMPTION

BACKGROUND OF THE INVENTION

1. Field of the Invention

The present invention relates to a drive circuit, and more particularly to a drive circuit outputting a potential corresponding to an input potential to an output node.

2. Description of the Background Art

In a semiconductor integrated circuit device, there has been incorporated a drive circuit for transmitting to a load a potential generated in a potential generating circuit having a small drive capability. FIG. 80 is a circuit diagram showing a configuration of such a drive circuit 300. In FIG. 80, drive circuit 300 includes: P-type field effect transistors (hereinafter, referred to as P-type transistors) 301 and 302; N-type field effect transistors (hereinafter, referred to as N-type transistors)303 and 304; and a constant current source 305.

P-type transistors 301 and 302 are connected between a node of power supply potential VCC and a node N301 and between the node of power supply potential VCC and a node N302, respectively, and the gates thereof are connected both to node N301. P-type transistors 301 and 302 constitute a current mirror circuit. N-type transistor 303 is connected between node N301 and a N305, and the gate thereof is connected to an input node N303. N-type transistor 304 is connected between nodes N302, and N305 and the gate thereof is connected to an output node N304 and node N302. Constant current source 305 is connected between node N305 and a node of ground potential GND to supply a constant current.

A current of a value corresponding to a potential VI at input node N303 flows in N-type transistor 303. Since N-type transistor 303 and P-type transistor 301 are connected in series with each other and P-type transistors 301 and 302 constitute a current mirror circuit, currents of the same value flow through transistors 301 to 303. In a case where a potential VO at output node N304 is lower than an input potential VI, a current flowing in N-type transistor N304 is smaller than that flowing through transistors 301 and 303 to raise output potential VO. In a case where potential VO at output node N304 is higher than input potential VI, a current flowing in N-type transistor N304 is larger than that flowing through transistors 301 and 303 to lower output potential VO. Accordingly, output potential VO becomes equal to input potential VI.

In a conventional drive circuit 300, however, since a constant through-current always flows into the node of ground potential GND from the node of power supply potential VCC through transistors 301 to 304, and constant current source 305, there has been a problem of high current consumption.

SUMMARY OF THE INVENTION

It is accordingly a main object of the present invention to provide a drive circuit with low current consumption.

A drive circuit according to the present invention includes: a first level shift circuit outputting a potential obtained by level shifting an input potential by a predetermined first voltage in one potential direction; and a second level shift circuit outputting a potential obtained by level shifting an output potential of the first level shift circuit by a predetermined second voltage in another potential direction opposite to the one potential direction to an output node. Thus, through currents of the first and second level shift circuits are suppressed to be small, thereby reducing the current consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
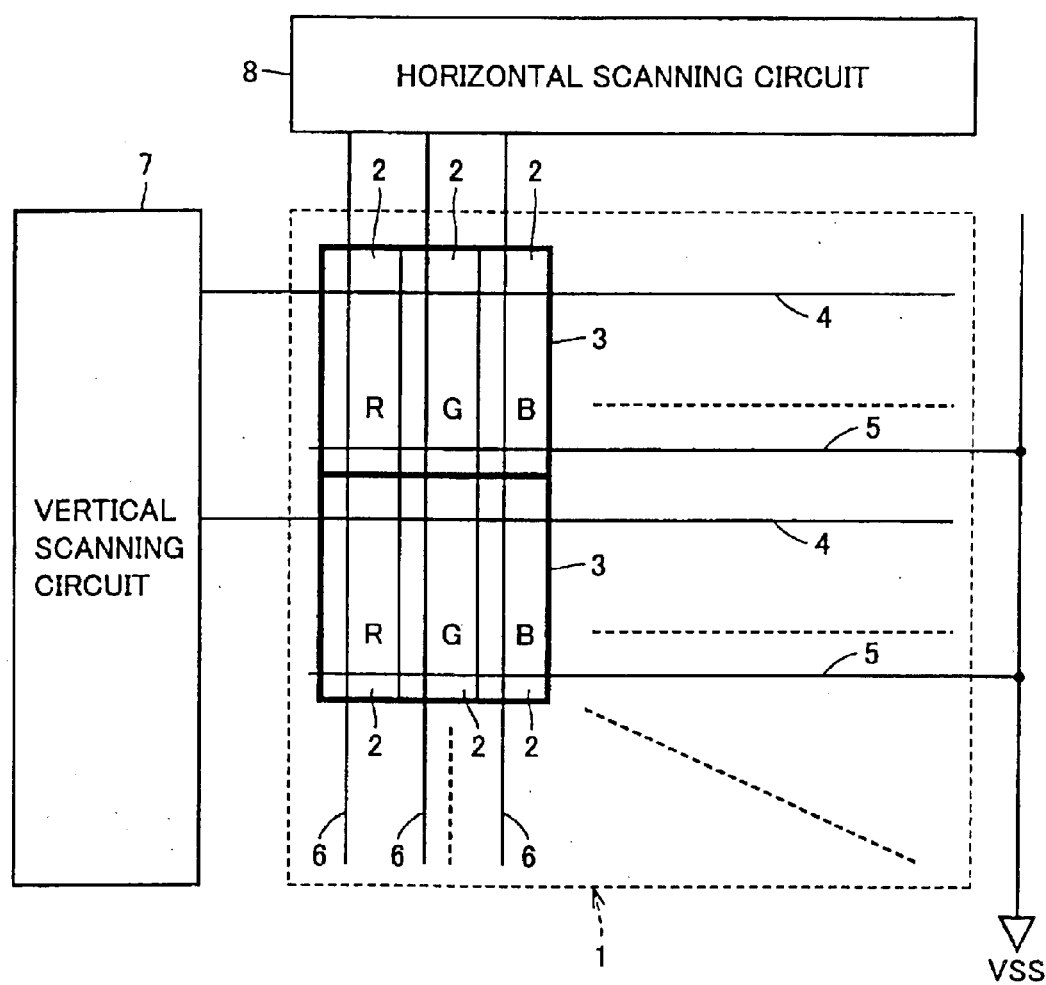
FIG. 1 is a block diagram showing an overall configuration of a color liquid crystal display apparatus according to a first embodiment of the present invention.

FIG. 1 is a block diagram showing a configuration of a color liquid crystal display apparatus according to a first embodiment of the present invention. In FIG. 1, the color liquid crystal display apparatus includes: a liquid crystal panel 1; a vertical scanning circuit 7; and a horizontal scanning circuit 8, and is incorporated into, for example, a portable telephone.

Liquid crystal panel 1 includes: plural liquid crystal cells 2 arranged in plural rows and plural columns; scanning lines 4 and common potential lines 5 provided correspondingly to respective rows; and data lines 6 provided correspondingly to respective columns.

Liquid crystal cells 2 have been divided in advance into groups each including three cells in each row. Three liquid crystal cells 2 in each group are provided with respective color filters R, G, B. The three liquid crystal cells 2 in each group constitute one pixel 3.

Figure 2:
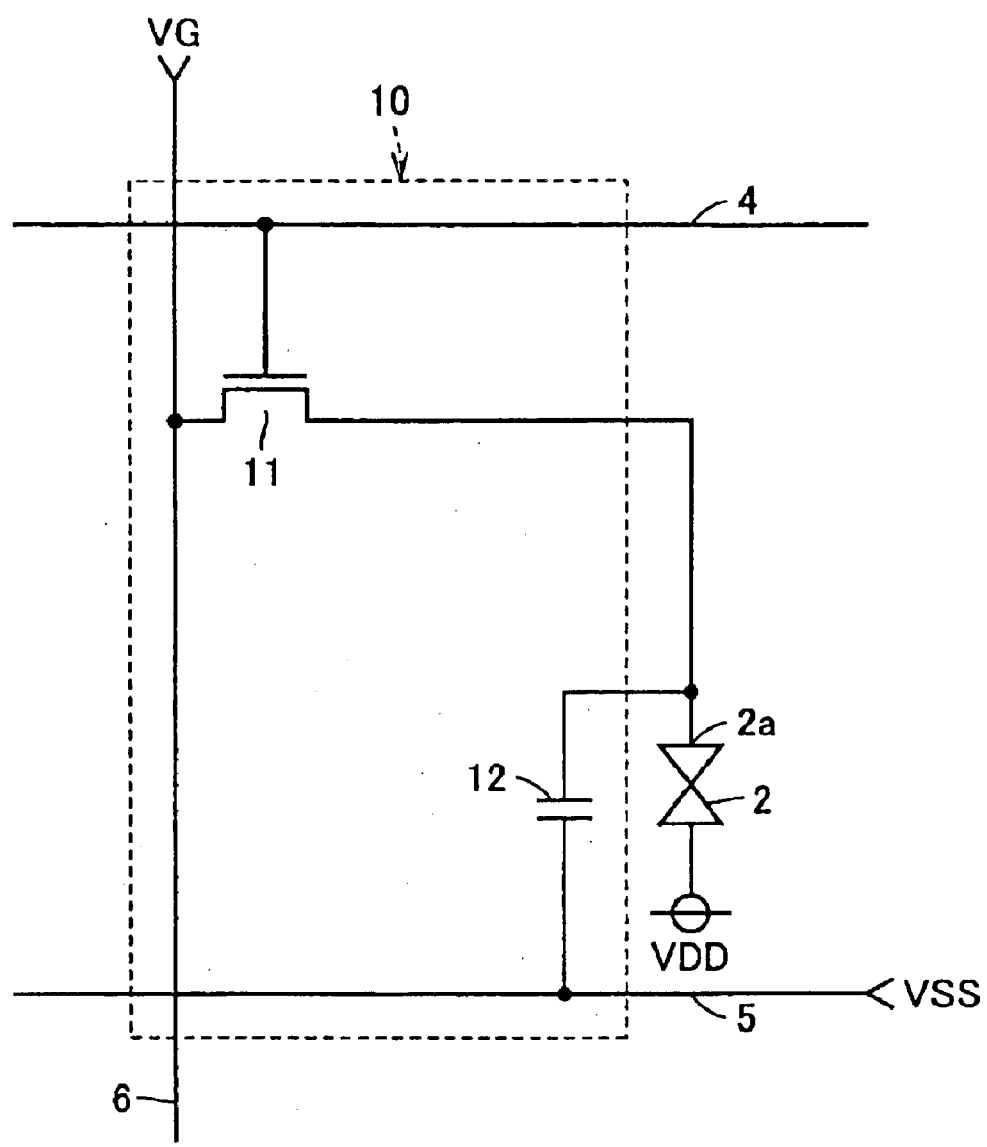
FIG. 2 is a circuit diagram showing a configuration of a liquid crystal drive circuit provided correspondingly to each liquid crystal cell shown in FIG. 1.

Each liquid crystal cell 2 is provided with a liquid crystal drive circuit 10 as shown in FIG. 2. Liquid crystal drive circuit 10 includes: an N-type transistor 11 and a capacitor 12. N-type transistor 11 is connected between data line 6 and one electrode 2a of liquid crystal cell 2, and the gate thereof is connected to scanning line 4. Capacitor 12 is connected between the one electrode 2a of liquid crystal cell 2 and common potential line 5. The other electrode of liquid crystal cell 2 is applied with drive potential VDD and common potential line 5 is applied with common potential VSS.

Returning to FIG. 1, vertical scanning circuit 7 selects plural scanning lines 4 sequentially according to an image signal to hold selected scanning line 4 in selected state for a prescribed time and to raise selected scanning line 4 to H level at select level. When scanning line 4 has been raised to H level at select level, N-type transistor 11 becomes conductive to couple the one electrode 2a of liquid crystal cell 2 corresponding to scanning line 4 to data line 6 corresponding to liquid crystal cell 2.

Horizontal scanning circuit 8 selects plural data lines 6 sequentially in batches each of, for example, 12 lines during a period when one scanning line 4 is held in selected state by vertical scanning circuit 7 according to an image signal and applies a gradation potential VG to each of selected data lines 6. A light transmittance of liquid crystal cell 2 alters according to a level of a gradation potential VG.

When all liquid crystal cells 2 on liquid crystal panel 1 have been scanned by vertical scanning circuit 7 and horizontal scanning circuit 8, one picture is displayed on liquid crystal panel 1.

Figure 3:
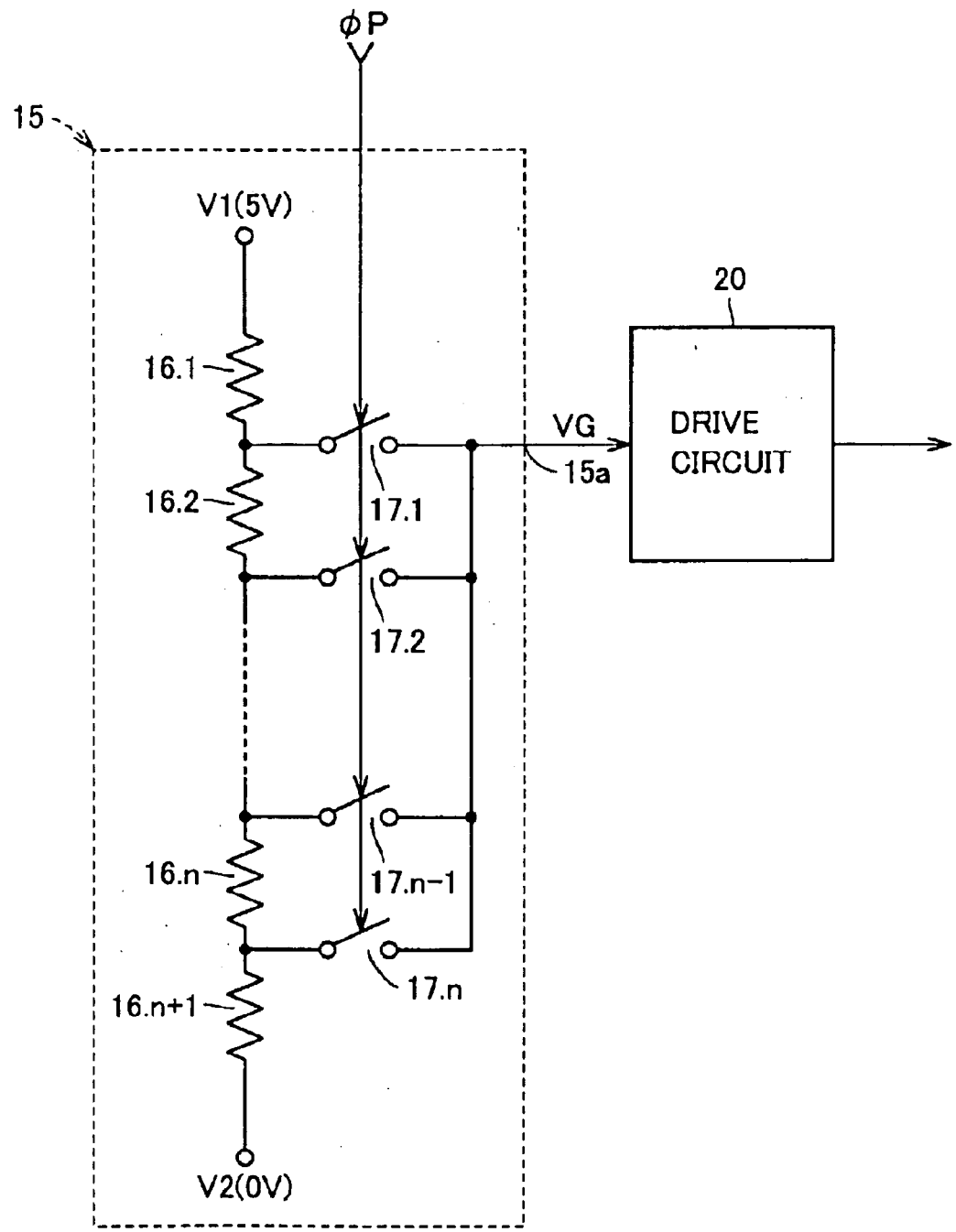
FIG. 3 is a circuit block diagram showing a main part of a horizontal scanning circuit shown in FIG. 1.

FIG. 3 is a circuit block diagram showing a main part of the horizontal scanning circuit 8 shown in FIG. 1. In FIG. 3, horizontal scanning circuit 8 includes: a gradation potential generating circuit 15; and a drive circuit 20. There are provided gradation potential generating circuits 15 and drive circuits 20 the number of each of which is equal to the number (in this case, which is 12) of data lines 6 simultaneously selected by horizontal scanning circuit 8.

Gradation potential generating circuit 15 includes: n+1 resistance elements 16.1 to 16.n+1, where n is a natural number, which applies hereinafter, series-connected between a node at a first power supply potential V1 (5 V) and a node at a second power supply potential V2 (0 V); and n switches 17.1 to 17.n connected between respective n nodes between n+1 resistance elements 16.1 to 16.n+1, and output node 15a.

Potentials at n levels appear at respective n nodes between n+1 resistance elements 16.1 to 16.n+1. Switches 17.1 to 17.n are controlled by an image density signal φP to cause only one of them to be in conductive state. A potential at one level of the potentials at n levels is outputted to output node 15a as gradation potential VG. Drive circuit 20 supplies a current to selected data line 6 so that selected data line 6 takes gradation potential VG.

Figure 4:
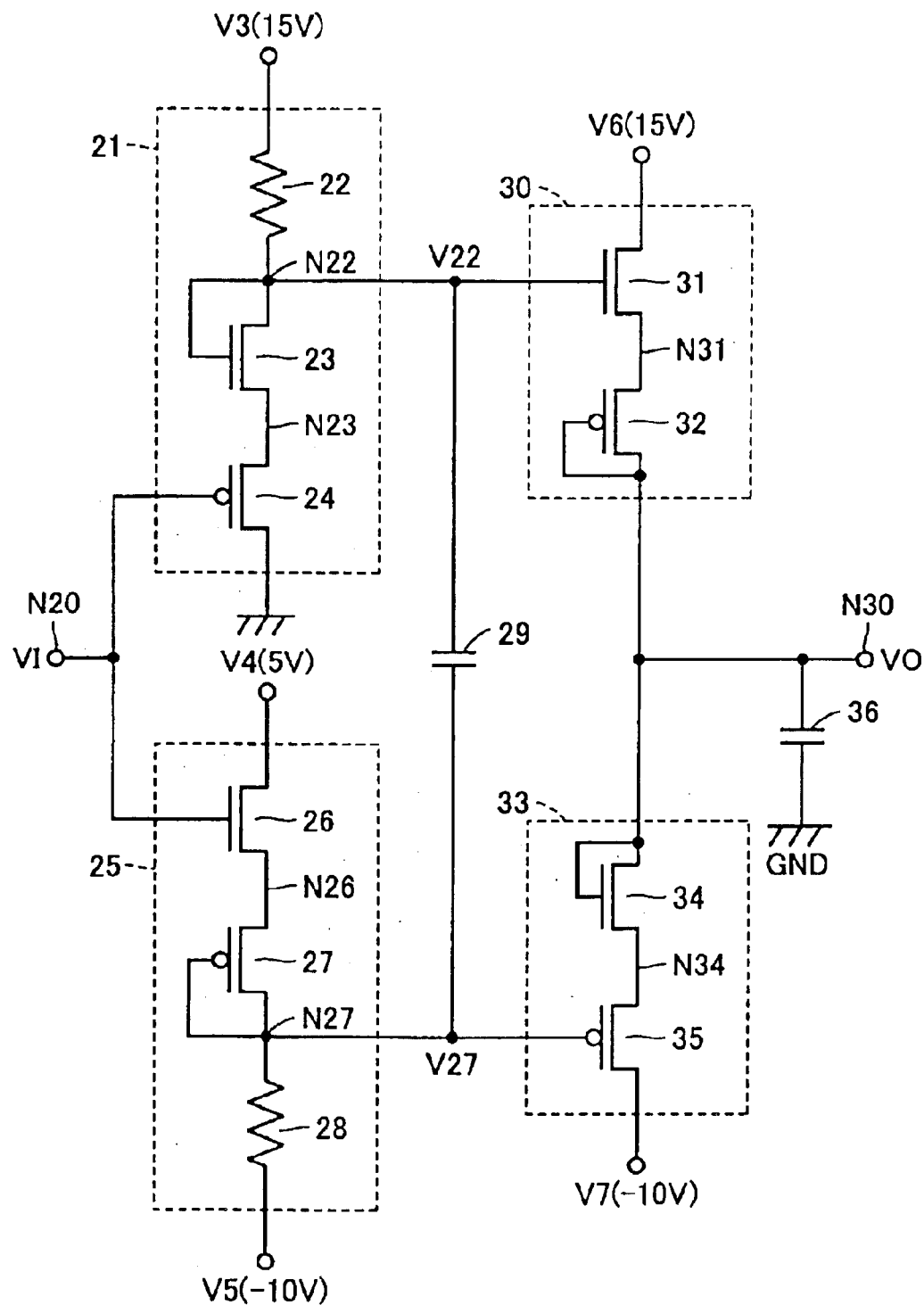
FIG. 4 is a circuit diagram showing a configuration of a drive circuit shown in FIG. 3.

FIG. 4 is a circuit diagram showing a configuration of drive circuit 20. In FIG. 4, drive circuit 20 includes: level shift circuits 21 and 25; a capacitor 29, a pull-up circuit 30 and a pull-down circuit 33.

Level shift circuit 21 includes: a resistance element 22, an N-type transistor 23 and a P-type transistor 24 series-connected between a node of a third power supply potential V3 (15 V) and a node of a ground potential GND. The gate of N-type transistor 23 is connected to the drain (a node N22) thereof. N-type transistor 23 serves as a diode element. The gate of P-type transistor 24 is connected to an input node N20. A resistance value of resistance element 22 is set to a value sufficiently larger than on-resistance values of transistors 23 and 24.

If a potential (gradation node) at input node N20 is V1, a threshold voltage of a P-type transistor is VTP and a threshold value of an N transistor is VTN by definition, a potential V23 at the source (node N23) of the P-type transistor 24 and a potential V22 at the drain (node N22) of the N-type transistor 23 are given by respective below formulae (1) and (2):

$$V23 = V1 + |VTP| \quad (1)$$

$$V22 = V1 + |VTP| + VTN \quad (2)$$

Therefore, level shift circuit 21 outputs potential V22 obtained by level shifting input potential VI by |VTP|+VYN.

Level shift circuit 25 includes: an N-type transistor 26; a P-type transistor 27 and a resistance element 28 series-connected between a node of a fourth power supply potential V4 (5V) and a fifth power supply potential V5 (−10 V). The gate of N-type transistor 26 is connected to input node N20. The gate of P-type transistor 27 is connected to the drain (node N27) thereof. P-type transistor serves as a diode element. A resistance value of resistance element 28 is set to a value sufficiently larger than on-resistance values of transistors 26 and 27.

A potential V26 at the source (node N26) of N-type transistor 26 and a potential V27 at the drain (node N27) of P-type transistor 27 are given by respective below formulae (3) and (4):

$$V26=VI-VTN \quad (3)$$

$$V27=VI-VTN-|VTP| \quad (4)$$

Therefore, level shift circuit 25 outputs potential V27 obtained by level shifting input potential VI by −VTN−|VTP|.

Capacitor 29 is connected between an output node N22 of level shift circuit 21 and output node N27 of level shift circuit 25. Capacitor 26 transmits not only a change in potential at node N22 to node N27, but a change in potential at node N27 to node N22.

Pull-up circuit 30 includes: an N-type transistor 31; and a P-type transistor 32 series-connected between a node of a sixth power supply potential V6 (15 V) and an output node N30. A load capacitance (a parasitic capacitance of data line 6) is connected to output node N30. N-type transistor 31 receives output potential V22 of level shift circuit 21 at the gate thereof. The gate of P-type transistor 32 is connected to the drain thereof. P-type transistor 30 serves as a diode element. Since Sixth power supply potential V6 is set so that N-type transistor 31 operates in a saturation region, N-type transistor 31 performs a so-called source-follower operation.

Figure 5:
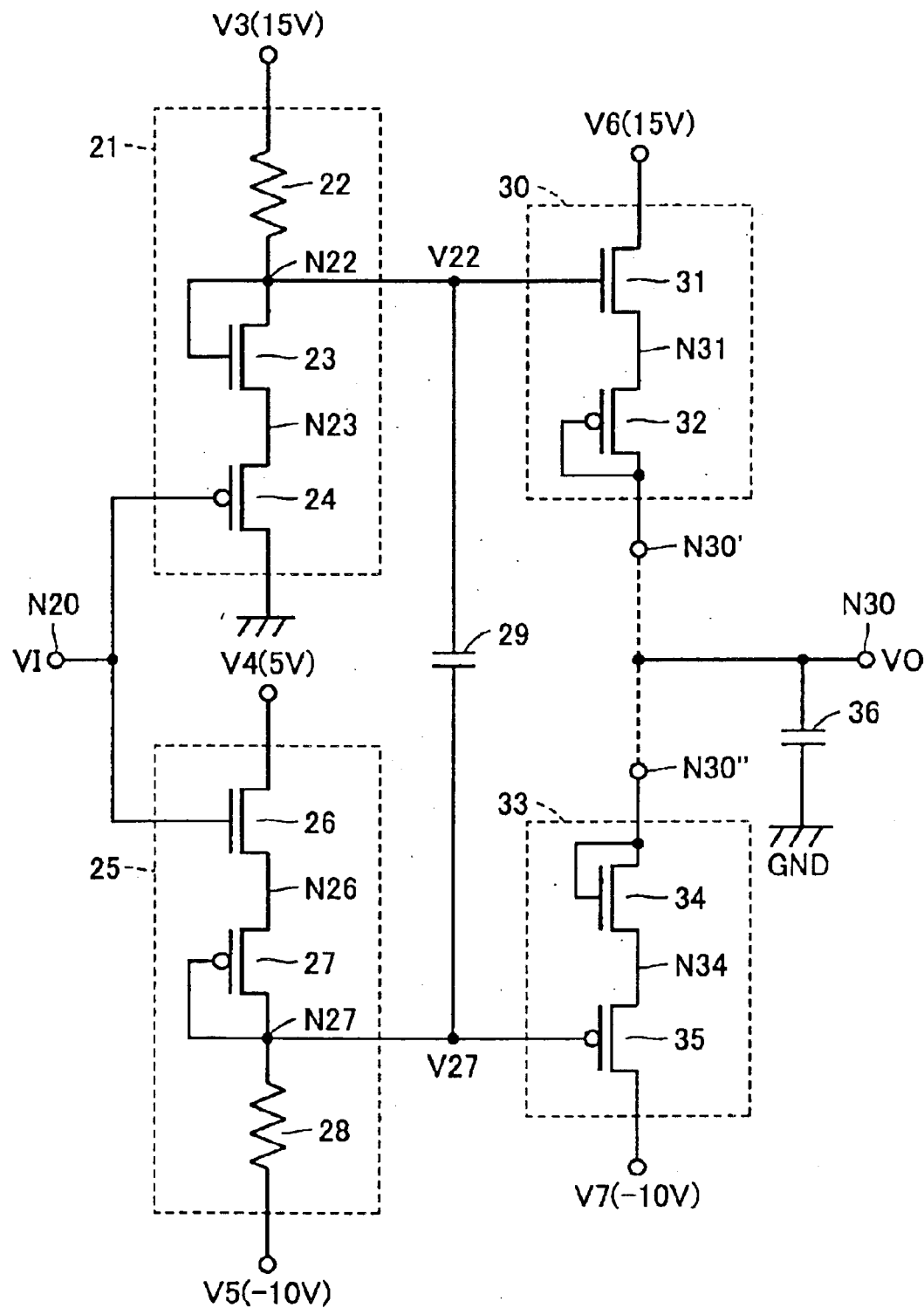
FIG. 5 is a circuit diagram for describing operations in the drive circuit shown in FIG. 4.

Now, for convenience in description, it is assumed that the drain (node N30') of P-type transistor 32 and output node N30 are non-conductive therebetween as shown in FIG. 5. A potential V31 at the source (node N31) of N-type transistor 31 and a potential V30' at the drain (node N30') of P-type transistor 32 are given by respective below formulae (5) and (6):

$$V31=V22-VTN=VI+|VTP| \quad (5)$$

$$V30'=V31-|VTP|=VI \quad (6)$$

Returning to FIG. 4, pull-down circuit 33 includes: a P-type transistor 35 and an N-type transistor 34 series-connected between a node of a seventh power supply potential V7 (−10 V) and output node N30. P-type transistor 35 receives an output potential V27 of level shift circuit 25 at the gate thereof. The gate of N-type transistor 34 is connected to the drain thereof. N-type transistor 34 serves as a diode element. Since seventh power supply potential V7 is set so that P-type transistor 35 operates in a saturation region, P-type transistor 36 performs a so-called source-follower operation.

Now, for convenience in description, it is assumed that the drain (node N30") of P-type transistor 34 and output node N30 are non-conductive therebetween as shown in FIG. 5. A potential V34 at the source (node N34) of P-type transistor 35 and a potential V30" at the drain (node N30") of N-type transistor 34 are given by respective below formulae (7) and (8):

$$V34=V27+|VTP|=VI-VTN \quad (7)$$

$$V30"=V34+VTN=VI \quad (8)$$

The formulae (7) and (8) indicate that even if the drain (node N30') of P-type transistor 32 and the drain (node N30") of N-type transistor 34 are connected to each other, no current flows between the node of sixth power supply potential V6 and the node of seventh power supply potential V7, and potential VO at output node N30 and potential VI of input node N20 are equal to each other. Therefore, when resistance values of resistance elements 22 and 28 are set sufficiently large, a through-current is extremely small in a stationary state where VO=VI.

Figure 6:
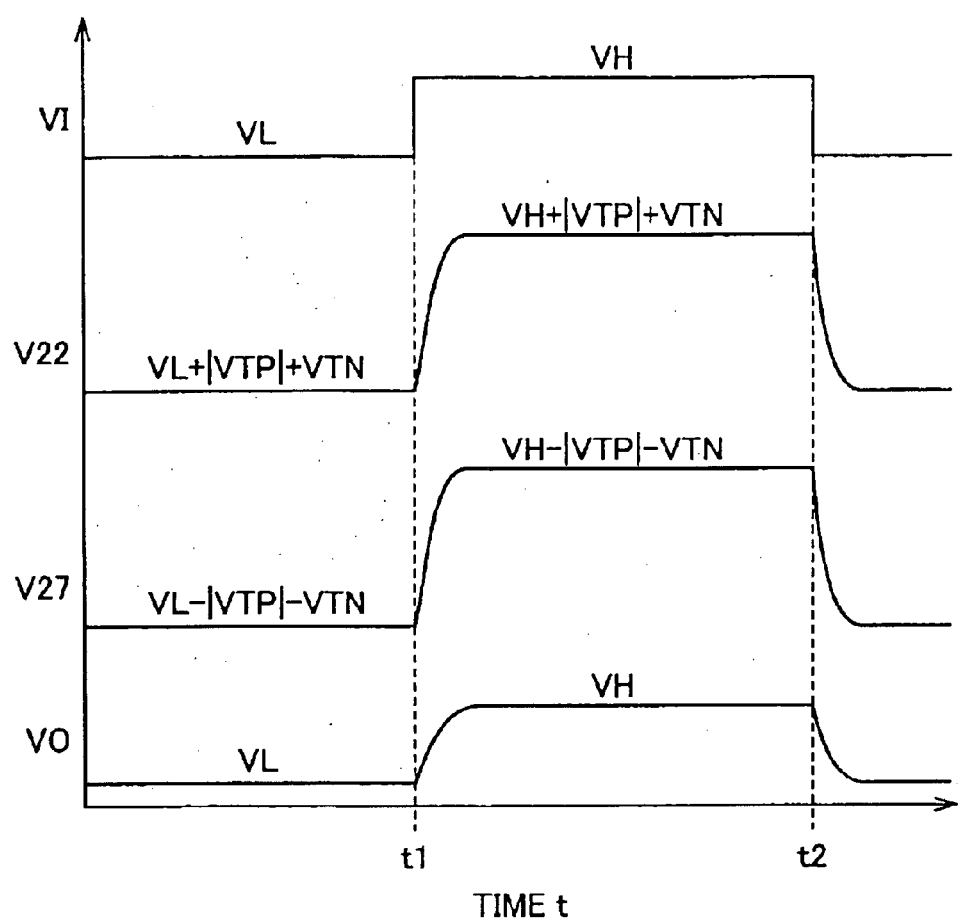
FIG. 6 is a time chart for describing operations in the drive circuit shown in FIG. 4.

FIG. 6 is a time chart for describing an ac operation (an operation in a transition state) of drive circuit 20. In FIG. 6, it is assumed that, in an initial state, VI=VL. In such a condition, V22, V27 and VO are given by respective below formulae:

$$V22=VL+|VTP|+VTN$$

$$V27=VL-|VTP|-VTN$$

$$VO=VL$$

If VI is raised from VL to VH at time point t1, V22, V27 and VO are given by respective below formulae after a prescribed time elapses:

$$V22=VH+|VTP|+VTN$$

$$V27=VH-|VTP|-VTN$$

$$VO=VH$$

The following operations are performed during the course of the level change. In level shift circuit 25, when, at time point t1, input potential VI is raised from VL to VH, a drive capability of N-type transistor 26 increases to raise potential V26 at node N26 rapidly. With rapid increase in potential V26, a source-to-gate voltage of P-type transistor 27 increases to enhance a drive capability of P-type transistor 27 and to thereby raise potential V27 at node N27 rapidly.

With a rapid rise in potential V27 at node N27, potential V22 at node N22 rises rapidly by VH−VL through capacity 29 by capacitive coupling. In response to this, potential VO at output node N30 also rises from VL to VH rapidly.

When, at time point t2, input potential VI falls from VH to VL, a drive capability of P-type transistor 24 increases to lower potential V23 at node N23 rapidly. With rapid decreases in potential V23, a gate-to-source voltage of N-type transistor 23 increases to enhance a drive capability of N-type transistor 23 and to thereby lower potential V22 at node N22 rapidly.

With rapid fall in potential V22 at node N22, potential V27 at node N27 falls rapidly by VH−VL through capacity 26 by capacitive coupling. In response to this, potential VO at output node N30 also falls from VH to VL rapidly.

In the first embodiment, since, in stationary state, no through-current flows in pull-up circuit 30 and pull-down circuit 33 and through-currents in level shift circuits 21 and 25 can also be reduced by setting resistance values of resistance elements 22 and 26 to a sufficiently higher value than on-resistance values of transistors 23, 24, 26 and 27, through currents can be reduced. Furthermore, quick response to a change in input potential VI can be ensured by providing capacitor 26 additionally.

Figure 7:
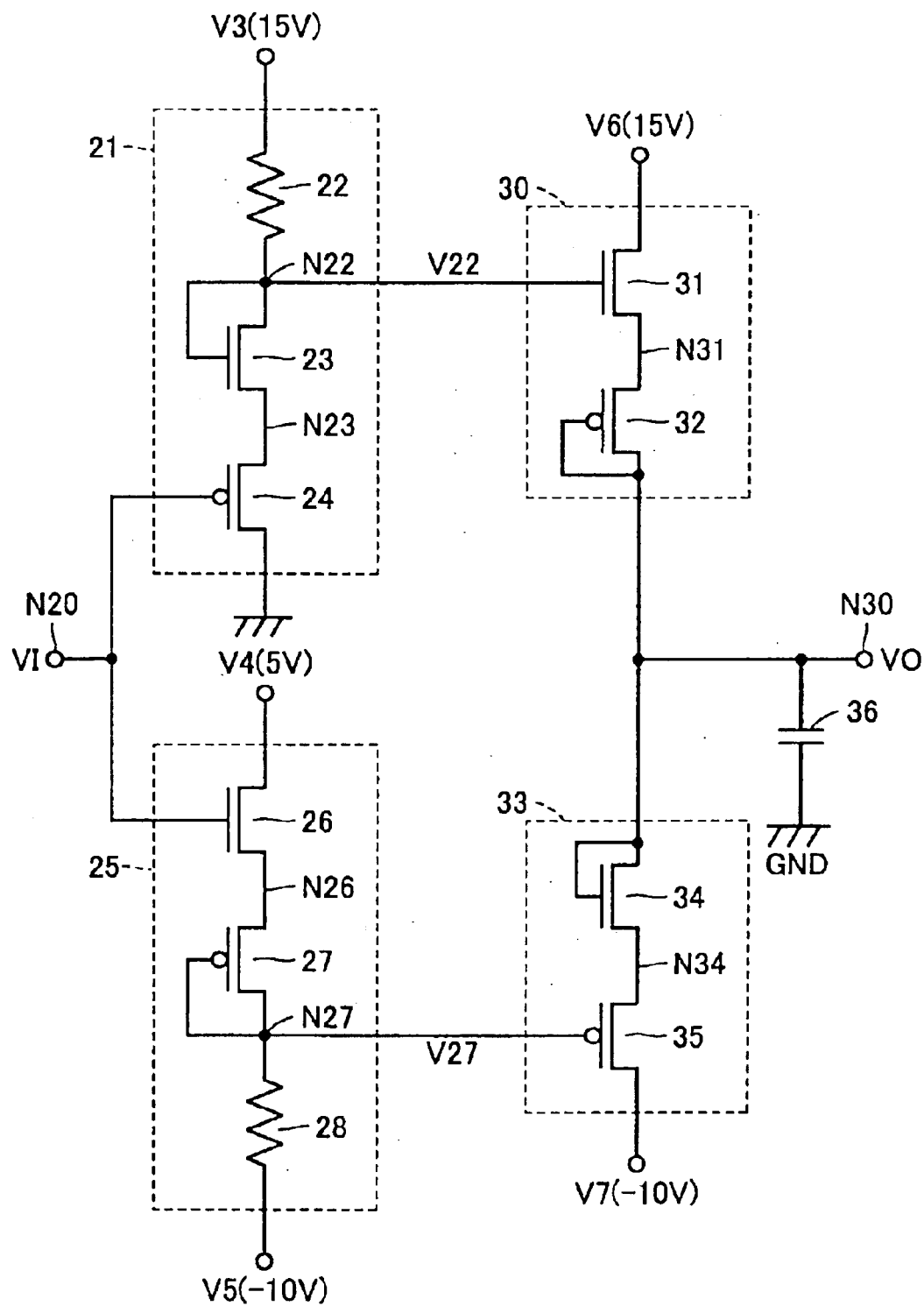
FIG. 7 is a circuit diagram showing an example modification of the first embodiment.

Description will be given of various example modifications below. A drive circuit 36 of FIG. 7 is of a configuration obtained by removing capacitor 29 from drive circuit 20 of FIG. 4. In a case where a capacitance value of load circuit 36 is comparatively small, sizes of transistors 23, 24, 26, 27, 31, 32, 34 and 35 can be reduced. With smaller sizes of transistors 23, 27, 31 and 35, the gate capacitance values of transistors 23,27,31 and 35 decrease to reduce parasitic resistance of nodes N22 and N27. Therefore, even without capacitor 29, it is enabled to raise or lower potentials V22 and V27 at respective nodes N22 and N27 by charge or discharge performed through resistance elements 22 and 28.

In this example modification, since capacitor 29 is removed, a smaller occupancy area of the circuit is realized.

Figure 8:
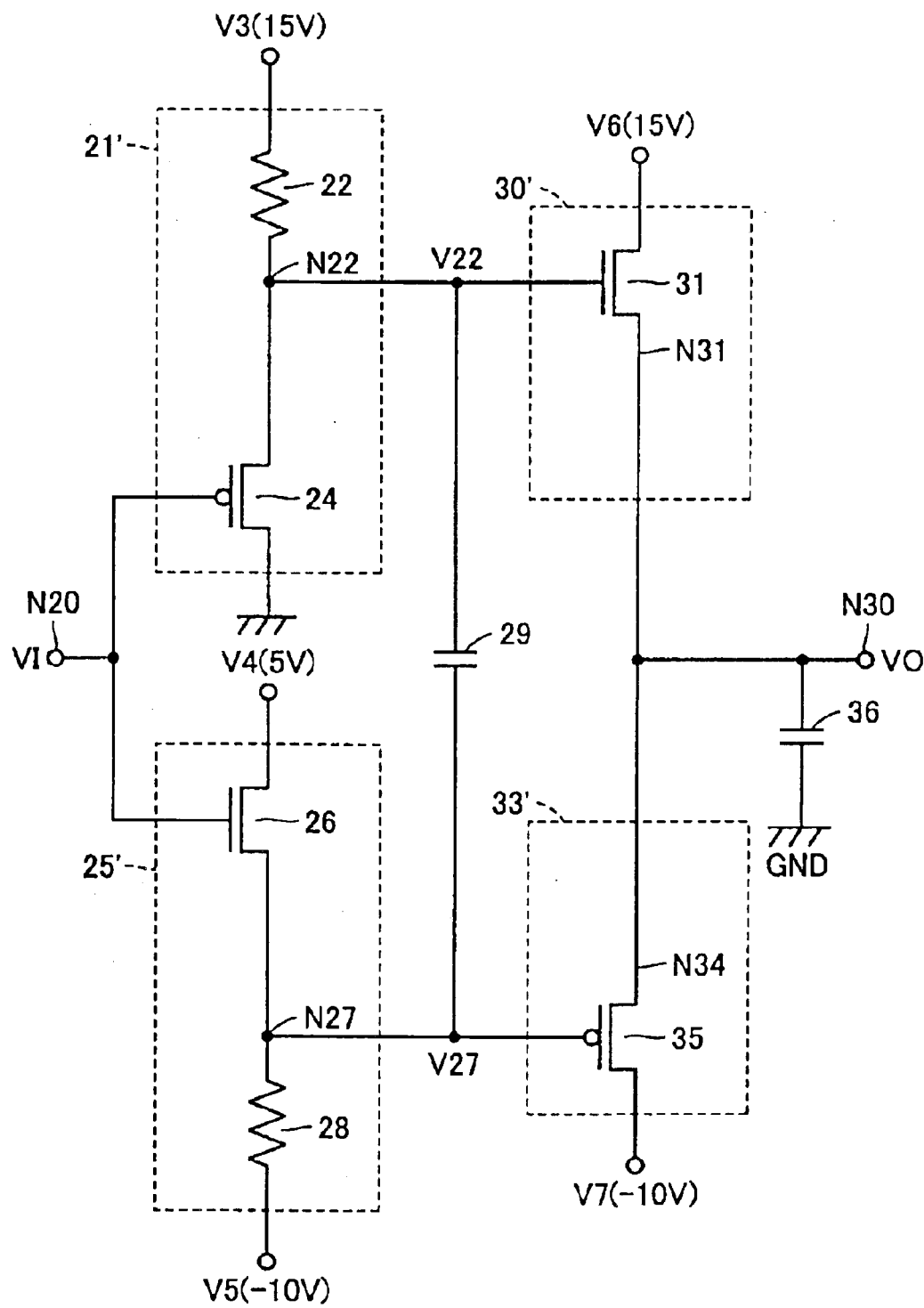
FIG. 8 is a circuit diagram showing another example modification of the first embodiment.

A drive circuit 37 of FIG. 8 is of a configuration obtained by removing transistors 23, 27, 32 and 34 each in diode connection from drive circuit 20 of FIG. 4. Output potential VO=VI+|VTP|−VTN. If it is set that |VTR|≈VTN, VO≈VI. Alternatively, if a value of |VTR|−VTN is considered as an offset value in use, the circuit can be used similarly to drive circuit 20 of FIG. 4. In this example modification, since transistors 23, 27, 32 and 34 are not present because of the removal thereof, a smaller occupancy area of the circuit can be realized.

Figure 9:
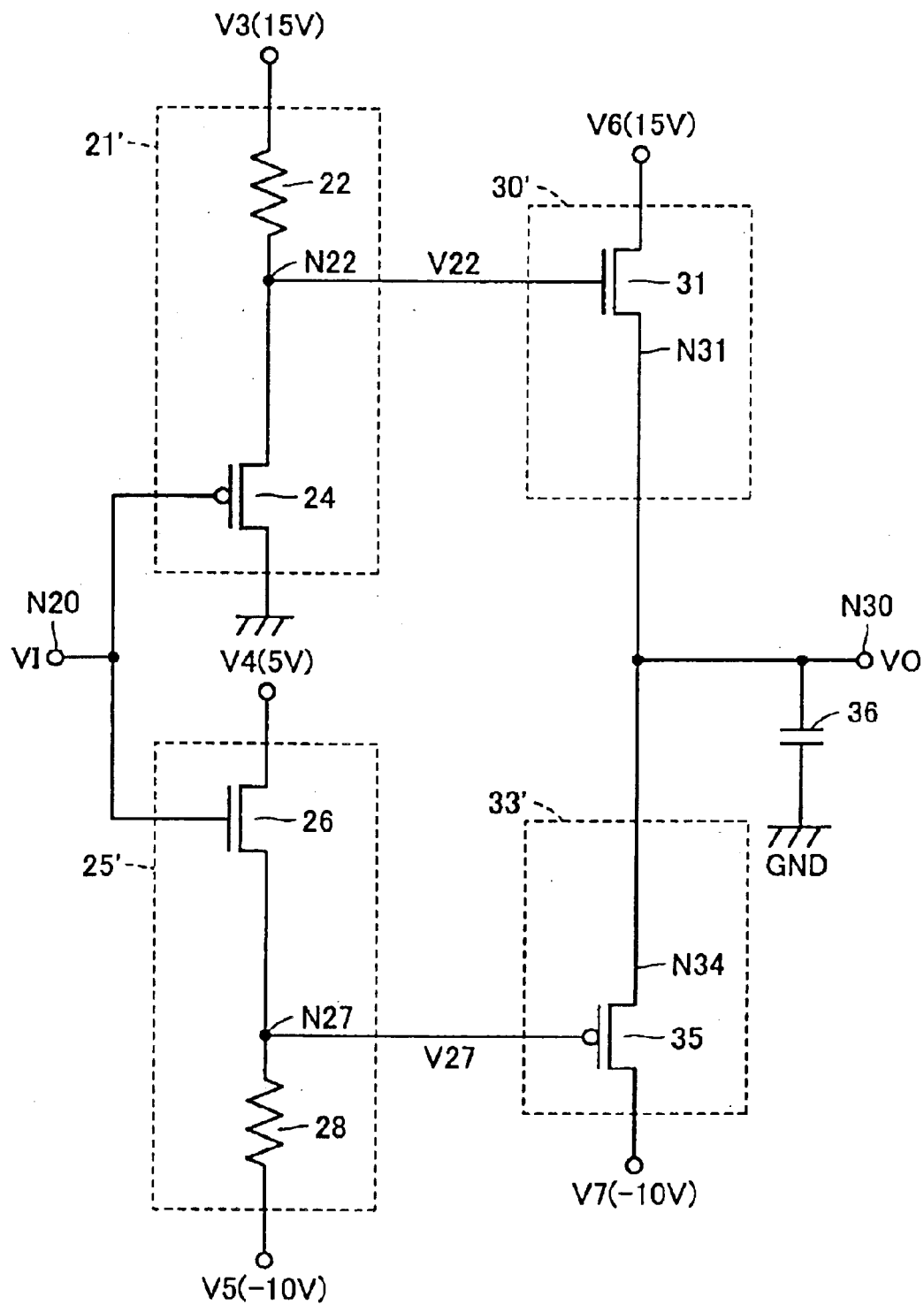
FIG. 9 is a circuit diagram showing still another example modification of the first embodiment.

A drive circuit 38 of FIG. 9 is of a configuration obtained by further removing capacitor 29 from drive circuit 37 of FIG. 8. In a case where a capacitance value of load capacitance 36 is comparatively small, sizes of transistors 24, 26, 31 and 35 can be reduced to thereby enable parasitic capacitance of nodes N22 and N27 to be smaller. Thereby, even without capacitor 29, a rise and fall in potential V22 and V27 at node N22 and N27 are enabled by charge and discharge performed through resistance elements 22 and 28. In this example modification, since capacitor 29 is not present because of the removal thereof, a smaller occupancy area of the circuit can be realized.

Second Embodiment

While, in the first embodiment, it is assumed that all transistors with the same polarity have the same threshold voltage, a variation, in some case, actually arises in the threshold voltages of respective transistors, being caused by fluctuations in parameters of fabrication condition. With a variation in threshold voltages produced, VI=VO is not established. In the second embodiment, this problem is to be solved.

Figure 10:
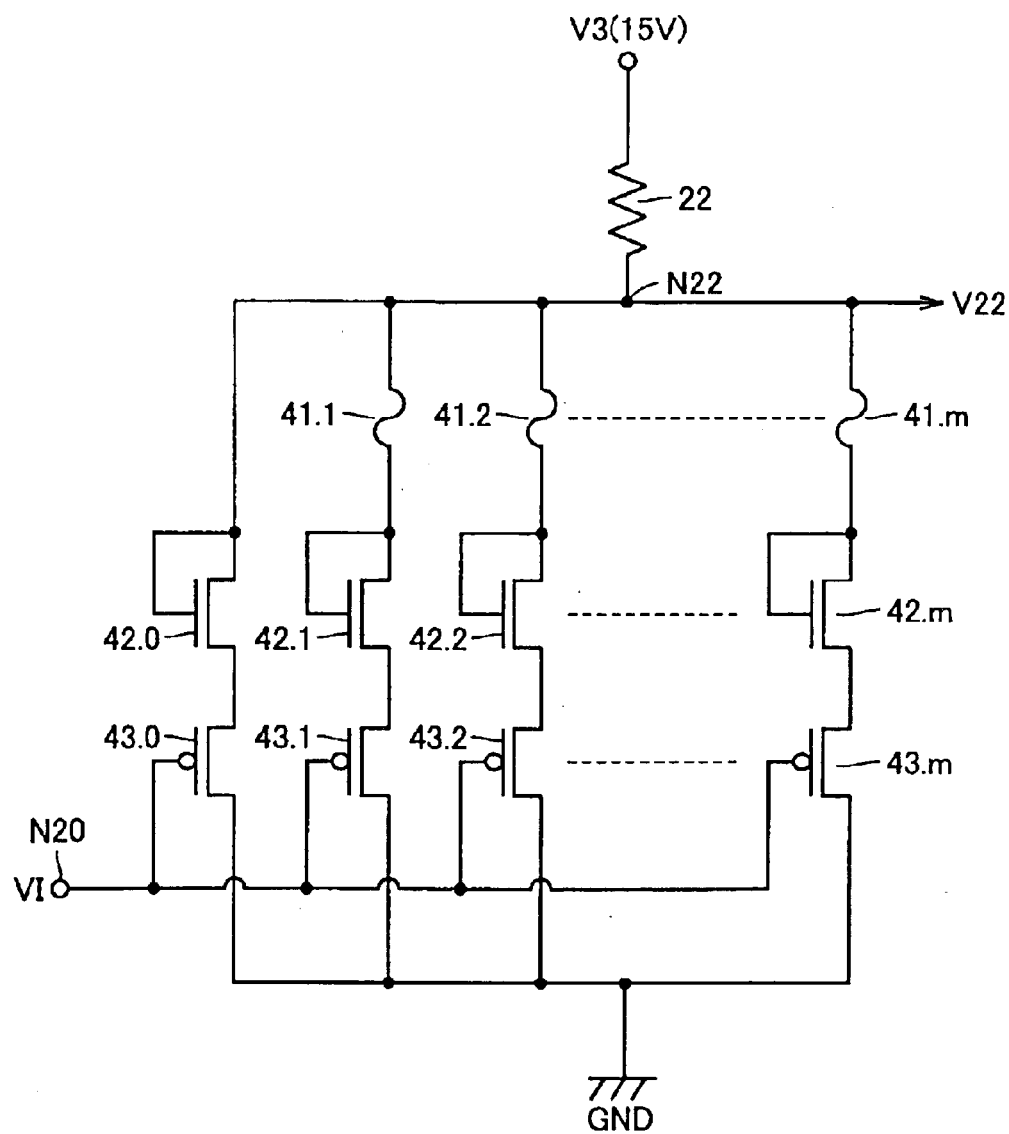
FIG. 10 is a circuit diagram showing a configuration of a level shift circuit of a drive circuit according to a second embodiment of the present invention.

FIG. 10 is a circuit diagram showing a configuration of level shift circuit 40 of a drive circuit according to a second embodiment of the present invention, which is compared with level shift circuit 21 of FIG. 4. Referring to FIG. 10, level shift circuit 40 is different from level shift circuit 21 of FIG. 4 is that N-type transistor 23 and P-type transistor 24 are replaced with fuses 41.1 to 41.m, where m is a natural number, N-type transistors 42.0 to 42.m and P-type transistors 43.0 to 43.m.

Fuses 41.1 to 41.m are all formed with aluminum wires or the like used in connecting transistors mutually therebetween. One electrodes of fuses 41.1 to 41.m are all connected to node N22.

The sum of gate widths of N-type transistors 42.0 to 42.m is set so as to be the same as a gate width N-type transistor 23 of FIG. 4. The gate and drain of N-type transistor 42.0 are connected to node N22. The gates and drains of N-type transistors 42.1 to 42.m are connected to the respective other electrodes of fuses 41.1 to 41.m. N-type transistors 42.0 to 42.m all serve as a diode element.

The sum of gate widths of P-type transistors 43.0 to 43.m is set so as to be the same as a gate width P-type transistor 24 of FIG. 4. P-type transistors 43.0 to 43.m are connected between the respective sources of N-type transistors 42.0 to 42.m and the node at ground potential GND and all receive input potential VI at the gates thereof.

As described in the first embodiment, potential V22 at node N22 is determined almost by threshold voltages of transistors 42.0 to 42.m and 43.0 to 43.m. However, as a resistance value between node N22 and the node of ground potential GND increases relative to a resistance value of resistance element 22, potential V22 at node N22 rises slightly in response to an increase in the resistance value. Therefore, by disconnecting a proper number of fuses among fuses 41.1 to 41.m with laser light, potential V22 at node N22 can be raised slightly. Even in a case where the absolute value of a threshold value of each of transistors 42.0 to 42.m, and 43.0 to 43.m is smaller than a design value, a potential V22 of node N22 can be corrected.

Note that while, in the second embodiment, each of N-type transistor 23 and P-type transistor 24 is divided into m+1 pieces, only one of N-type transistor 23 and P-type transistor 24 may be divided into m+1 pieces or one of N-type transistor 23 and P-type transistor 24 may be divided into m+1 pieces and the other is divided into, for example, two pieces. To be concrete, the sources of P-type transistors 43.1 to 43.m of FIG. 10 may be short-circuited to form one P-type transistor. Furthermore, it is allowed that not only are fuses 41.1 to 41.m connected between the respective sources of N-type transistors 42.1 to 42.m and the corresponding sources of P-type transistors 43.1 to 43.m, but the sources of N-type transistors 42.1 to 42.m are also short-circuited to form one N-type transistor.

Third Embodiment

Figure 11:
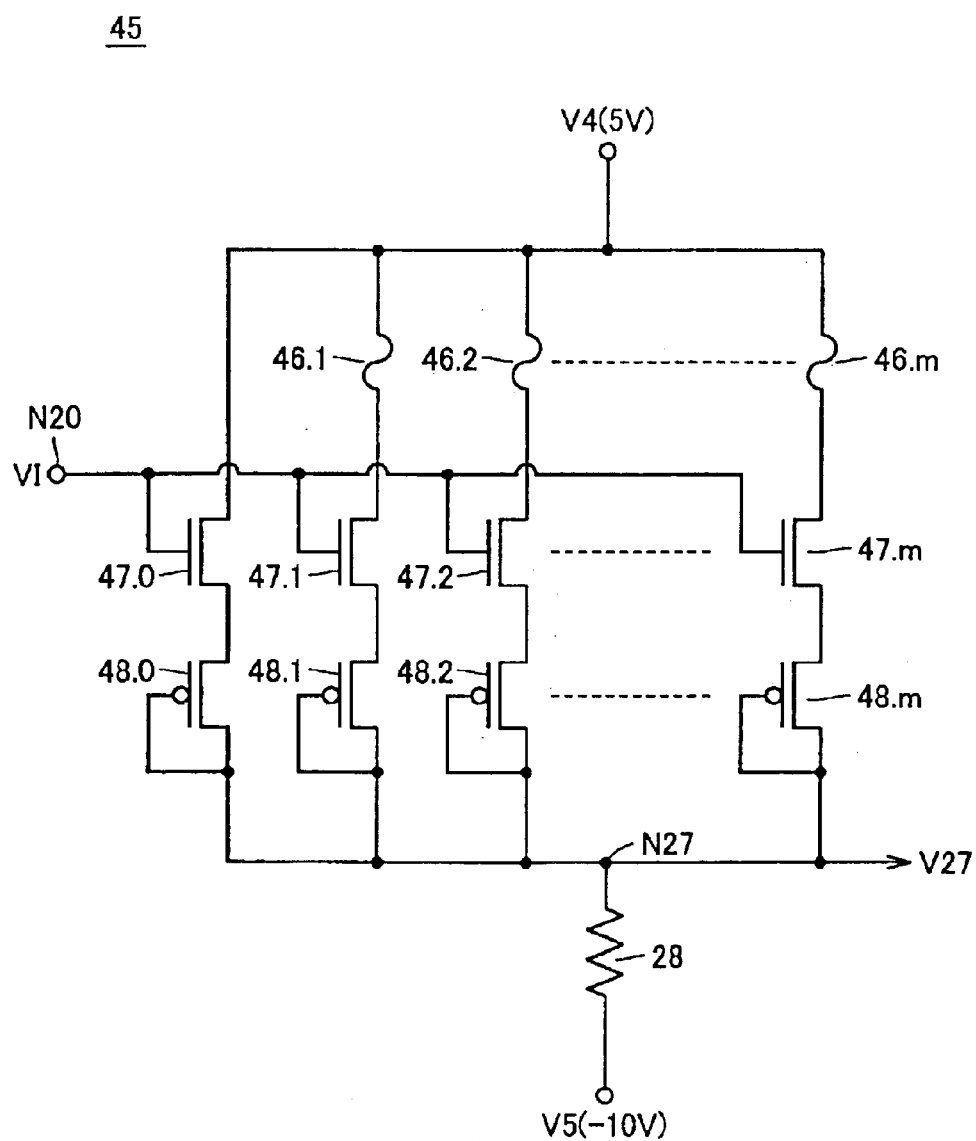
FIG. 11 is a circuit diagram showing a configuration of a level shift circuit of a drive circuit according to a third embodiment of the present invention.

FIG. 11 is a circuit diagram showing a configuration of level shift circuit 45 of a drive circuit according to a third embodiment of the present invention, which is compared with level shift circuit 25 of FIG. 4. Referring to FIG. 11, level shift circuit 45 is different from level shift circuit 25 of FIG. 4 in that N-type transistor 26 and P-type transistor 27 are replaced with fuses 46.1 to 46.m, N-type transistors 47.0 to 47.m and P-type transistors 48.0 to 48.m.

Fuses 46.1 to 46.m are all formed with aluminum wires or the like used in connecting transistors mutually therebetween. One electrodes of fuses 46.1 to 46.m are all connected to a node of fourth power supply potential V4.

The sum of gate widths of N-type transistors 47.0 to 47.m is set so as to be the same as a gate width of N-type transistor 26 of FIG. 4. The drain of N-type transistor 47.0 is connected to the node of fourth power supply voltage V4 and N-type transistor 47.0 receives input potential VI at the gate thereof. The drains of N-type transistors 47.1 to 47.m are connected to the respective other electrodes of fuses 46.1 to 46.m and N-type transistors 47.1 to 47.m all receive input potential VI at the gates thereof.

The sum of gate widths of P-type transistors 48.0 to 48.m is set so as to be the same as a gate width of P-type transistor 27 of FIG. 4. P-type transistors 48.0 to 48.m are connected between the respective sources of N-type transistors 47.0 to 47.m and node N27 and all the gates thereof are connected to node N27. P-type transistors 48.0 to 48.m all serve as a diode element.

As described in the first embodiment, potential V27 at node N27 is determined almost by threshold voltages of transistors 47.0 to 47.m and 48.0 to 48.m. However, as a resistance value between the node at fourth power supply potential V4 and node N27 increases relative to a resistance value of resistance element 28, potential V27 at node N27 falls slightly in response to an increase in the resistance value. Therefore, by disconnecting a proper number of fuses among fuses 46.1 to 46.m with laser light, potential V27 at node N27 can be lowered slightly, and even in a case where the absolute value of each of transistors 47.0 to 47.m, and 48.0 to 48.m is smaller than ax design value, a potential V27 of node N27 can be corrected.

Note that while, in the third embodiment, each of N-type transistor 26 and P-type transistor 27 is divided into m+1 pieces, only one of N-type transistor 26 and P-type transistor 27 may be divided into m+1 pieces or one of N-type transistor 26 and P-type transistor 27 is divided into m+1 pieces and the other is divided into, for example, two pieces.

To be concrete, the sources of P-type transistors 48.1 to 48.m of FIG. 11 may be short-circuited to form one P-type transistor. Furthermore, it is allowed that not only are fuses 41.1 to 41.m connected between the respective sources of N-type transistors 47.1 to 47.m and the corresponding sources of P-type transistors 48.1 to 48.m, but the sources of N-type transistors 47.1 to 47.m are also short-circuited to form on N-type transistor.

Furthermore, needless to say that the second and third embodiments may be combined and level shift circuits 21 and 25 of FIG. 4 are replaced with respective level shift circuits 40 and 45.

Fourth Embodiment

Figure 12:
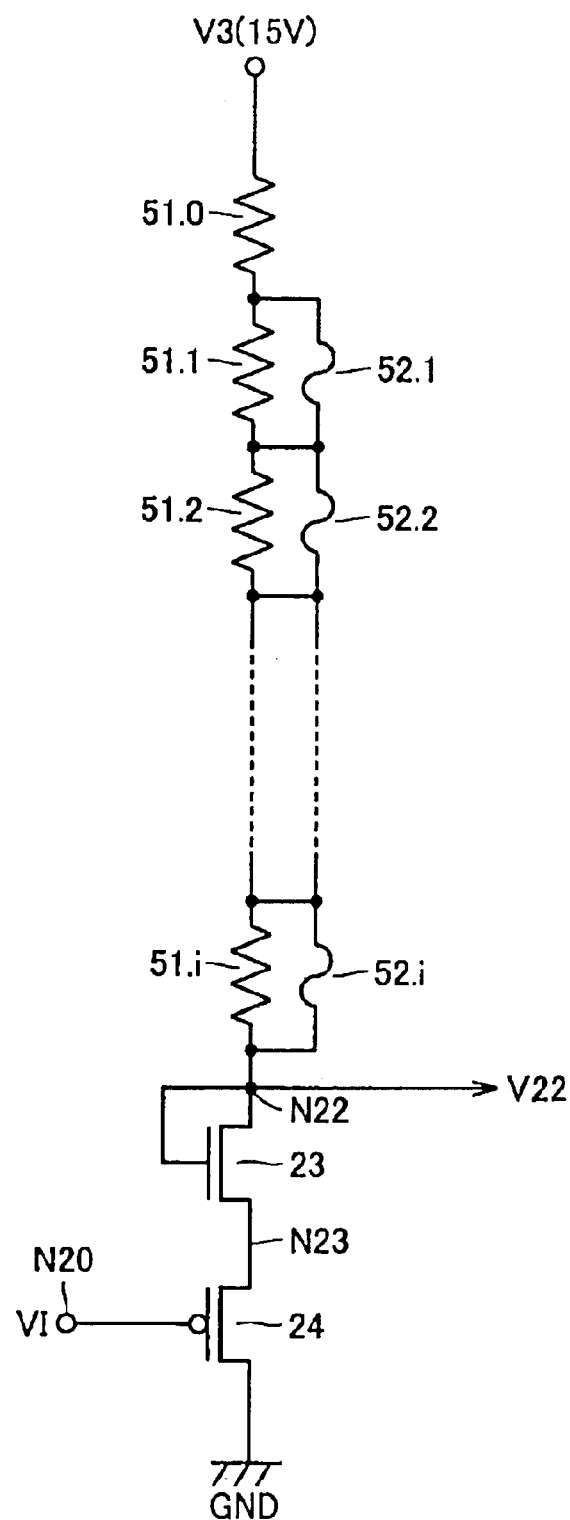
FIG. 12 is a circuit diagram showing a configuration of a level shift circuit of a drive circuit according to a fourth embodiment of the present invention.

FIG. 12 is a circuit diagram showing a configuration of a level shift circuit 50 of a drive circuit according to a fourth embodiment of the present invention, which is compared with level shift circuit 21 of FIG. 4. Referring to FIG. 12, level shift circuit 50 is different from level shift circuit 21 of FIG. 4 in that resistance element 22 is replaced with resistance elements 51.0 to 51.i and fuses 52.1 to 52.i, where i is a natural number.

The sum of resistance values of resistance elements 51.0 to 51.i is set to be almost the same as a resistance value of resistance element 22 of FIG. 4. Resistance elements 51.0 to 51.i are series-connected between a node of third power supply potential V3 and node N22.

Fuses 52.1 to 52.i are all formed with aluminum wires or the like used in connecting transistors mutually therebetween. Fuses 52.1 to 52.i are parallel-connected to respective resistance elements 51.1 to 51.i.

As described in the first embodiment, potential V22 at node N22 is determined almost by threshold voltages of transistors 23 and 24. However, as a resistance value between the node at third power supply potential V3 and node N22 increases relative to on-resistance values of resistance elements 23 and 24, potential V22 at node N22 falls slightly in response to an increase in the resistance value. Therefore, by disconnecting a proper number of fuses among fuses 52.1 to 52.i with laser light, potential V22 at node N22 can be lowered slightly, and even in a case where the absolute value of each of threshold values of transistors 23 and 24 is higher than a design value, a potential V22 of node N22 can be corrected.

Fifth Embodiment

Figure 13:
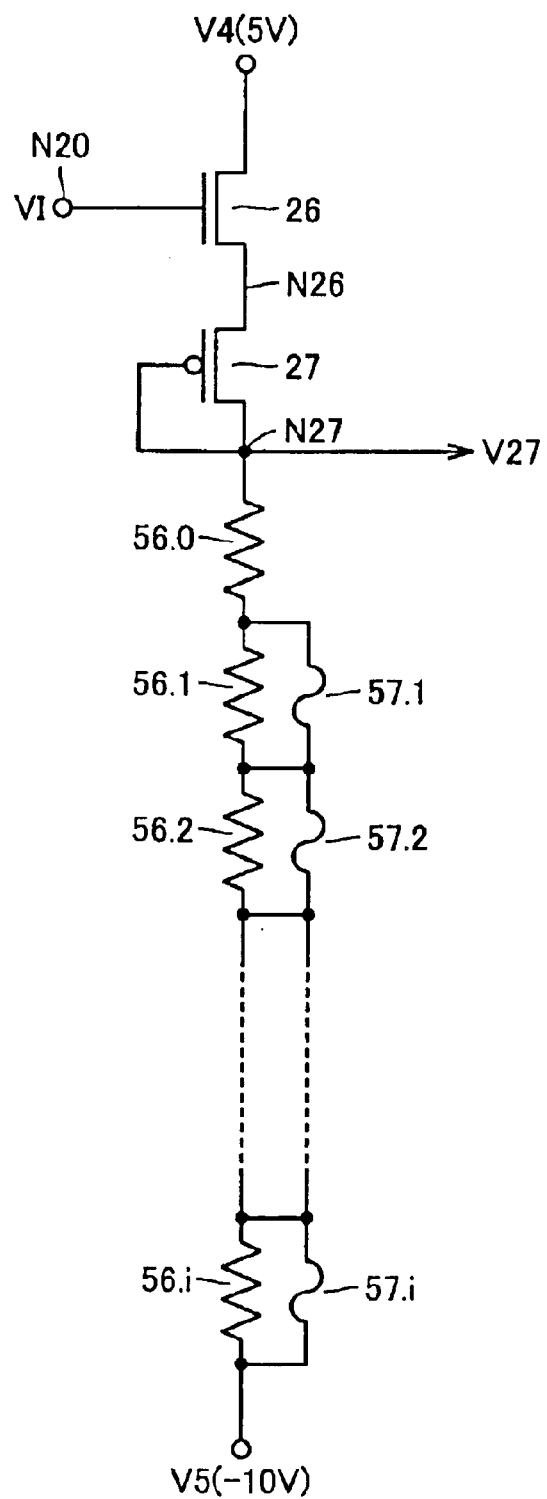
FIG. 13 is a circuit diagram showing a configuration of a level shift circuit of a drive circuit according to a fifth embodiment of the present invention.

FIG. 13 is a circuit diagram showing a configuration of a level shift circuit 55 of a drive circuit according to a fifth embodiment of the present invention, which is compared with level shift circuit 25 of FIG. 4. Referring to FIG. 13, level shift circuit 55 is different from level shift circuit 25 of FIG. 4 in that resistance element 28 is replaced with resistance elements 56.0 to 56.i and fuses 57.1 to 57.i.

The sum of resistance values of resistance elements 56.0 to 56.i is set to be almost the same as a resistance value of resistance element 28 of FIG. 4. Resistance elements 56.0 to 56.i are series-connected between node N27 and a node of fifth power supply potential V5.

Fuses 57.1 to 57.i are all formed with aluminum wires or the like used in connecting transistors mutually therebetween. Fuses 57.1 to 57.i are parallel-connected to respective resistance elements 56.1 to 56.i.

As described in the first embodiment, potential V27 at node N27 is determined almost by threshold voltages of transistors 26 and 27. However, as a resistance value between node N27 and the node at fifth power supply potential V5 increases relative to on-resistance values of resistance elements 26 and 27, potential V22 at node N22 rises slightly in response to an increase in the resistance value. Therefore, by disconnecting a proper number of fuses among fuses 57.1 to 57.i with laser light, potential V27 at node N27 can be raised slightly, and even in a case where the absolute value of each of threshold values of transistors 26 and 27 is higher than a design value, a potential V27 of node N27 can be corrected.

Furthermore, needless to say that the fourth and fifth embodiments may be combined and level shift circuits 21 and 25 of FIG. 4 are replaced with respective level shift circuits 50 and 55.

In the first to fifth embodiments, which are described above, field effect transistors may be MOS transistors or TFTs (thin film transistors). Resistance elements may be made of a high melting metal, may be formed with an impurity diffused layer or field effect transistors in order to reduce an occupancy area. Needless to say that the drive circuits described above, in a liquid crystal display apparatus and others, are used not only to transmit a gradation potential, but also as an analog buffer controlling a potential at an output node so as to be the same as an input analog potential.

Sixth Embodiment

Figure 14:
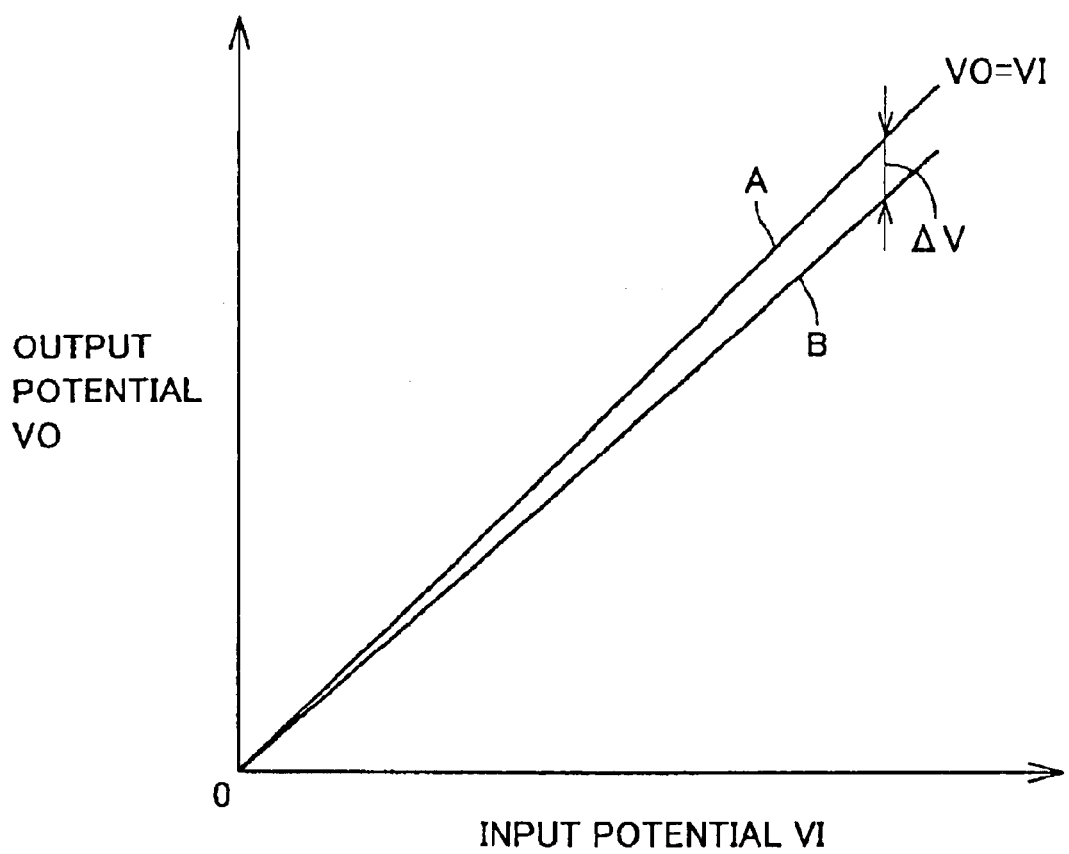
FIG. 14 is a graph for describing a problem of the first embodiment.

As a characteristic of a drive circuit, it is ideal that as in a characteristic line of FIG. 14, input potential VI and output potential VO are equal to each other. Characteristics of drive circuits shown in the first to fifth embodiments are as shown by a characteristic line B of FIG. 14, wherein a difference A between an ideal value and actual value of VO increases with an increase in VI.

Figure 15:
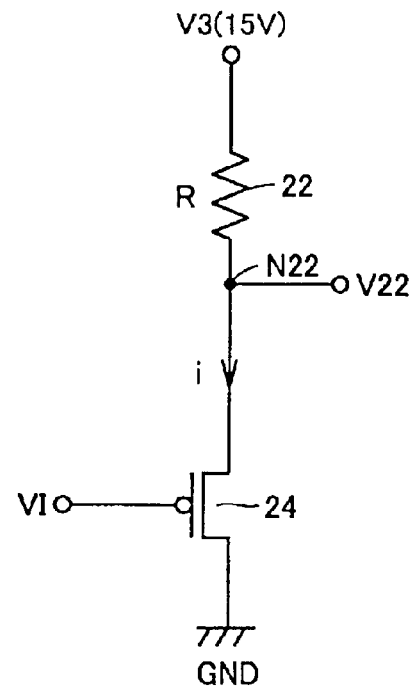
FIG. 15 is a circuit diagram for describing a problem of the first embodiment.

The reason for this is such that in level shift circuit 21' shown in FIG. 15, if a resistance value of resistance element 22 is R, a current value flowing in resistance element 22 and P-type transistor 24 is i and a current amplification factor of P transistor 24 is β by definition, the following formulae (9) and (10) are established:

$$V22 = VDD - Ri \quad (9)$$

$$i = (VI - VTP - V22)^2 \beta/2 \quad (10)$$

where if Rβ/2=K, V22 is given by a below formula (11):

$$V22 = VI - VTP + \frac{1}{2K} - \frac{1}{2K}\sqrt{4K(VDD + VI - VTP) + 1} \quad (11)$$

It is understood from this formula (11) that with an increase in VI, a difference between an ideal value of V22, VI−VTP, and an actual value increases. Therefore, a difference between an ideal value of V4 and an actual value increases with an increase in VI.

Figure 16:
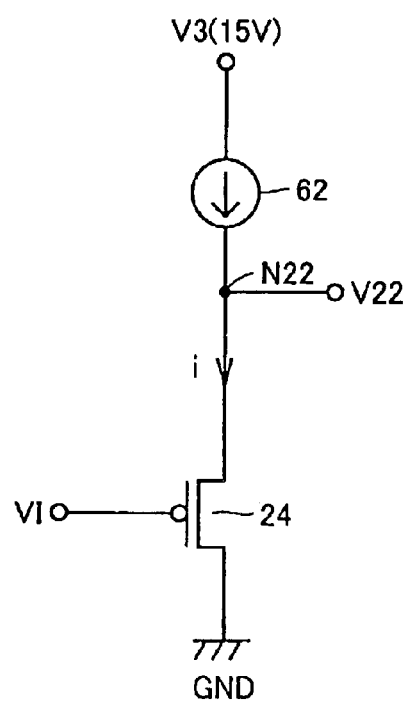
FIG. 16 is a circuit diagram for describing a principle of a sixth embodiment.

In order to solve this problem, in the sixth embodiment, as shown in FIG. 16, resistance element 22 is replaced with constant current source 62. In a level shift circuit of FIG. 16, a below formula (12) is established:

$$i = (VI - VTB - V22)^2 \beta/2 \quad (12)$$

A below formula (13) is derived from formula (12):

$$V22 = VI - VTP - \sqrt{\frac{2i}{\beta}} \quad (13)$$

Therefore, in the level shift circuit of FIG. 16, a difference between an ideal value VI−VTP and an actual value of V22 is constant regardless of VI. Furthermore, by setting a value of β to a value sufficiently larger than a constant current value i, VO is enabled to be approximately equal to an ideal value VI–VTP. Description will be given of drive circuit 60 of the sixth embodiment below in a concrete manner.

Figure 17:
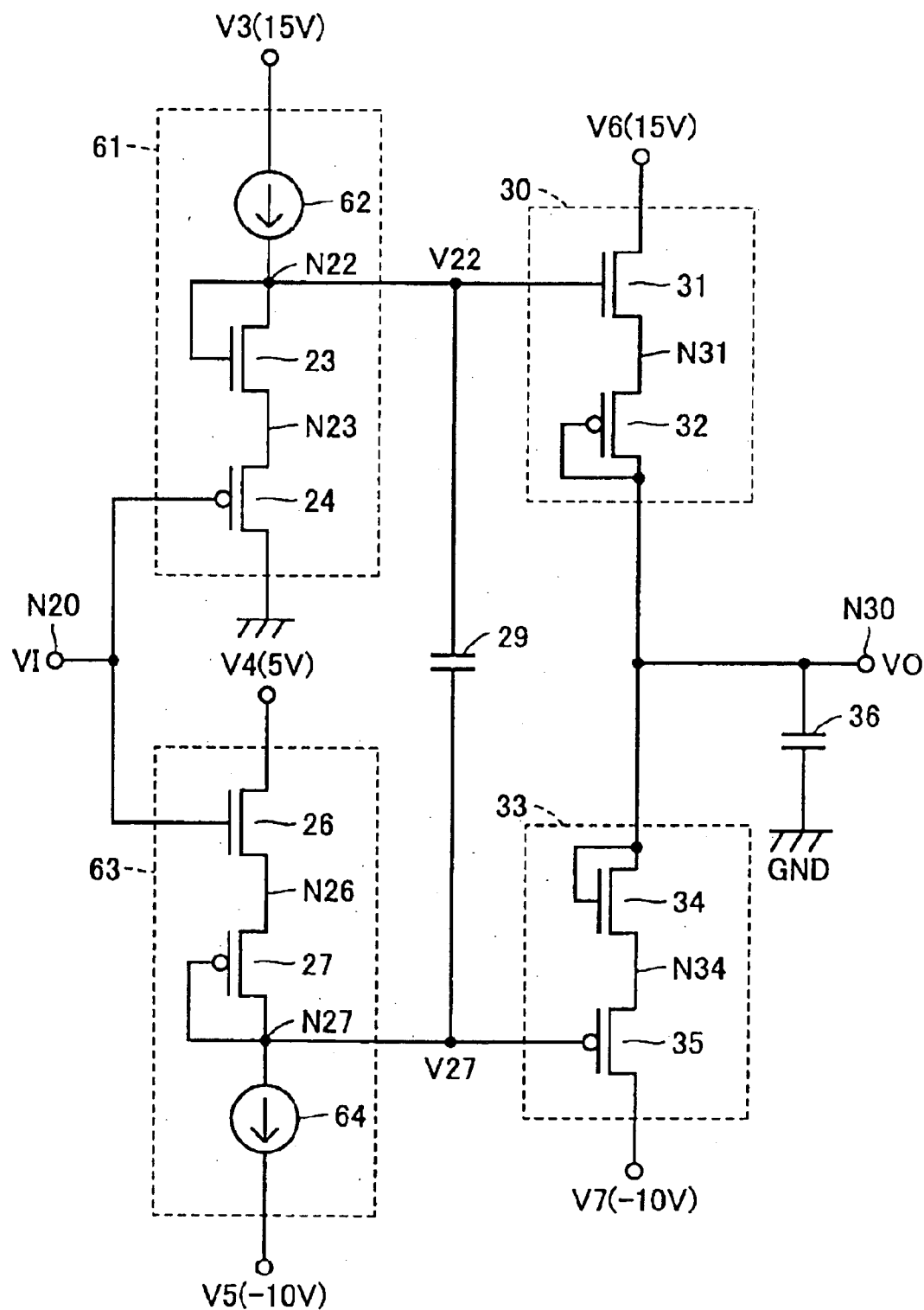
FIG. 17 is a circuit diagram showing a configuration of a drive circuit according to the sixth embodiment of the present invention.

FIG. 17 is a circuit diagram showing a configuration of drive circuit 60 according to the sixth embodiment of the present invention. Referring to FIG. 17, drive circuit 60 is different from drive circuit 20 of FIG. 4 in that level shift circuits 21 and 25 are replaced with respective level shift circuits 61 and 63. Level shift circuit 61 is of a configuration obtained by replacing resistance element 22 of level shift circuit 21 with constant current source 62 and level shift circuit 63 is of a configuration obtained by replacing resistance element 28 of level shift circuit 25 with a constant current source 64.

Figure 18:
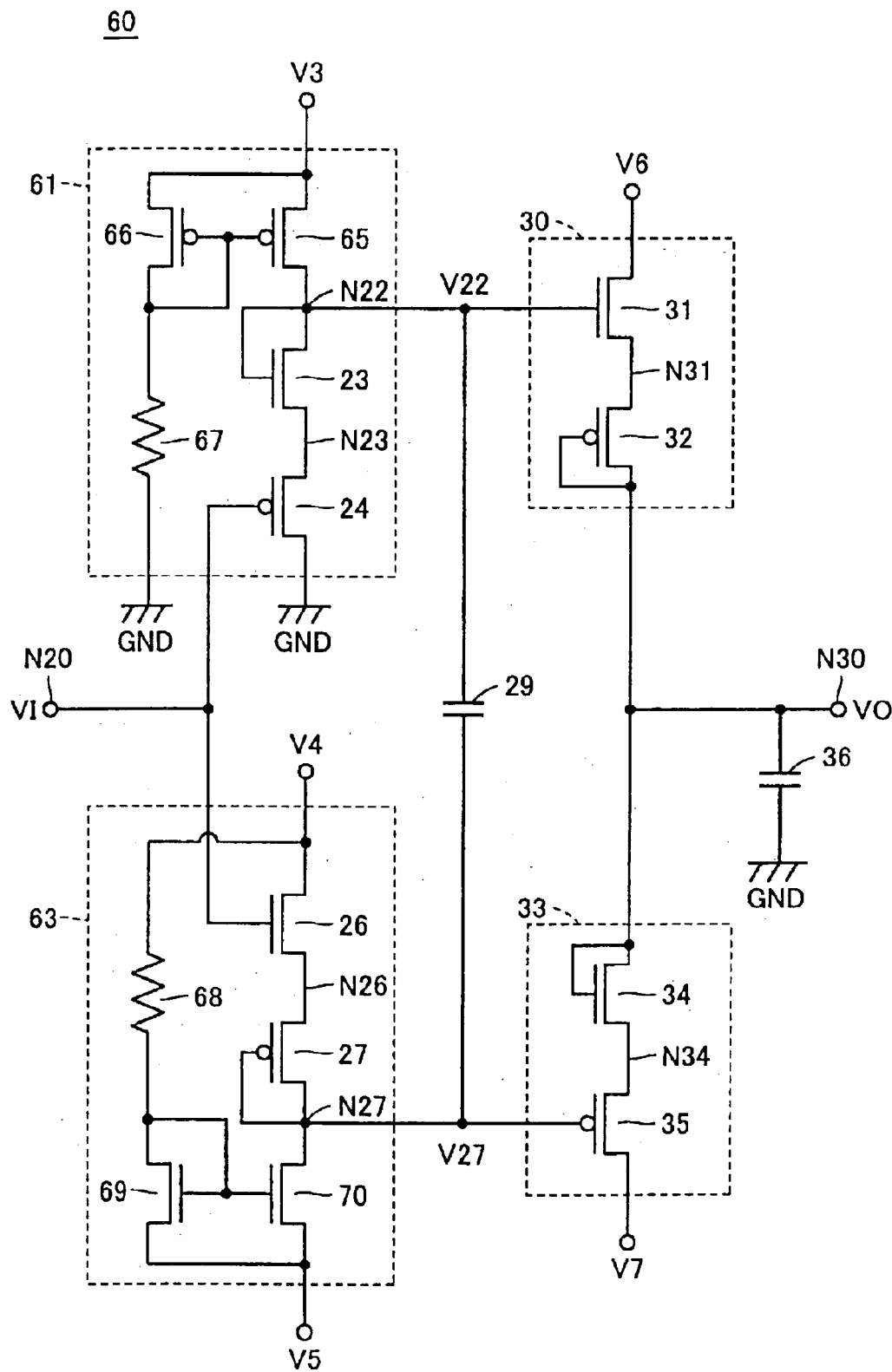
FIG. 18 is a circuit diagram showing details of the configuration of a drive circuit shown in FIG. 17.

Constant current source 62, as described in FIG. 18, includes: P-type transistors 65 and 66 and a resistance element 67. P-type transistor 65 is connected between a line of third power supply voltage V3 and node N22, and P-type transistor 66 and resistance element 67 are series-connected between the line of third power supply potential V3 and a line of ground potential GND. The gates of P-type transistors 65 and 66 are both connected to the drain of P-type transistor 66. P-type transistors 65 and 66 constitute a current mirror circuit. A constant current corresponding to a resistance value of resistance element 67 flows in P-type transistor 66 and resistance element 67 and a constant current corresponding to a value of a constant current flowing in P-type transistor 66 flows in P-type transistor 65. Note that while one electrode of resistance element 67 is connected to a line at ground potential GND, the one electrode of resistance element 67 may be connected to a line at another power supply potential lower than a potential obtained by subtracting the absolute value |VTP| of a threshold voltage of P-type transistor 66 from third power supply potential V3. Furthermore, a depletion type transistor in which the gate is connected to the source is provided between the line at third power supply potential V3 and node N22 instead of transistors 65 and 66 and resistance element 67 as a constant current source.

Constant current source 64 includes: a resistance element 68; and N-type transistors 69 and 70. Resistance element 68 and N-type transistor 69 are series-connected between a line at fourth power supply potential V4 and a line at fifth power supply potential V5, and N-type transistor 70 is connected between node N27 and the line at fifth power supply potential V5. The gates of N-type transistors 69 and 74 are both connected to the drain of N-type transistor 69. N-type transistors 69 and 70 constitute a current mirror circuit. A constant current of a value corresponding to a resistance value of resistance element 68 flows in resistance element 68 and N-type transistor 69, and a constant current of a value corresponding to a value of a constant current flowing N-type transistor 69 flows in N-type transistor 70. Note that while one electrode of resistance element 68 is connected to fourth power supply potential V4, the one electrode of resistance element 68 may be connected to a line at another power supply potential higher than a potential obtained by adding a threshold voltage VTN of N-type transistor 69 to fifth power supply potential V5. A depletion type transistor in which the gate is connected to the source may be provided between the line at fifth power supply potential V5 and node N27 instead of transistors 69 and 70 and resistance element 68 as a constant current source. Since the other parts of the configuration and operations therein are the same as corresponding parts of the configuration and operations therein of drive circuit 20 of FIG. 4, none of descriptions thereof is repeated.

In the sixth embodiment, since resistance elements 22 and 28 of drive circuit 20 of FIG. 4 are replaced with respective constant current sources 62 and 64, output potential VO equal to input potential VI can be attained without respect to input potential VI.

Figure 19:
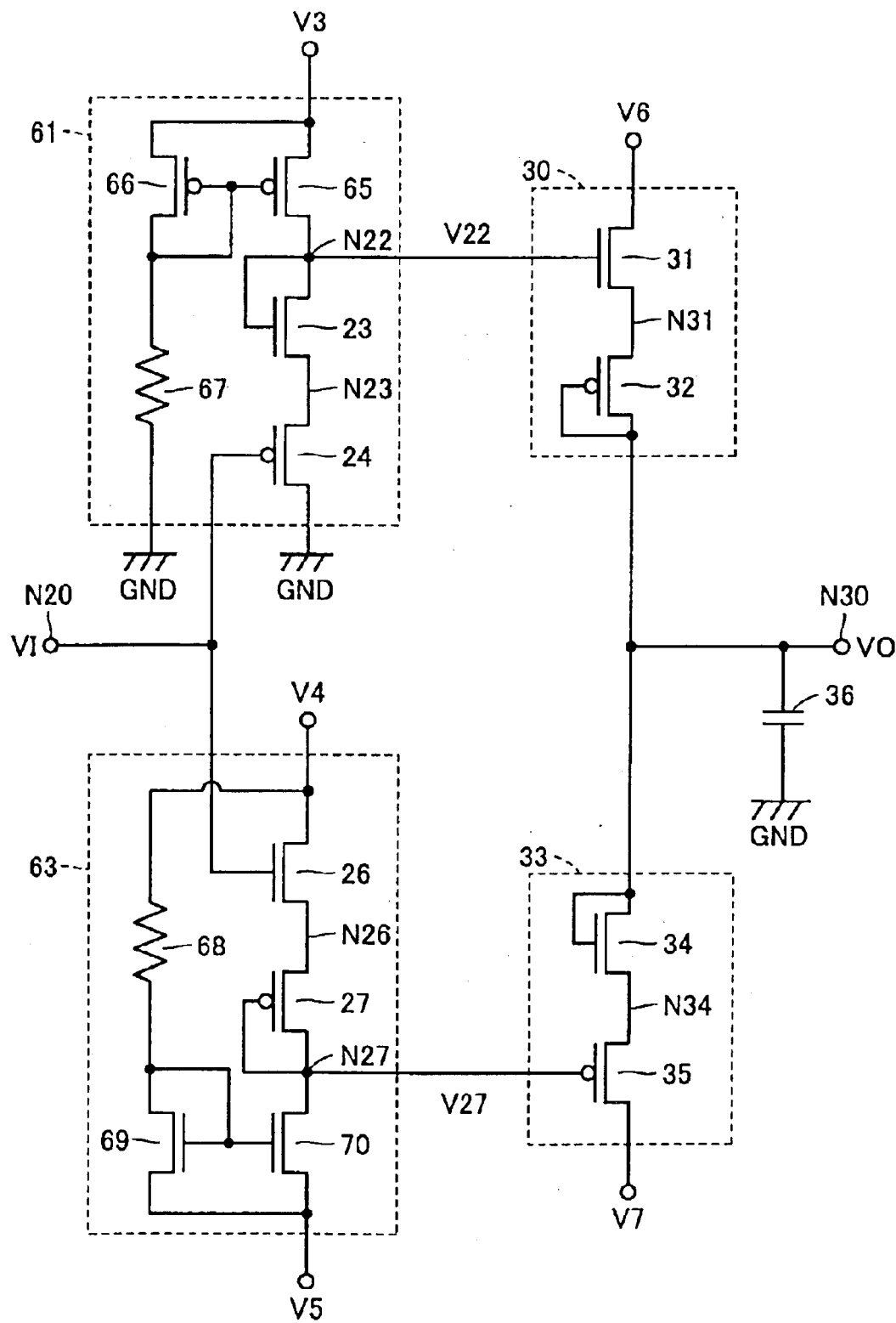
FIG. 19 is a circuit diagram showing an example modification of the sixth embodiment.

Description will be given of various example modifications of the sixth embodiment below. A drive circuit 71 of FIG. 19 is of a configuration obtained by removing capacitor 29 from drive circuit 60 of FIG. 18. This example modification is useful in a case where a capacitance value of load capacitance 36 is comparatively small. In this example, since capacitor 29 is not present because of its removal, an occupancy area of the circuit is reduced.

Figure 20:
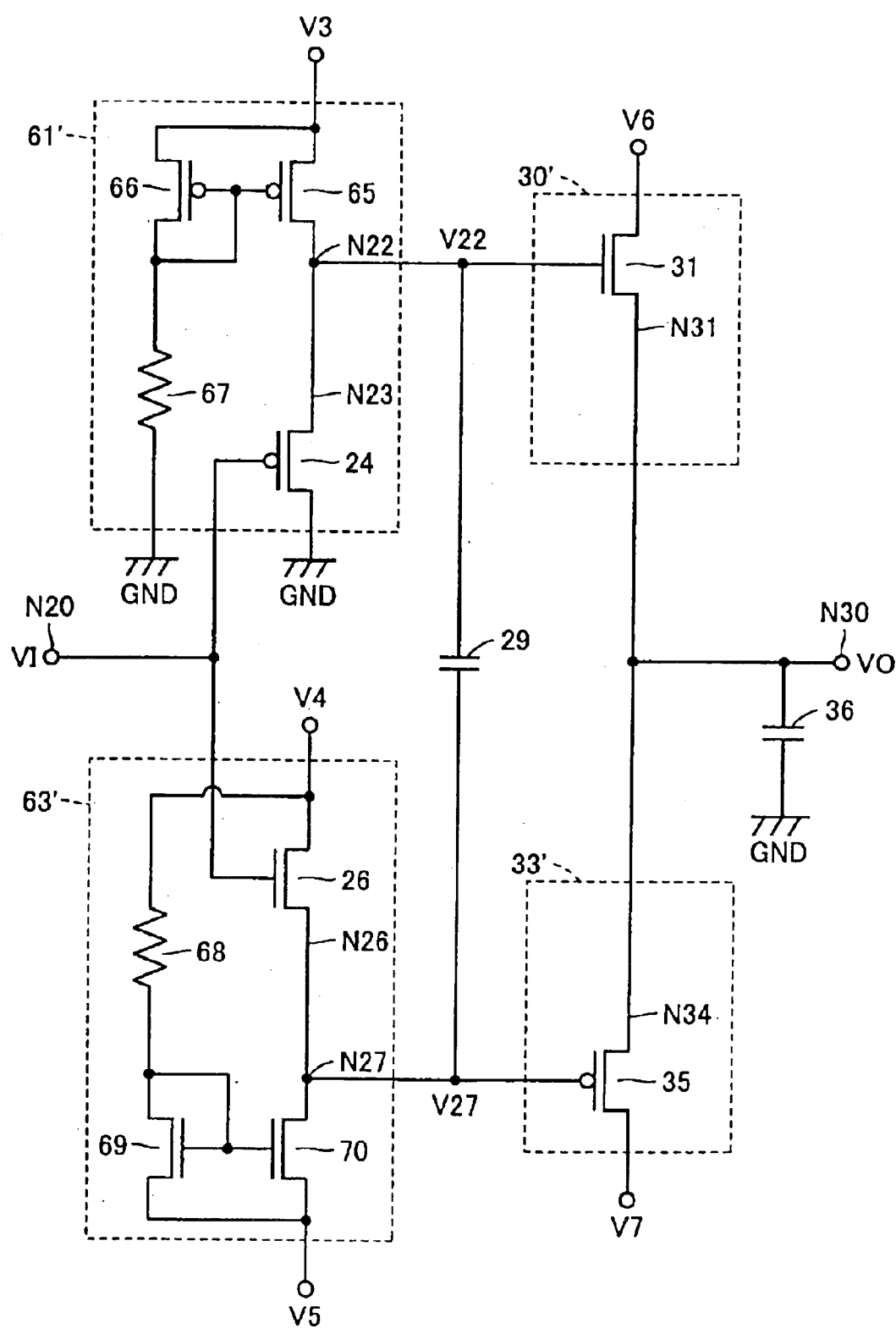
FIG. 20 is a circuit diagram showing another example modification of the sixth embodiment.

A drive circuit 72 of FIG. 20 is of a configuration obtained by removing N-type transistors 23 and 34 and P-type transistors 27 and 32 from drive circuit 60 of FIG. 18. In this example modification, since transistors 23, 27, 32 and 34 are not present because of the removal thereof, an occupancy area of the circuit can be reduced. Output potential VO=VI+|VTP|–VTN.

Figure 21:
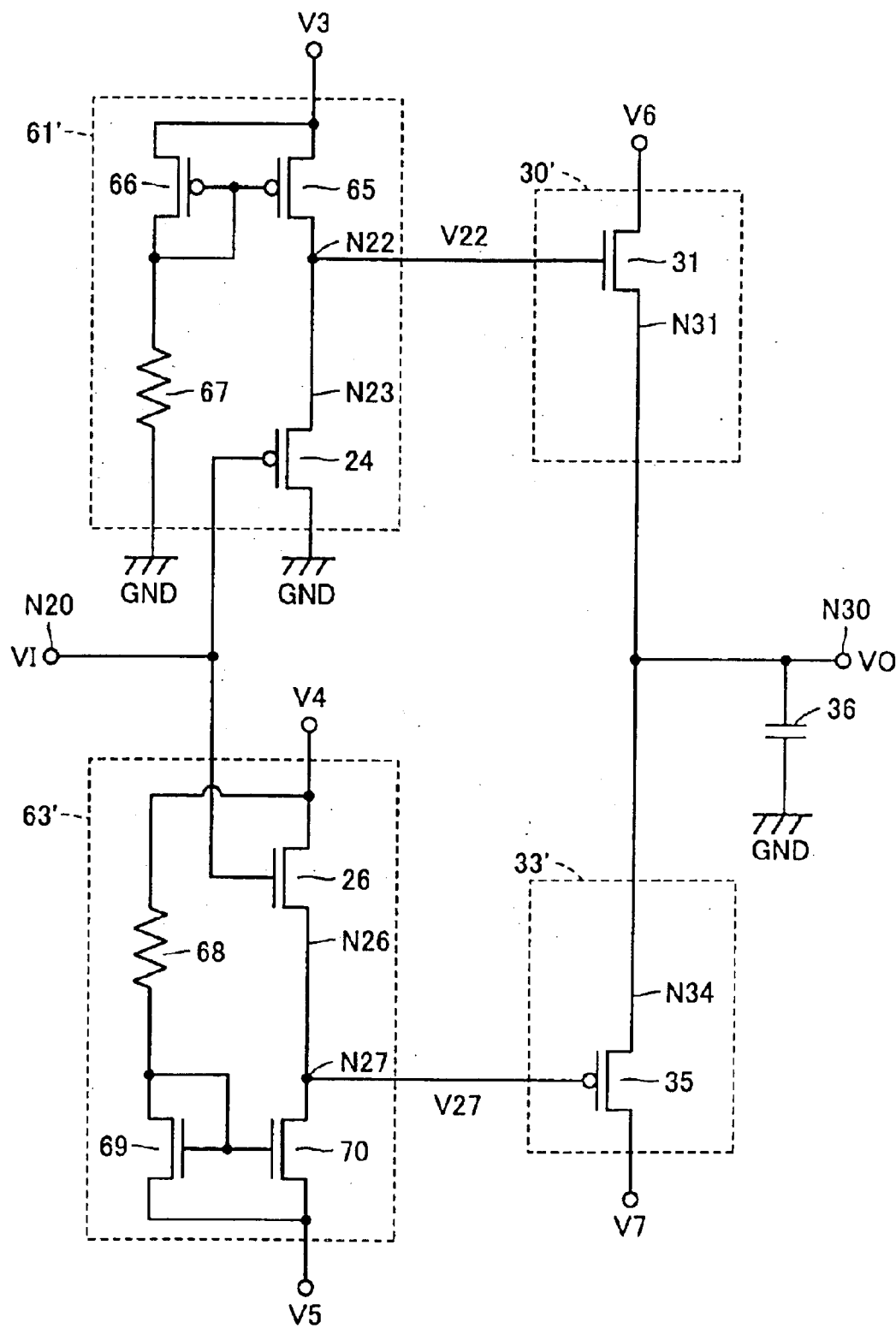
FIG. 21 is a circuit diagram showing still another example modification of the sixth embodiment.

A drive circuit 73 of FIG. 21 is of a configuration obtained by removing capacitor 29 from drive circuit 72 of FIG. 20. This example modification is useful in a case where a capacitance value of load capacitance 36 is comparatively small. In this example modification, since capacitor 29 is not present because of its removal, an occupancy area of the circuit is reduced.

Seventh Embodiment

In drive circuit 20 of FIG. 4, for example, when load capacitance 36 is charged or discharged, transistors 31, 32, 34 and 35 each perform a so-called source-follower operation. At that time, as output potential VO comes nearer input potential VI, gate-to-source voltages of transistors 31, 32, 34 and 35 are reduced to thereby lower current drive capabilities of transistors 31, 32, 34 and 35. Reduction in current drive capabilities of transistors 32 and 34 can be prevented by increasing gate widths thereof, whereas increases in the gate widths of transistors 31 and 35 entails an increase in gate capacitance, resulting in decrease in operating speed of drive circuit 20. In the seventh embodiment, this problem is to be solved.

Figure 22:
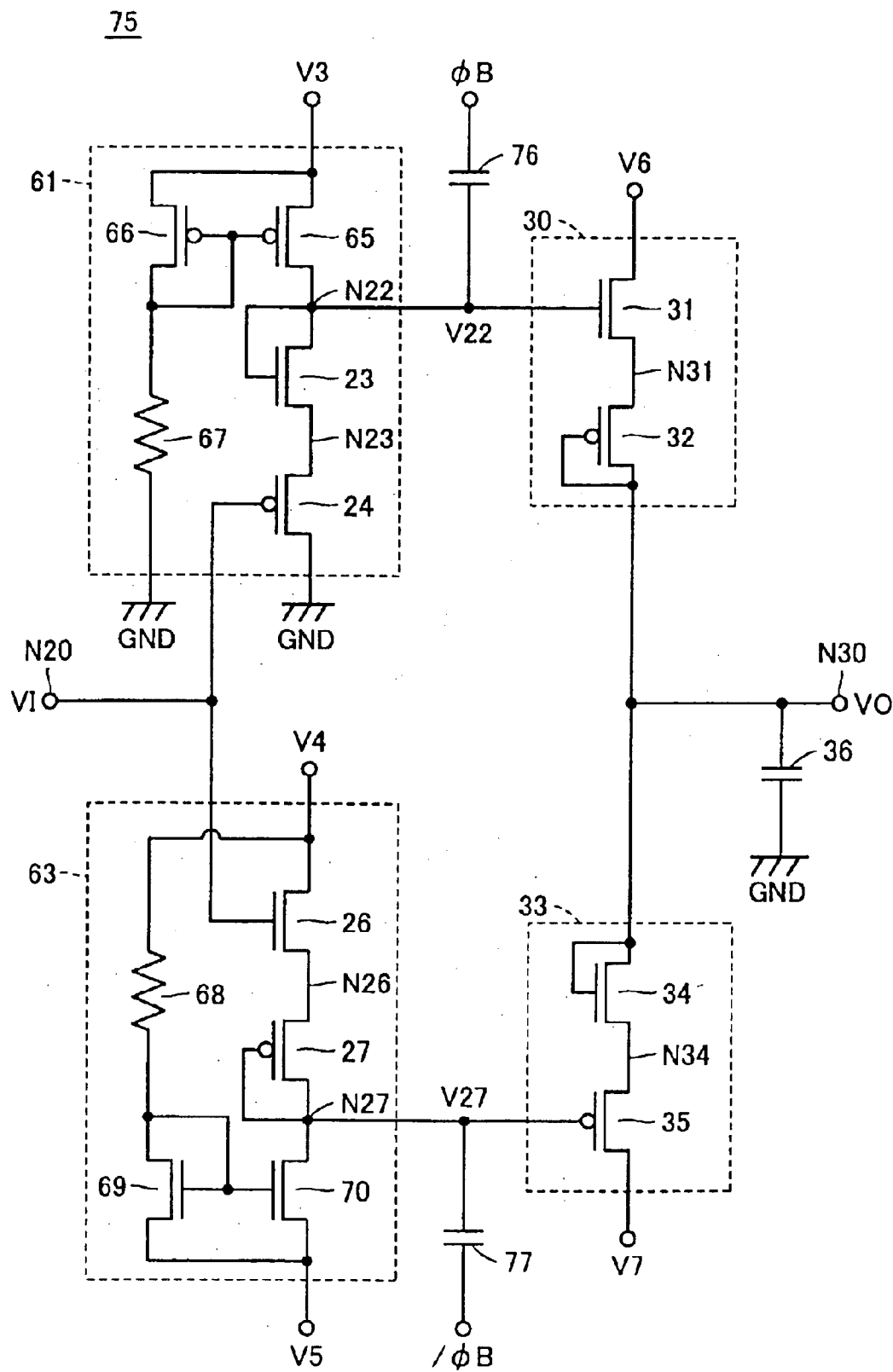
FIG. 22 is a circuit diagram showing a configuration of a drive circuit according to a seventh embodiment of the present invention.

FIG. 22 is a circuit diagram showing a configuration of a drive circuit 75 according to a seventh embodiment of the present invention. Referring to FIG. 22, drive circuit 75 is of a configuration obtained by adding capacitors 76 and 75 to drive circuit 71 of FIG. 19. One electrode of capacitor 76 receives a step-up signal φB and the other electrode thereof is connected to node N22. One electrode of capacitor 77 receives a complementary signal /φB of step-up signal φB and the other electrode thereof is connected to node N27.

Figure 23:
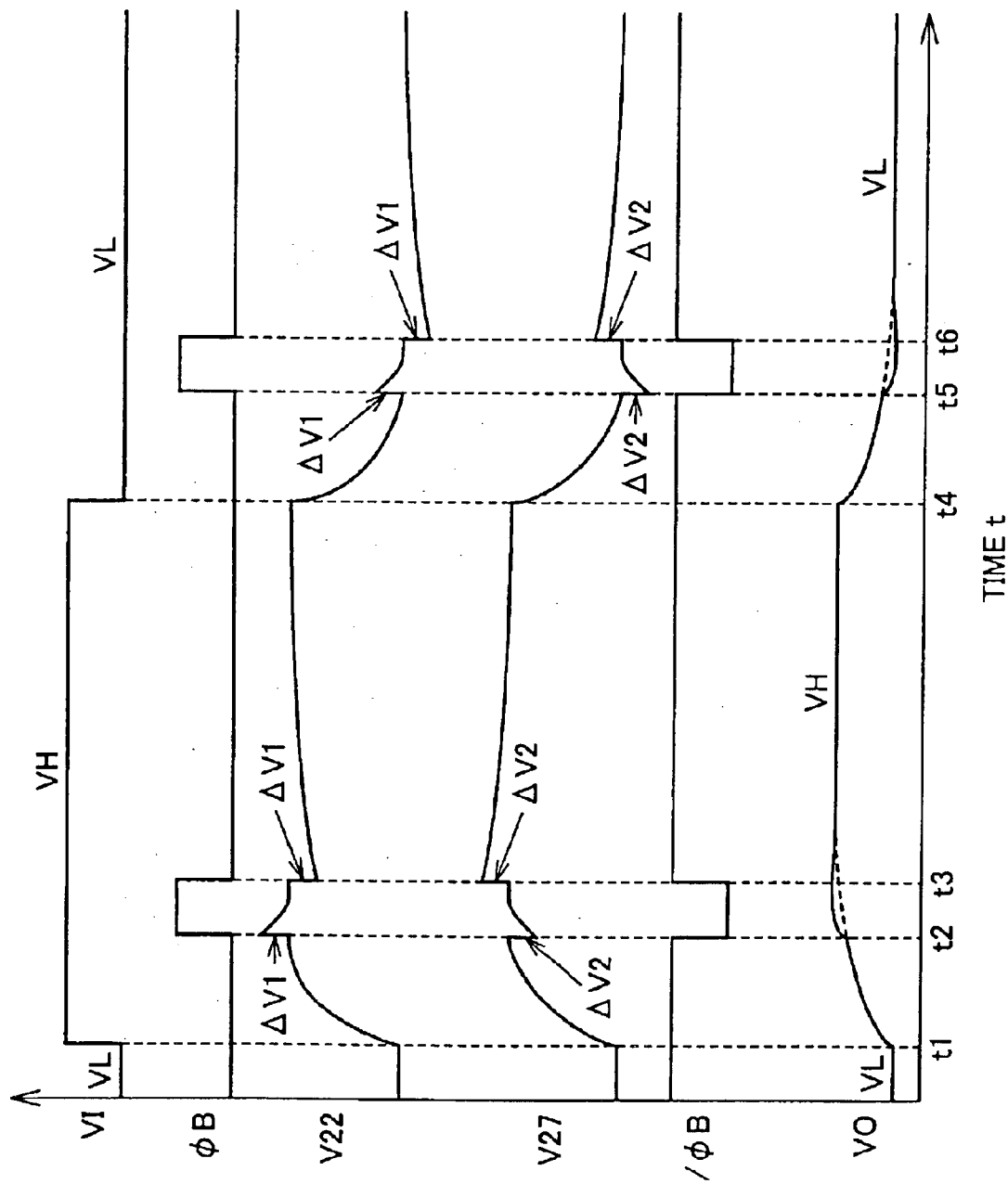
FIG. 23 is a time chart showing operations in the drive circuit shown in FIG. 22.

FIG. 23 is a time chart showing operations in drive circuit 75 shown in FIG. 22. In FIG. 23, there is shown transition times of potentials V22 and V27 at respective nodes N22 and N27 and output potential VO longer than actual in order to facilitate understanding of the operations. When, at time point t1, input potential VI is raised from L level VL to H level VH, potentials V22, V27 and VO rise gradually. Each of potentials V22, V27 and VO, as described above, rises relatively fast in a cycle of a change in potential, but a rise speed slows down at a point nearer the final level.

At time point t2 when a prescribed time elapses from time point t1, not only is step-up signal φB raised to H level, but signal /φB is also lowered to L level. When signal φB is raised to H level, potential V22 at node N22 is raised by a prescribed voltage ΔV1 through capacitor 76 by capacitive coupling. When signal /φB is lowered to L level, potential V27 at node N27 is lowered by a prescribed voltage ΔV2 through capacitor 77 by capacitive coupling. At this time, drive circuit 75 performs an operation to output VH at H level to output node N30 and since an on-resistance value of N-type transistor 31 is smaller than that of P-type transistor 35, a level step-up action by V22 is stronger than a level step-down action by V27 to raise output potential VO rapidly starting at time point t2 (while in a case where V22 is not stepped up, output potential VO behaves as shown with a broken line).

A current flows out from node N22 to a line of ground potential GND through transistors 23 and 24 to thereby lower stepped-up potential V22 to VI+|VTP|+VTN. Node 27 receives an inflow of a current from a line of fourth power supply potential V4 through transistors 26 and 27 to thereby raise stepped-down potential V27 up to VI−|VTP|−VTN.

At time point t3, not only is step-up signal φB lowered to L level, but signal /φB is also raised to H level. When signal φB falls to L level, potential V22 at node N22 is lowered by prescribed voltage ΔV1 through capacitor 76 by capacitive coupling. When signal /φB is raised to H level, potential V27 at node N27 is raised by prescribed voltage ΔV2 through capacitor 77 by capacitive coupling. Even if V22 falls by ΔV1, pull-up circuit 30 has no capability to lower output potential VO and even if V27 rises by ΔV2, pull-down circuit 33 has no capability to raise output potential VO, so no change arises in output potential VO.

A current flows from a line of third power supply potential V3 into node N22 through P-type transistor 65 to thereby raise stepped-down potential V22 to VI+|VTP|+VTN. Since a current drive capability of P-type transistor 65 is set small for low current consumption, however, a time required for potential V22 at node N22 to rise to a level VI+|VTR|+VTN in stationary state is longer than a time required for potential V22 to fall to the level VI+|VTR|+VTN.

A current flows out from node N27 to a line of fifth power supply potential V5 through N-type transistor 70 to thereby lower stepped-up potential V27 to VI−VTN−|VTP|. Since a current drive capability of N-type transistor is set small for low current consumption, however, a time required for potential V27 at node N27 to fall to a level VI−VTN−|VTP| in stationary state is longer than a time required for potential V27 to rise to the level VI−VTN−|VTP|.

Then, when, at time point t4, input potential Vi is lowered from H level VH to L level VL, potentials V22, V27 ad V4 gradually fall. Each of potentials V22, V27 and V4 falls relatively fast at the first stage of a change in potential, but a fall speed slows down at a point nearer the final level.

At time point t5, when a prescribed time elapses from time point t4, not only is step-up signal φB raised to H level, but signal /φB is also lowered to L level. When signal φB is raised to H level, potential V22 at node N22 is raised by prescribed voltage ΔV1 through capacitor 76 by capacitive coupling. When signal /φB is lowered to L level, potential V27 at node N27 is lowered by prescribed voltage ΔV2 through capacitor 77 by capacitive coupling. At this time, drive circuit 75 performs an operation to output VL at L level to output node N30 and since an on-resistance value of P-type transistor 35 is smaller than that of N-type transistor 31, a level step-down action by V27 is stronger than a level step-up action by V22 to lower output potential VO rapidly starting at time point t5 (while in a case where V27 is not stepped down, output potential VO behaves as shown with a broken line).

A current flows out from node N22 to a line of ground potential GND through transistors 23 and 24 to thereby lower stepped-up potential V22 to VI+|VTP|+VTN. Stepped-down potential V27 receives inflow of a current from a line of fourth power supply potential V4 to node N27 through transistors 26 and 27 to thereby raise stepped-down potential V27 up to VI−|VTP|−VTN.

At time point t6, not only is step-up signal φB lowered to L level, but signal /φB is also raised to H level. When signal φB falls to L level, potential V22 at node N22 is lowered by prescribed voltage ΔV1 through capacitor 76 by capacitive coupling. When signal /φB is raised to H level, potential V27 at node N27 is raised by prescribed voltage ΔV2 through capacitor 77 by capacitive coupling. Even if V22 falls by ΔV1, pull-up circuit 30 has no capability to lower output potential VO and even if V27 rises by ΔV2, pull-down circuit 33 has no capability to raise output potential VO, so no change arises in output potential VO.

A current flows from a line of third power supply potential V3 to node N22 through P-type transistor 65 to thereby raise stepped-down potential V22 to VI+|VTP|+VTN. Since a current drive capability of P-type transistor 65 is set small for low current consumption, however, a time required for potential V22 at node N22 to rise to a level VI+|VTR|+VTN in stationary state is longer than a time required for potential V22 to fall to the level VI+|VTR|+VTN.

A current flows out from node N27 to a line of fifth power supply potential V5 through N-type transistor 70 to thereby lower stepped-up potential V27 to VI−VTN−|VTP|. Since a current drive capability of N-type transistor 70 is set small for low current consumption, however, a time required for potential V27 at node N27 to fall to a level VI−VTN−|VTP| in stationary state is longer than a time required for potential V22 to rise to the level VI−VTN−|VTP|.

In the seventh embodiment, since potential V22 at node N22 is raised to a potential higher than potential VI+|VTP|+VTN which potential V22 at node N22 should reaches at stationary state in response to a rise in input potential VI from L level to H level, a rise speed of output potential VO can be increased. Furthermore, since potential V27 at node N27 is lowered to a potential lower than potential VI−VTN−|VTP| which potential V27 at node N27 should reaches at stationary state in response to a fall in input potential VI from H level to L level, a fall speed of output potential VO can be increased. Accordingly, a response speed of drive circuit 75 can be made faster.

Figure 24:
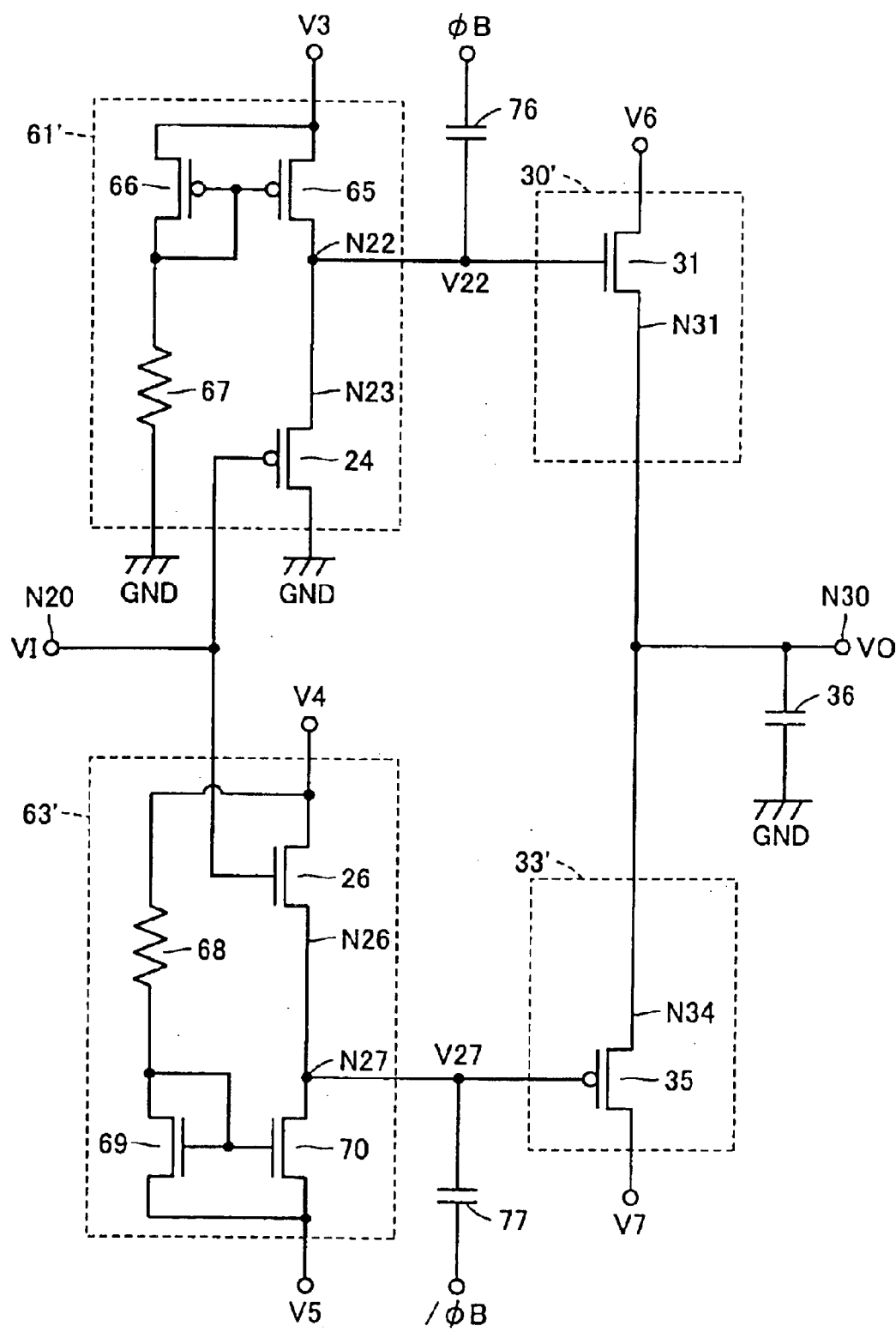
FIG. 24 is a circuit diagram showing an example modification of the seventh embodiment.

FIG. 24 is a circuit diagram showing a configuration of a drive circuit 78 according to an example modification of the seventh embodiment. Drive circuit 78 is of a configuration obtained by removing transistors 23, 27, 32 and 34 from drive circuit 75 of FIG. 22. In this example modification, since transistors 23, 27, 32 and 34 are not present because of the removal thereof, while output potential VO=VI+|VTP|−VTN, an occupancy area of the circuit is reduced.

Eighth Embodiment

Figure 25:
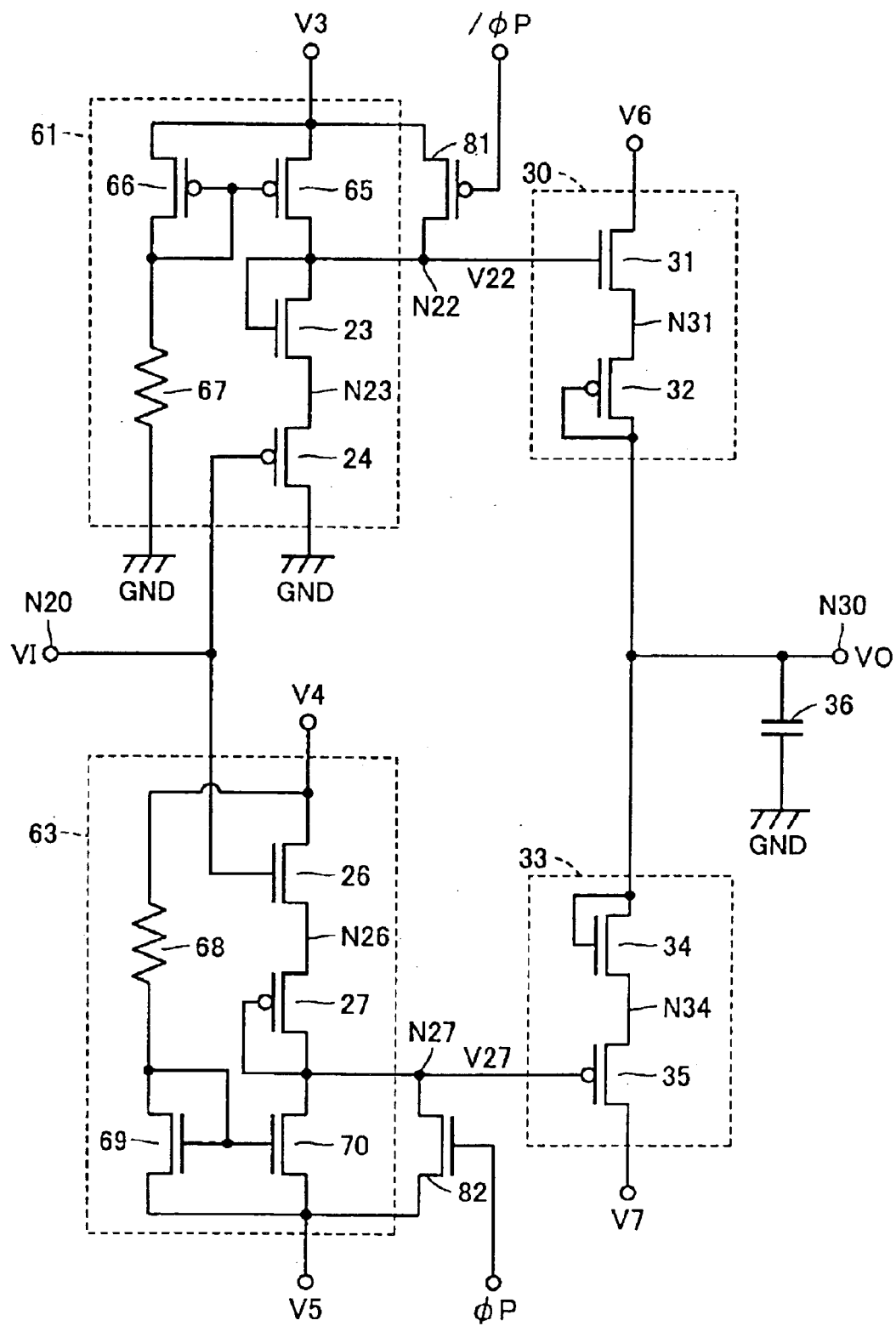
FIG. 25 is a circuit diagram showing a configuration of a drive circuit according to an eighth embodiment of the present invention.

FIG. 25 is a circuit diagram showing a configuration of a drive circuit 80 according to an eighth embodiment of the present invention. Referring to FIG. 25, drive circuit 80 is of a configuration obtained by adding a P-type transistor 81 and an N-type transistor 82 to drive circuit 71 of FIG. 19. P-type transistor 81 is connected to between a line of third power supply potential V3 and node N22 and receives a pull-up signal /φP at the gate thereof N-type transistor 82 is connected between node N27 and a line of fifth power supply potential V5 and receives a complementary pull-up signal φP of signal pull-up signal /φP at the gate thereof.

Signals φP and /φP receive a level change at timings similar to those of signals φB and /φB shown in the seventh embodiment. That is, when a prescribed time elapses after input signal VI is raised from VL at L level to VH at H level, signals /φP and φP are pulsewise driven to L and H levels, respectively, to cause P-type transistor 81 and N-type transistor 82 to be pulsewise conductive. Thereby, potential V22 at node N22 is raised to a potential obtained by dividing third power supply potential V3 over transistor 81 and a pair of transistors 23 and 24 and to thereafter reach a prescribed value VI+|VTP|+VTN. Furthermore, potential V27 at node N27 is lowered to a potential obtained by dividing a voltage V4–V5 between fourth power supply potential V4 and fifth power supply potential V5 over a pair of transistors 26 and 27 and transistor 82 and to thereafter reach a prescribed value VI–VTN–|VTP|. At this time, as described in the seventh embodiment, a charge action by N-type transistor 31 stronger than a discharge action by P-type transistor 35 to cause output potential VO to be equal to input potential VI rapidly. When input potential VI is lowered from VH at H level to VL at l level, a discharge action of P-type transistor 35 is stronger than a charge action of N-type transistor 31 to cause output potential VO to be equal to input potential VI rapidly.

In the eighth embodiment as well, the same effect as in the seventh embodiment can be obtained.

Figure 26:
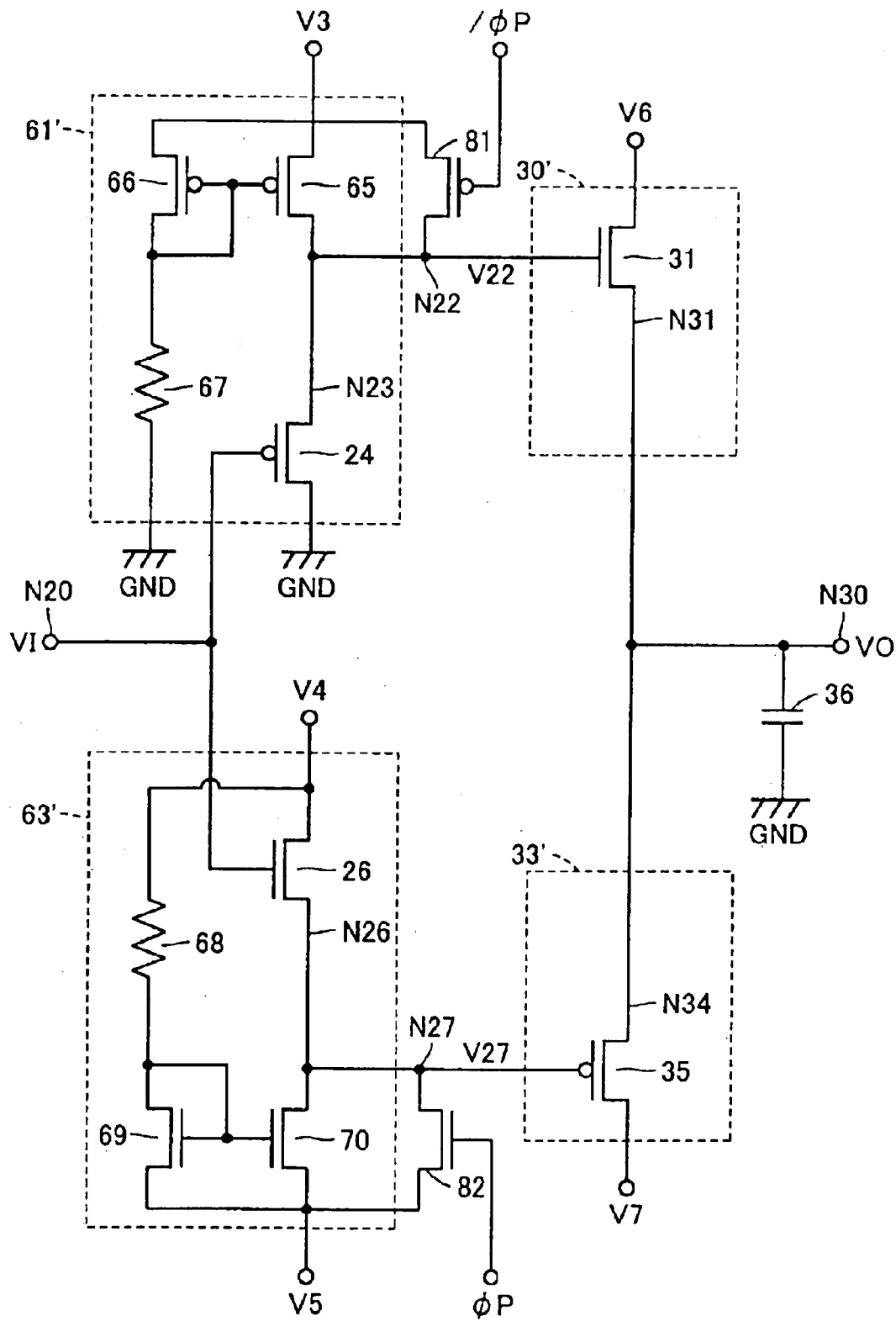
FIG. 26 is a circuit diagram showing an example modification of the eighth embodiment.

Description will be given of various example modifications of the eighth embodiment below. A drive circuit 86 of FIG. 26 is of a configuration obtained by removing N-type transistors 23 and 34 and P-type transistors 27 and 32 from drive circuit 80 of FIG. 25. In this example modification, since transistors 23, 27, 32 and 34 are not present because of the removal thereof, while output potential VO=VI+|VTP|–VTN, an occupancy area of the circuit is reduced.

Figure 27:
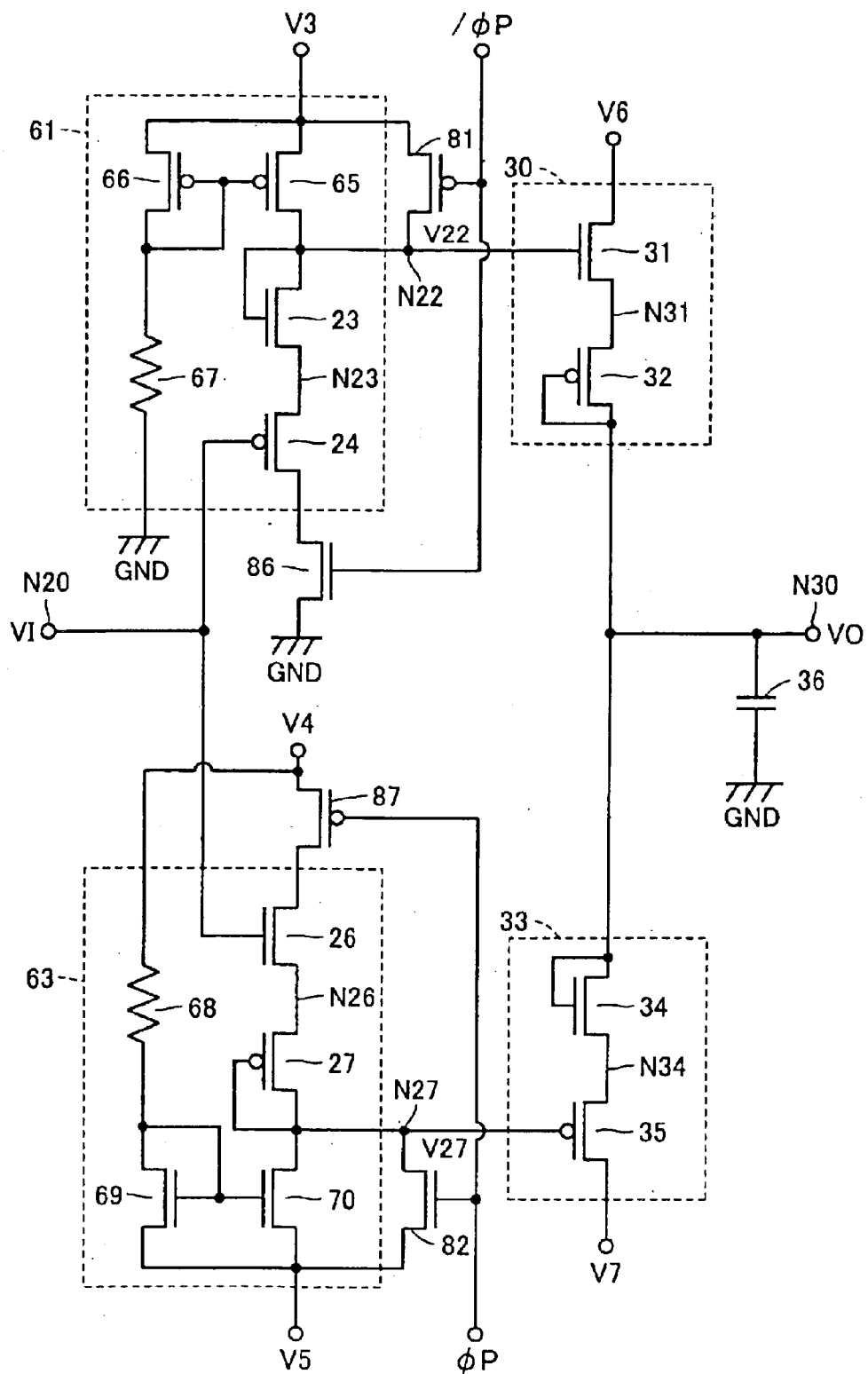
FIG. 27 is a circuit diagram showing another example modification of the eighth embodiment.

Drive circuit 85 of FIG. 27 is of a configuration obtained by adding an N-type transistor 86 and a P-type transistor 87 to drive circuit 80 of FIG. 25. N-type transistor 86 is connected between the source of P-type transistor 24 and a line of ground potential GND and receives pull-up signal /φP at the gate thereof. P-type transistor 87 is connected between a line of fourth power supply potential V4 and the drain of N-type transistor 26 and receives complementary signal φP of pull-up signal /φP at the gate thereof. In this example modification, since N-type transistor 86 becomes non-conductive when P-type transistor 81 is conductive, it can be prevented that a through-current flows into a line of ground potential GND from a line of third power supply potential V3 through transistors 81, 23, 24 ad 86. Furthermore, since P-type transistor 87 becomes non-conductive when N-type transistor 82 is conductive, it can be prevented that a through-current flows into a line of fifth power supply potential V4 from a line of fourth power supply potential through transistors 87, 26, 27 and 82. Therefore, current consumption is reduced in circuits 61 and 63.

Figure 28:
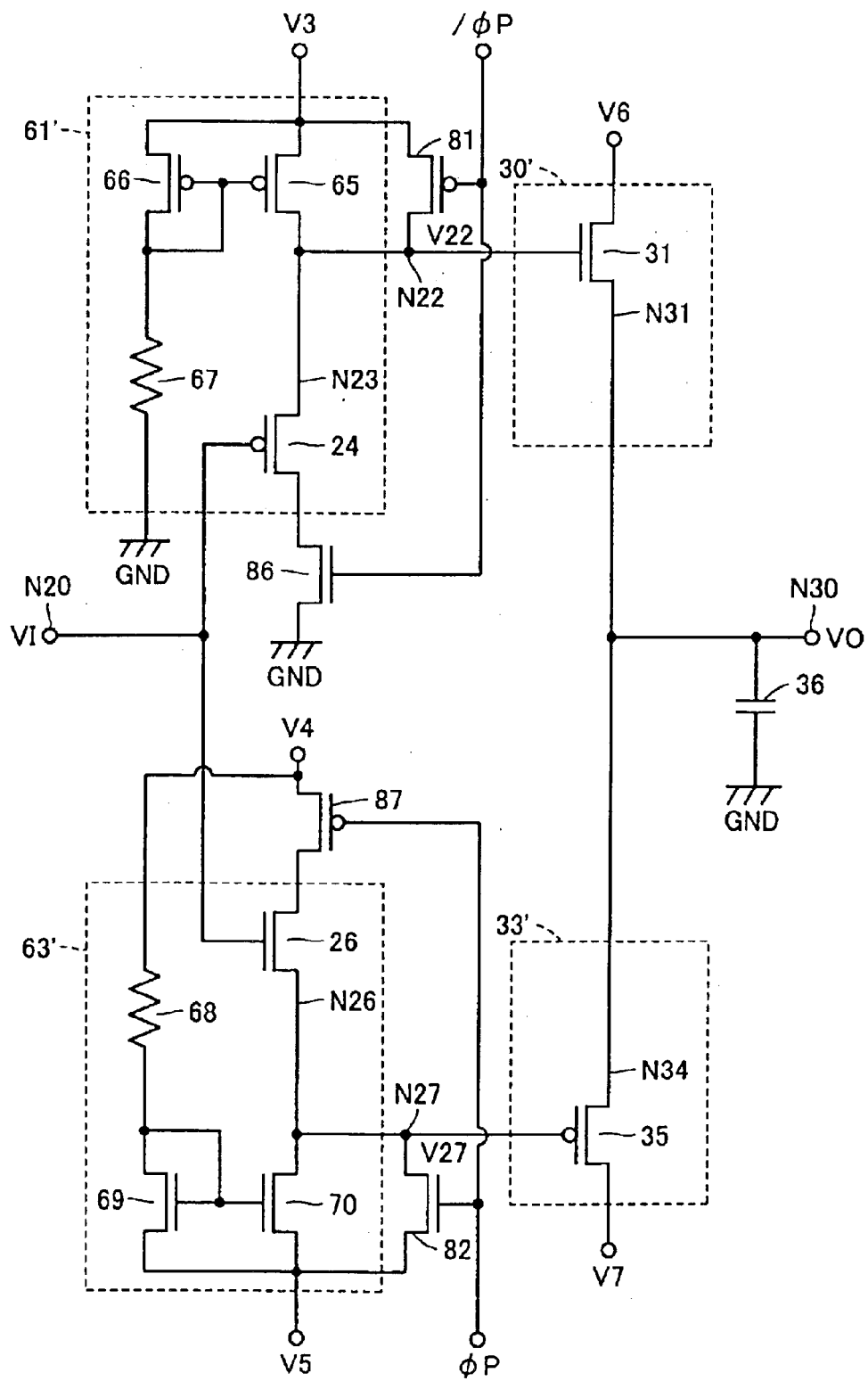
FIG. 28 is a circuit diagram showing still another example modification of the eighth embodiment.

A drive circuit 88 of FIG. 28 is of a configuration obtained by removing N-type transistors 23 and 34 and P-type transistors 27 and 32 from drive circuit 85 of FIG. 27. In this example modification, since transistors 23, 27, 32 and 34 are nod present because of the removal thereof, while output potential VO=VI+|VTP|–VTN, an occupancy area of the circuit is reduced.

Figure 29:
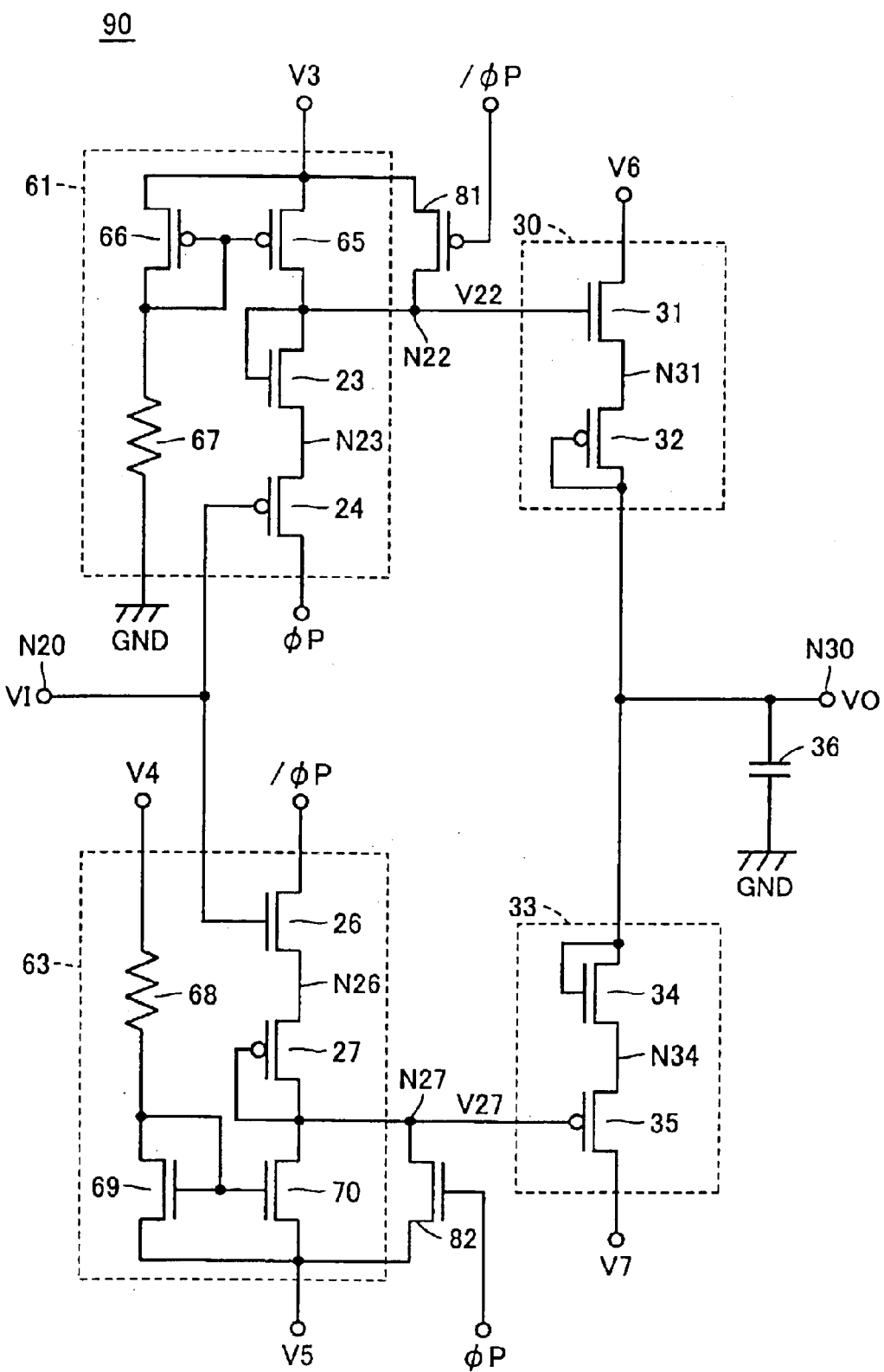
FIG. 29 is a circuit diagram showing still another example modification of the eighth embodiment.

A drive circuit 90 of FIG. 29 is of a configuration in which not only is signal φP given to the source of P-type transistor 24 of drive circuit 80 of FIG. 25 instead of ground potential GND, but signal /φP to given to the drain of N-type transistor instead of fourth power supply potential V4. In this example modification, since the drain of P-type transistor 24 is driven to H level when P-type transistor 24 is conductive, it can be prevented that a through-current flows through transistors 81, 23 and 24. Furthermore, since the drain of N-type transistor 26 is driven to L level when N-type transistor 82 is conductive, it can be prevented that a through-current flows through transistors 26, 27 and 82. Therefore, current consumption in circuits 61 and 63 can be reduced.

Figure 30:
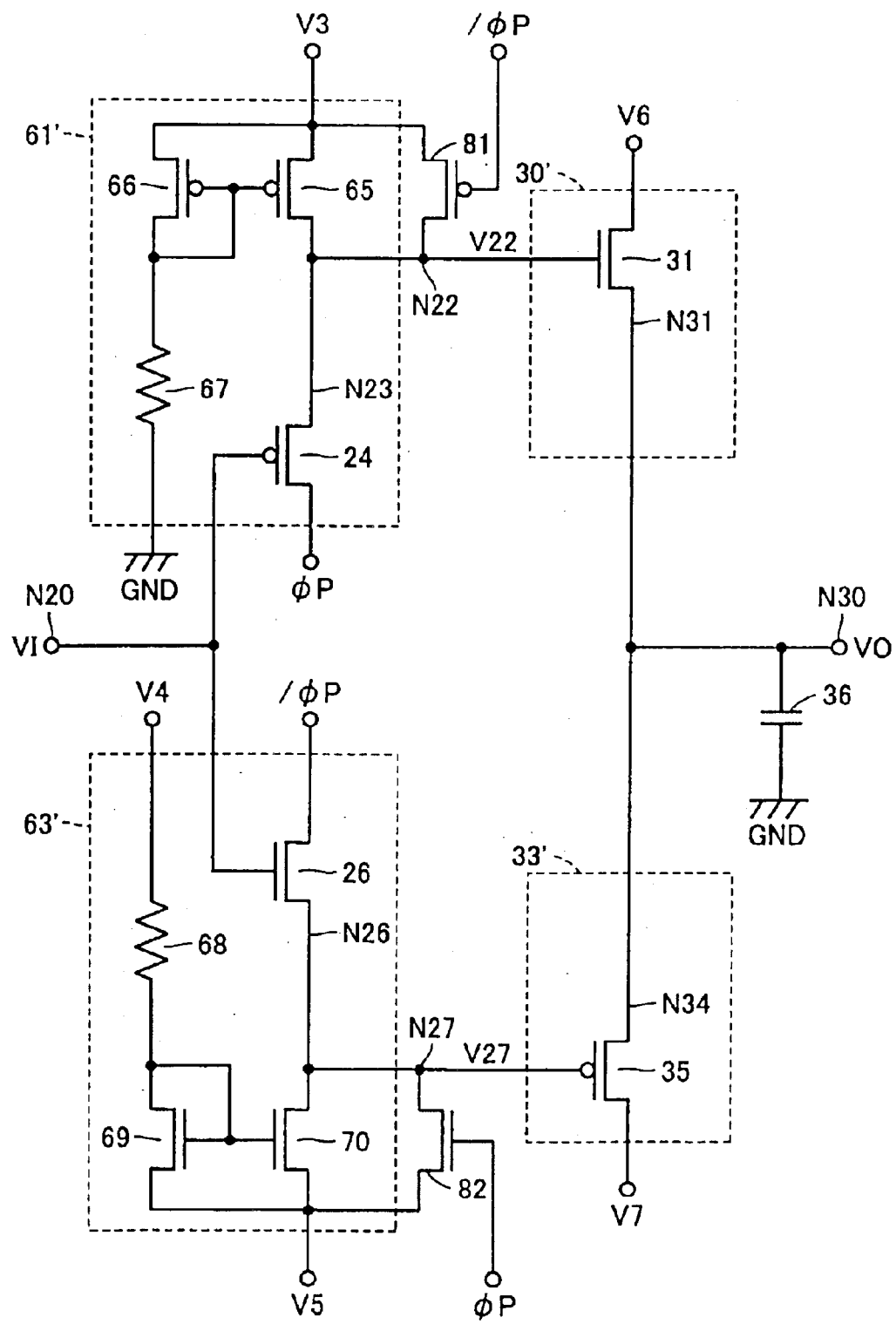
FIG. 30 is a circuit diagram showing still another example modification of the eighth embodiment.

A drive circuit 91 of FIG. 30 is of a configuration obtained by removing N-type transistors 23 and 34 and P-type transistors 27 and 32 from drive circuit 90 of FIG. 29. In this example modification, since transistors 23, 27, 32 and 34 are not present because of the removal thereof, while output potential VO=VI+|VTP|–VTN, an occupancy area of the circuit is reduced.

Ninth Embodiment

Figure 31:
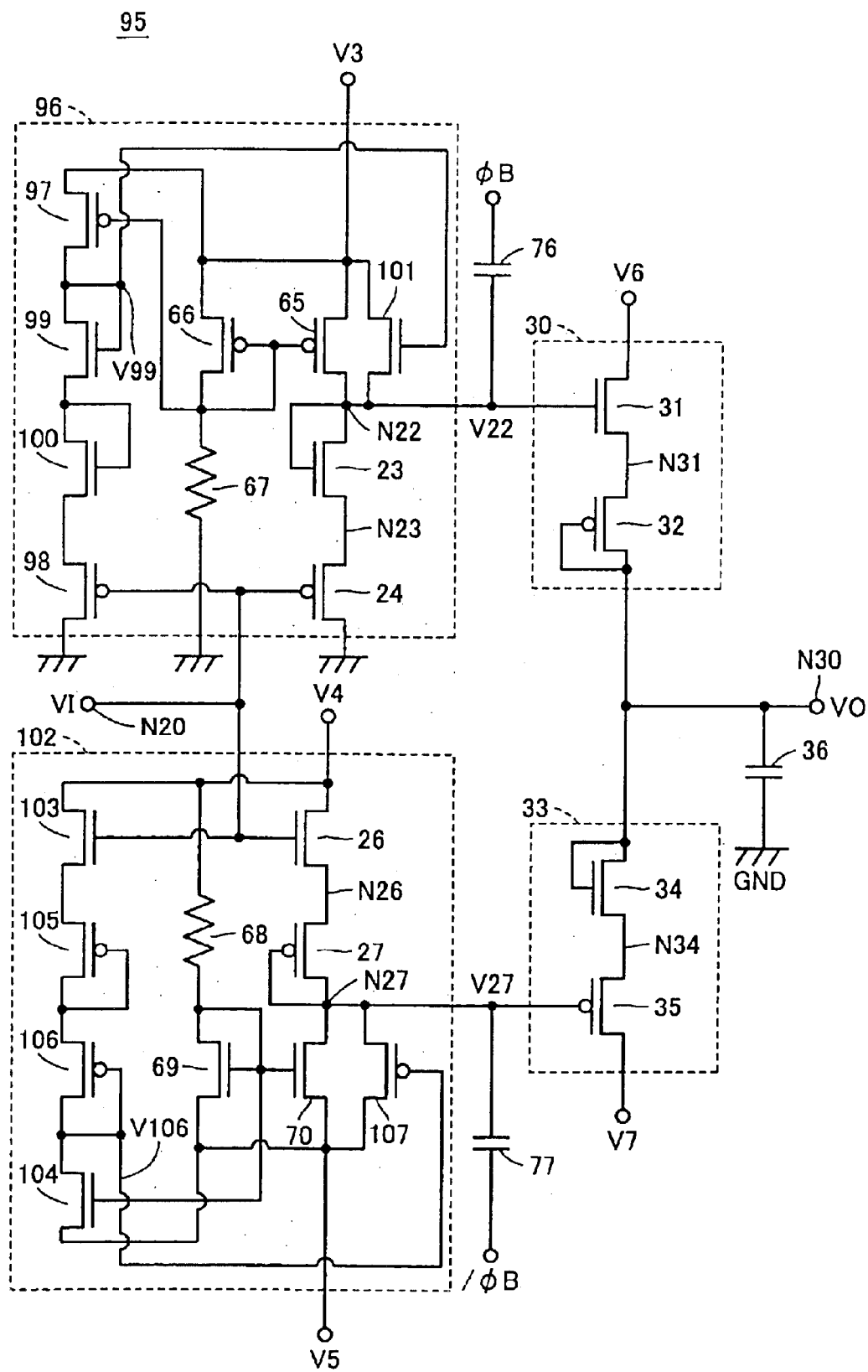
FIG. 31 is a circuit diagram showing a configuration of a drive circuit according to a ninth embodiment of the present invention.

FIG. 31 is a circuit diagram showing a configuration of a drive circuit 95 according to a ninth embodiment of the present invention. Referring to FIG. 31, drive circuit 95 is different from drive circuit 75 of FIG. 22 in that level shift circuits 61 and 63 are replaced with respective level shift circuits 96 and 102.

Level shift circuit 96 is of configuration obtained by adding P-type transistors 97 and 98 and N-type transistors 99 to 101 to level shift circuit 61. P-type transistor 97, N-type transistors 99 and 100 and P-type transistor 98 are series-connected between a line of third power supply potential V3 and a line of ground potential GND, and N-type transistor 101 is connected between a line of third power supply potential V3 and node N22. The gate of P-type transistor 97 is connected to the gate of P-type transistor 66. Therefore, a constant current of a value corresponding to a value of a constant current flowing in P-type transistor 66 flows through transistors 97, 99, 100 and 98. The gates of N-type transistors 99 and 100 are connected to the respective drains thereof. Each of N-type transistors 99 and 100 works as a diode. P-type transistor 98 receives input potential VI at the gate thereof. A potential V99 at node between transistors 97 and 99 is V99=VI+|VTP|+2VTN. V99 is given to the gate of N-type transistor 101. N-type transistor 101 charges node N22 to V99–VTN=VI+|VTP|+VTN.

Level shift circuit 102 is of a configuration obtained by adding N-type transistors 103 and 104 and P-type transistors 105 to 107 to level shift circuit 63. N-type transistor 103, P-type transistors 105 and 106 and N-type transistor 104 are series-connected between a line of fourth power supply potential V4 and a line of fifth power supply potential V5, and P-type transistor 107 is connected between node N27 and a line of fifth power supply potential V5. N-type transistor 103 receives input potential VI at the gate thereof. The gates of P-type transistors 105 and 106 are connected to the respective drains thereof. P-type transistors 105 and 106 each work as an diode. The gate of N-type transistor 104 is connected to the gate of N-type transistor 69. A constant current of a value corresponding to a value of a constant current flowing in N-type transistor 69 flows in N-type transistor 104. A potential V106 at a node between MOS transistors 106 and 104 is V106=VI–VTN–2|VTP|. V106 is given to the gate of P-type transistor 107. P-type transistor 107 discharges node N27 to V106–(VTP|=VI–VTN–|VTP|. Since the other parts of the configuration and operations therein are the same as in drive circuit 75 of FIG. 22, none of descriptions thereof is repeated.

Figure 32:
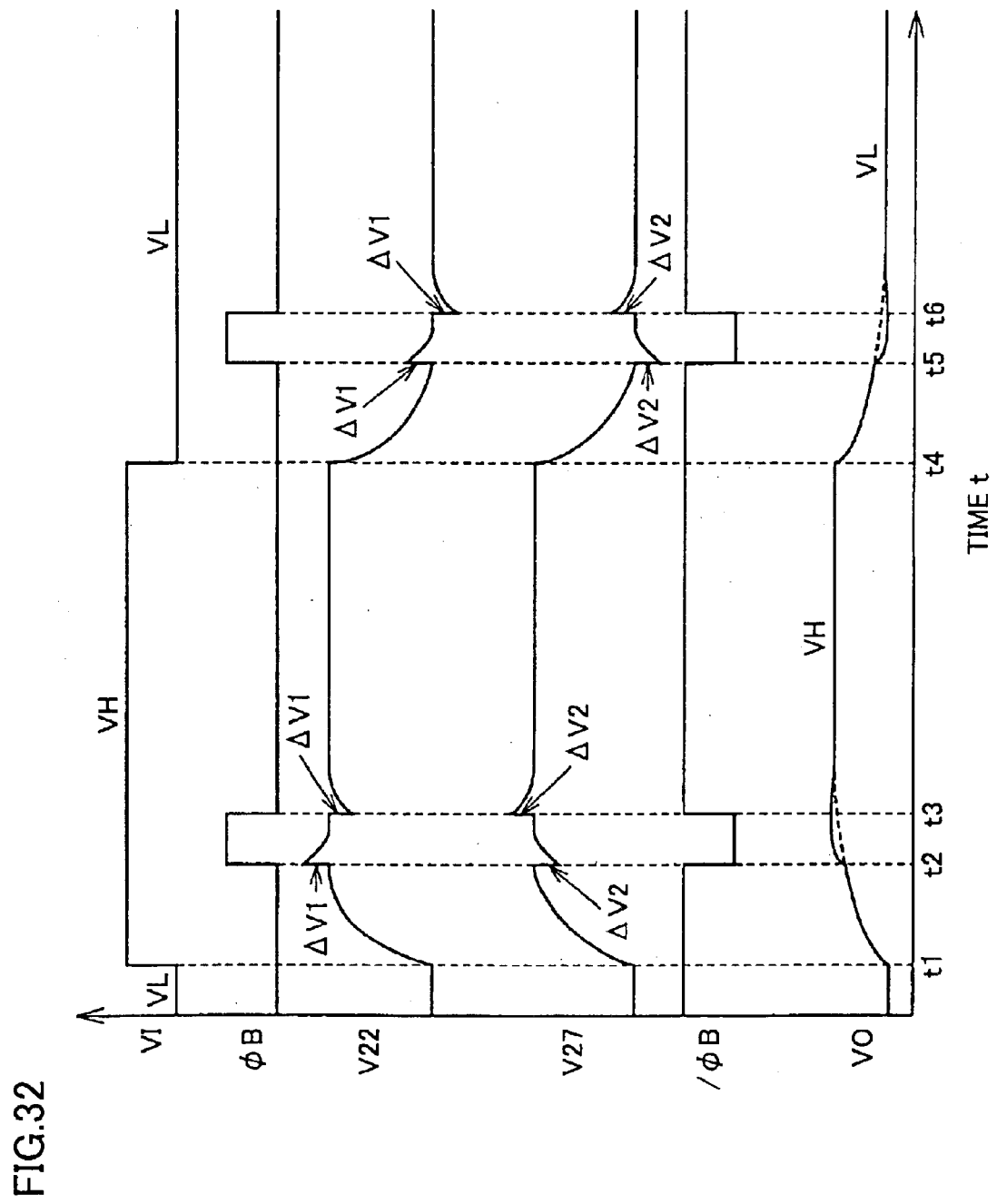
FIG. 32 is a time chart showing operations in the drive circuit shown in FIG. 31.

FIG. 32 is a time chart showing operations in drive circuit 95 shown in FIG. 31, which is compared with FIG. 23. Referring to FIG. 23, in drive circuit 95, since node N22 is charged by transistors 97 to 101 to VI+|VTP|+VTN, when potential V22 at node N22 becomes lower than prescribed value VI+|VTP|+VTN (at time points t3 and t6), potential V22 at node N22 can be restored to prescribed value VI+|VTP|+VTN rapidly. Furthermore, since node N27 is discharged by transistors 103 to 107 to VI–VTN–|VTP|, when potential V27 at node N27 becomes higher than a prescribed value VI–VTN–|VTP| (at time points t3 ad t6), potential V27 at node N27 can be restored to prescribed value VI–VTN–|VTP| rapidly. Therefore, a response speed of the circuit can be made faster.

Figure 33:
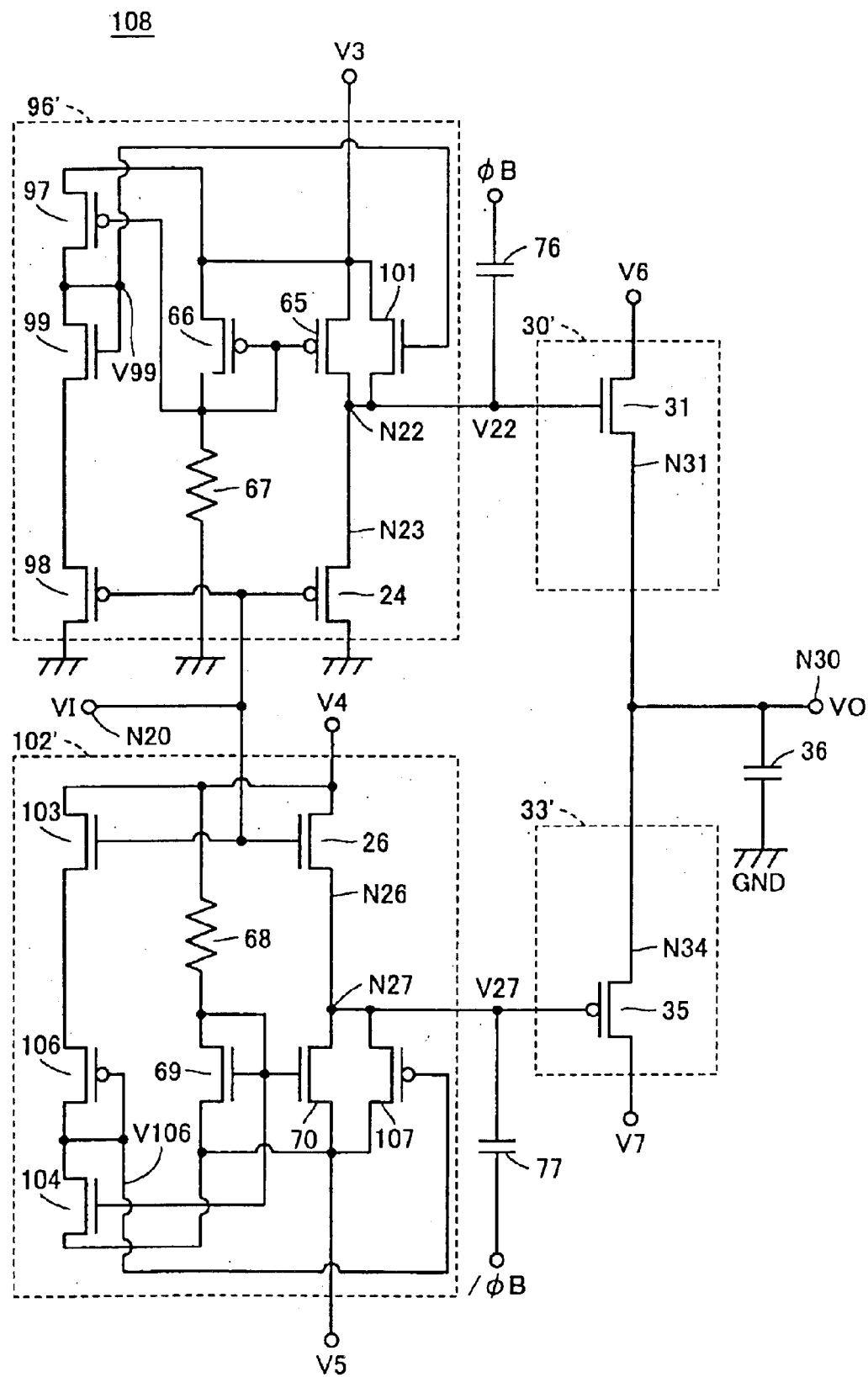
FIG. 33 is a circuit diagram showing an example modification of the ninth embodiment.

FIG. 33 is a circuit diagram showing an example modification of the ninth embodiment. A drive circuit 108 is of a configuration obtained by removing N-type transistors 23, 34 and 100 and P-type transistor 27, 32 and 105 from drive circuit 95 of FIG. 31. In this example modification, transistors 23, 27, 32, 34, 100 and 105 are not present because of the removal thereof, while output potential VO=VI+|VTP|−VTN, an occupancy area of the circuit is reduced.

Tenth Embodiment

Figure 34:
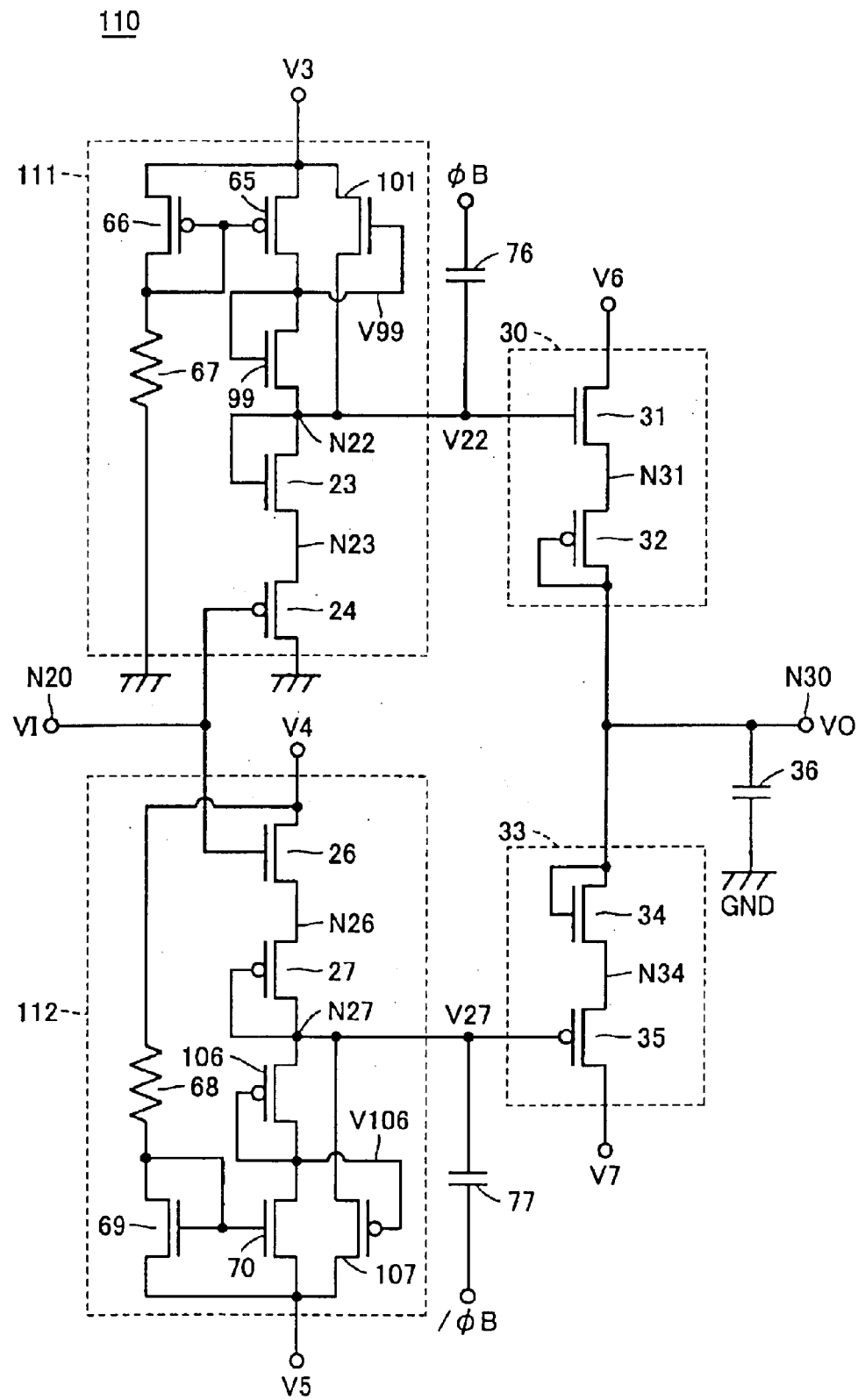
FIG. 34 is a circuit diagram showing a configuration of a drive circuit according to an tenth embodiment of the present invention.

FIG. 34 is a circuit diagram showing a configuration of a drive circuit 110 according to an tenth embodiment of the present invention. In FIG. 34, drive circuit 110 is different from drive circuit 95 of FIG. 31 in that level shift circuits 96 and 102 are replaced with respective level shift circuits 111 and 112.

Level shift circuit 111 is of a configuration in which P-type transistors 97 and 98 and N-type transistor 100 are removed from level shift circuit 96 and N-type transistor 99 is connected between the source of P-type transistor 65 and node N22. The gate of N-type transistor 99 is connected to the drain of N-type transistor 99 and the gate of N-type transistor 101. Potential V99 at the gates of N-type transistors 99 and 101 is V99=VI+|VTP|+2VTN. N-type transistor 101 charges node N22 to V99−VTN=VO+|VTP|+VTN.

Level shift circuit 112 is of a configuration in which N-type transistors 103 and 104 and P-type transistor 105 are removed from level shift circuit 102 and P-type transistor 106 is connected between node N27 and the drain of N-type transistor 70. The gate of P-type transistor is connected to the drain thereof and the gate of P-type transistor 107. Potential V106 at the gates of P-type transistors 106 and 107 is V106=VI−VTN−2|VTP|. P-type transistor 107 discharges node N27 to V106+|VTP|=VI−VTN−|VTP|. The other parts of the configuration and operations therein are the same as corresponding parts of the configuration of drive circuit 95 of FIG. 31 and operations therein, none of descriptions thereof is repeated.

In the tenth embodiment, the same effect as in the ninth embodiment can be attained and in addition, since reduction can be achieved in a current flowing from a line of third power supply potential V3 to a line of ground potential GND through transistors 97, 99, 100 and 98 and a current flowing from a line of fourth power supply potential V4 to a line of fifth power supply potential V5 through transistors 103, 105, 106 and 104, current consumption is reduced. Furthermore, since transistors 97, 98, 100 and 103 to 105 are not present because of the removal thereof, an occupancy area of the circuit is reduced.

Figure 35:
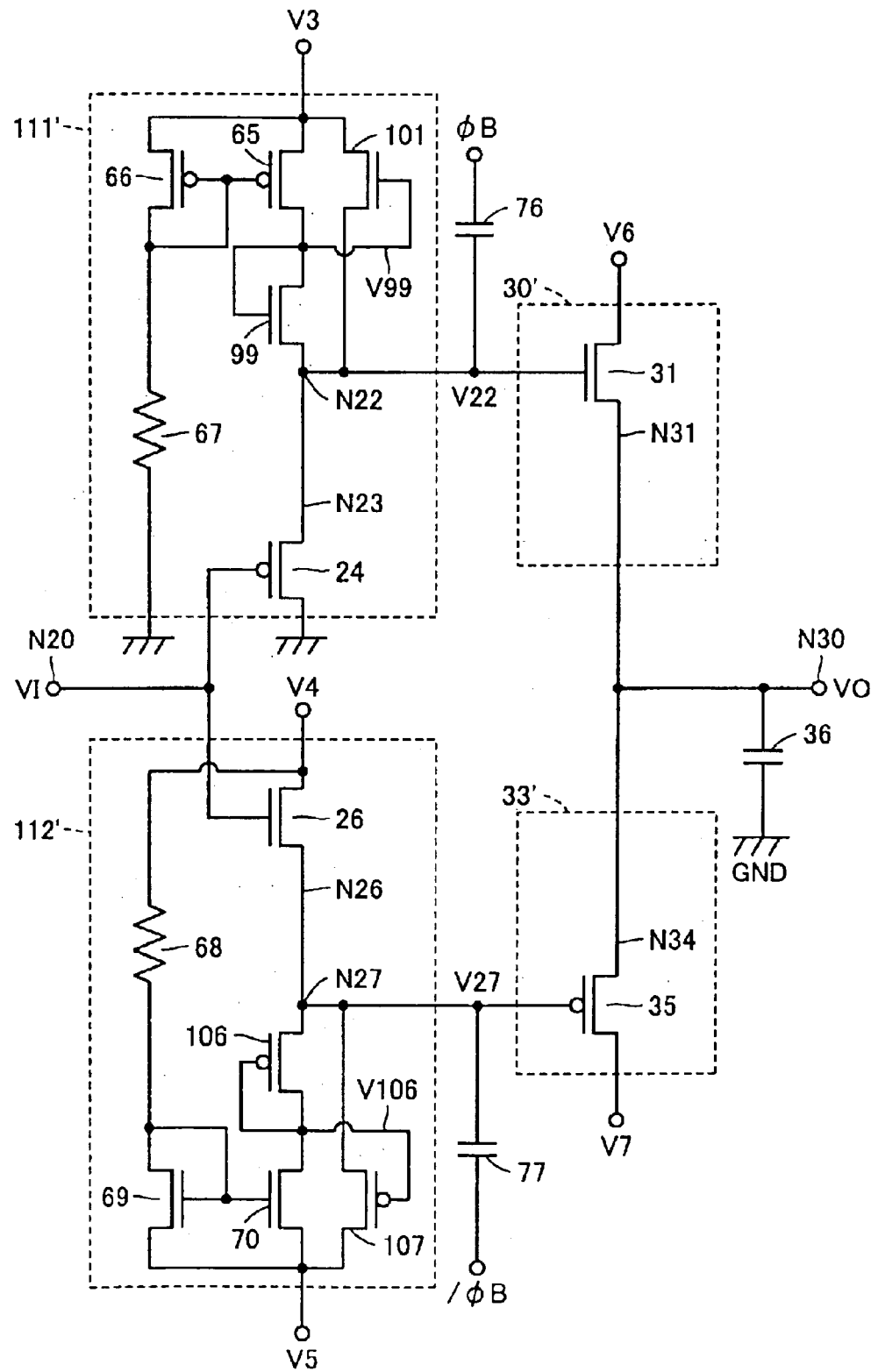
FIG. 35 is a circuit diagram showing an example modification of the tenth embodiment.

FIG. 35 is a circuit diagram showing an example modification of the tenth embodiment. A drive circuit 113 in this example modification is of a configuration obtained by removing N-type transistor 23 and 34 and P-type transistors 27 and 32 from drive circuit 110 of FIG. 34. In this example modification, since transistors 23, 27, 32 and 34 are not present because of the removal thereof, while output potential VO=VI+|VTP|−VTN, an occupancy area of the circuit is reduced.

Eleventh Embodiment

Figure 36:
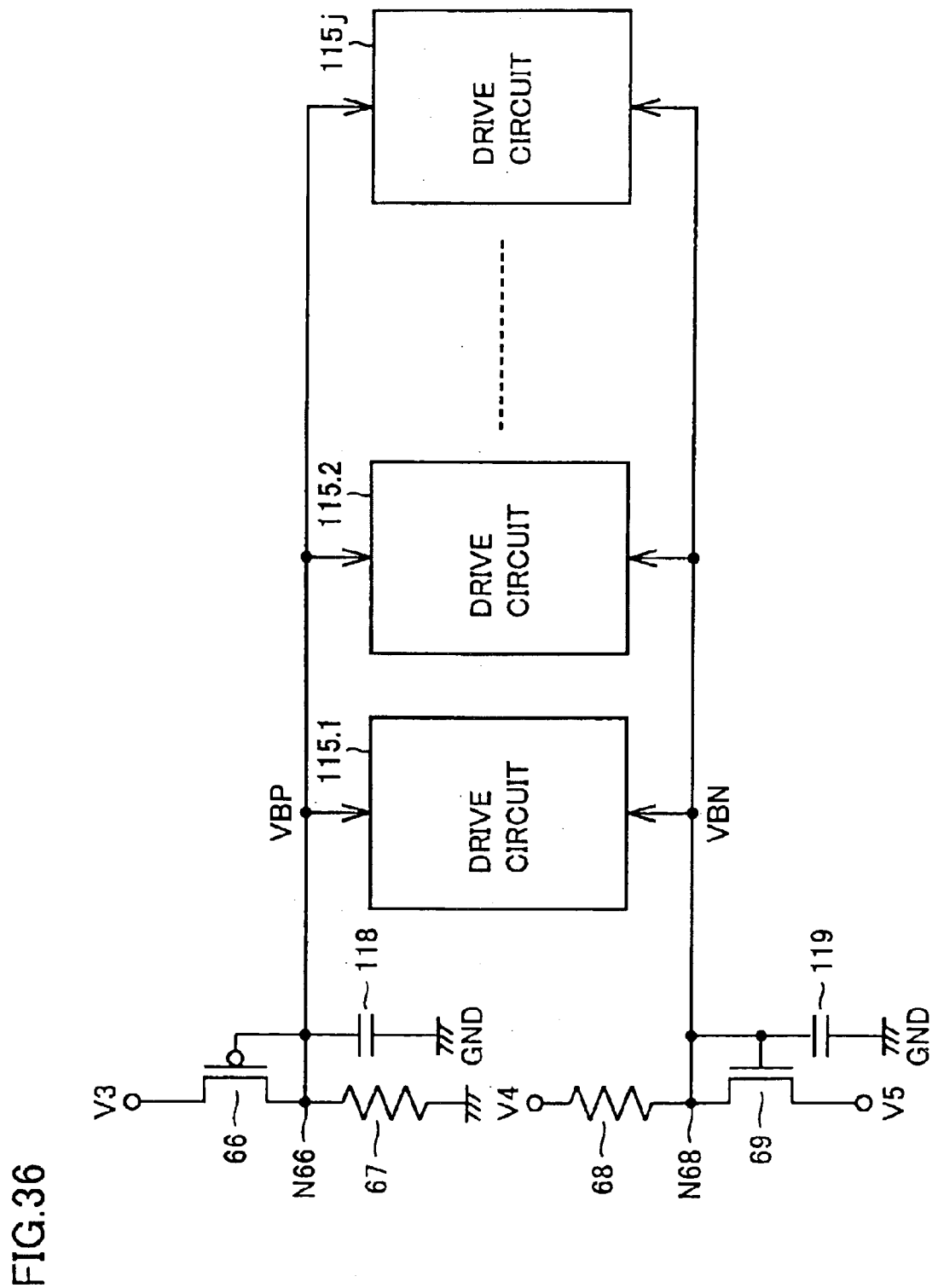
FIG. 36 is a circuit diagram showing a configuration of a drive circuit according to an eleventh embodiment of the present invention.

FIG. 36 is a circuit block diagram showing a main part of a semiconductor integrated circuit device according to an eleventh embodiment of the present invention. In FIG. 36, the semiconductor integrated circuit device includes; j drive circuits 115.1 to 115.j, wherein j is a natural number of 2 or more.

Figure 37:
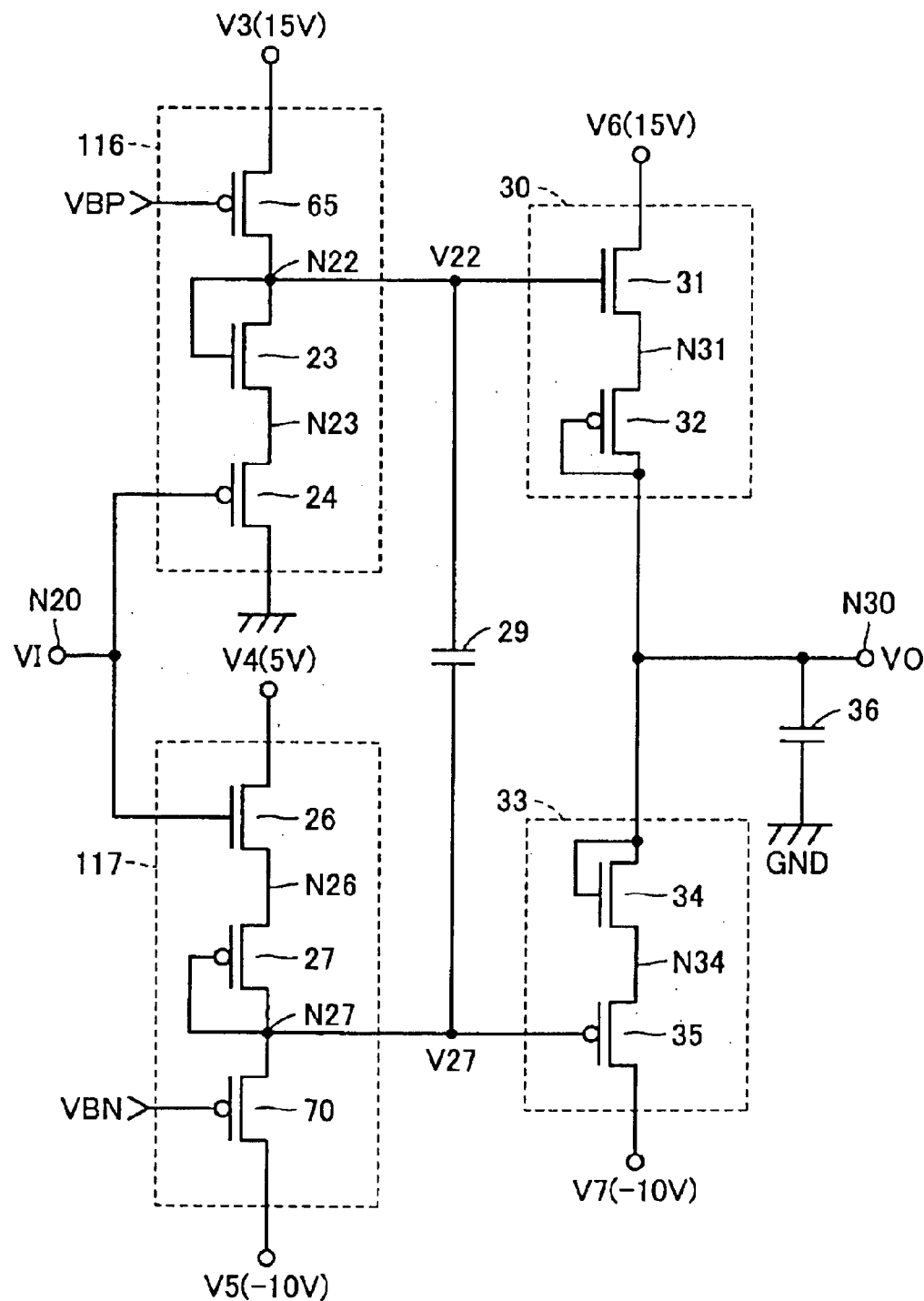
FIG. 37 is a circuit diagram showing a configuration of the drive circuit shown in FIG. 36.

Drive circuit 115.1 is of a configuration obtained, as shown in FIG. 37, by replacing level shit circuits 61 and 63 of drive circuit 60 of FIG. 18 with respective level shift circuits 116 and 117. Level shift circuit 116 is of a configuration obtained by removing P-type transistor and resistance element 67 from level shift circuit 61 and level shift circuit 117 is of a configuration obtained by removing resistance element 68 and N-type transistor 69 from level shift circuit 63. Transistors 65 and 70 receive respective bias potentials VBP and VBN at the gates thereof. Each of the other drive circuits 115.2 to 115.j is of the same configuration as drive circuit 115.1.

Returning to FIG. 36, the semiconductor integrated circuit device includes: a P-type transistor 66 and a resistance element 67 for generating bias potential VBP and a resistance element 68 and an N-type transistor 69 for generating bias potential VBN, commonly provided to drive circuits 115.1 to 115.j.

P-type transistor 66 and resistance element 67 are series-connected between a line of third power supply potential V3 and a line of ground potential GND and the gate of P-type transistor 66 is connected to the drain (node N66) thereof. Bias potential VBP appears at node N66. A capacitor 118 for stabilizing bias potential VBP is connected between node N66 and a line of ground potential GND. A constant current of a value corresponding to a constant current flowing in P-type transistor 66 flows in P-type transistor 65 of each of drive circuits 115.1 to 115.j.

Resistance element 68 and N-type transistor 69 are connected between a line of fourth power supply potential V4 and a line of fifth power supply potential V5 and the gate of N-type transistor 69 is connected to the drain (node N68) thereof. Bias potential VBN appears at node N68. A capacitor 119 for stabilizing bias potential VBN is connected between node N68 and a line of ground potential GND. A constant current of a value corresponding to a constant current flowing in N-type transistor 69 flows in N-type transistor 70 in each of drive circuits 115.1 to 115.j.

In the eleventh embodiment, the same effect as in the sixth embodiment is obtained and in addition, since a circuit for generating bias potentials VBP and VBN is provided commonly to drive circuits 115.1 to 115.j, an occupancy area per one of drive circuits 115.1 to 115.j is reduced.

Twelfth Embodiment

Figure 38:
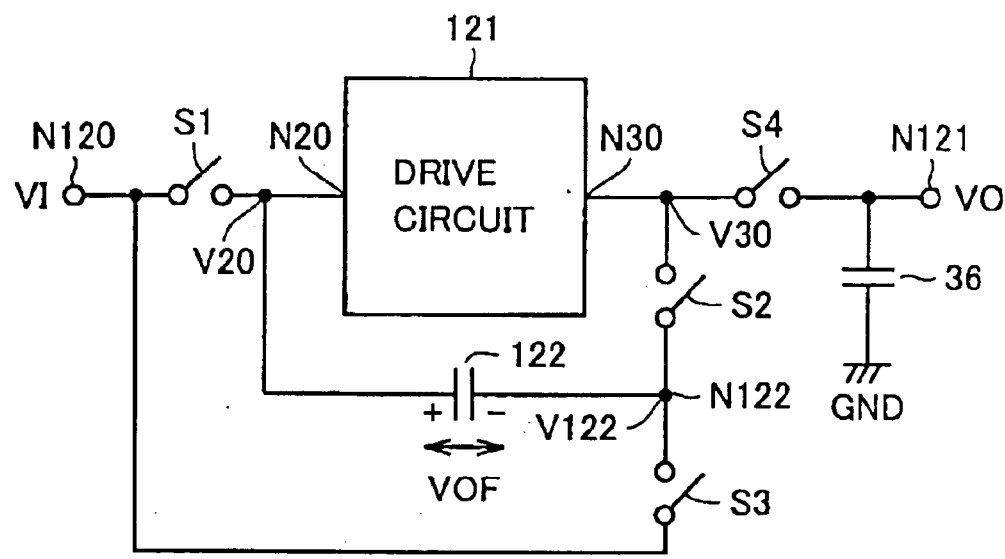
FIG. 38 is a circuit block diagram showing a configuration of a drive circuit with an offset compensation capability according to a twelfth embodiment of the present invention.

FIG. 38 is a circuit block diagram showing a configuration of a drive circuit 120 with an offset compensation capability according to a twelfth embodiment of the present invention. In FIG. 38, drive circuit with an offset compensation capability 120 includes: a drive circuit 121; a capacitor 122; and switches S1 to S4. Drive circuit 121 is one of drive circuits shown in the first to eleventh embodiments. In a case where a potential difference between input potential and output potential of drive circuit 121, that is an offset potential VOF arises due to a variation in threshold voltage of transistors in drive circuit 121 and other causes, capacitor 122 and switches Si to S4 constitute an offset compensation circuit for compensating offset voltage VOF.

That is, switch S1 is connected between an input node N120 and an input node N20 of drive circuit 121 and switch S4 is connected between an output node N121 and an output node N30 of drive circuit 121. Capacitor 122 and switch S2 are series-connected between input node N20 of drive circuit 121 and output node N30. Switch S3 is connected between input node N120 and node N122 between capacitor 122 and switch S2. Each of switches S1 to S4 may be a P-type transistor, an N-type transistor or parallel-connection between a P-type transistor and an N-type transistor. Each of switches S1 to S4 is on/off controlled by a control signal (not shown).

Figure 39:
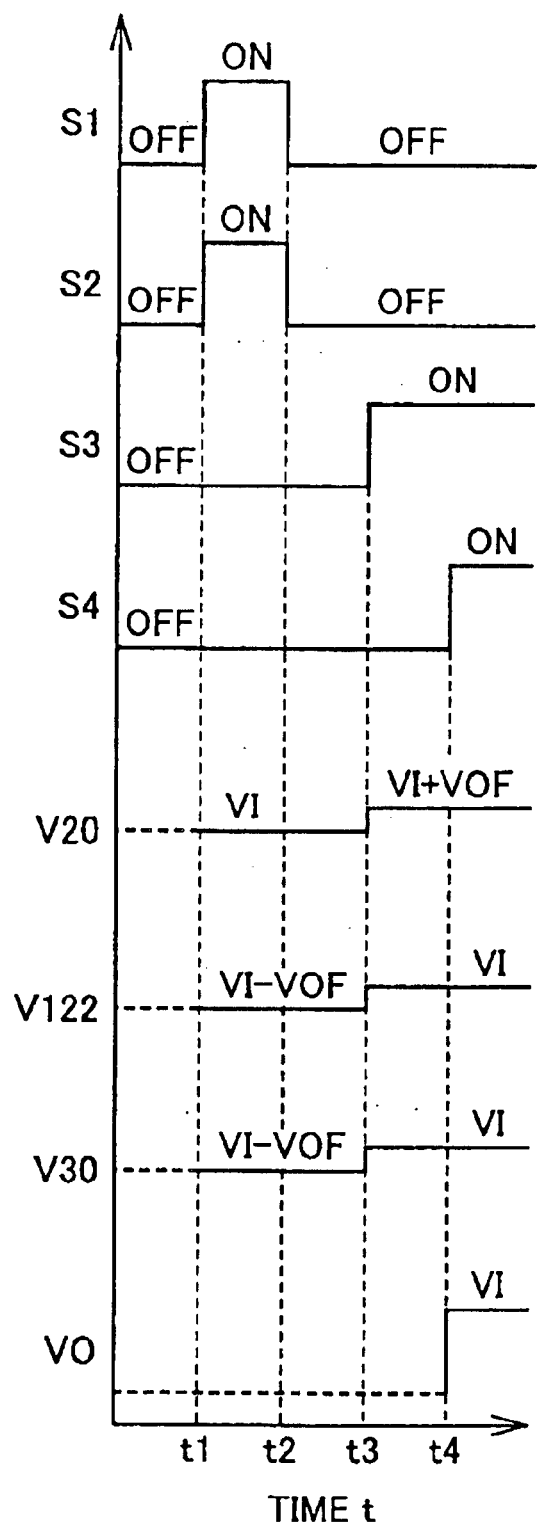
FIG. 39 is a time chart showing operations in the drive circuit with an offset compensation capability shown in FIG. 38.

Now, description will be given of a case where an output potential of drive circuit 121 is lower than an input potential thereof by offset voltage VOF. As shown in FIG. 39, in an initial state, all switches S1 to S4 are in off state. When, at time point t1, switches S1 and S2 are turned on, a potential V20 at input node N20 of drive circuit 121 is V20=VI and output potential V30 of drive circuit 121 and potential V122 at node N122 are V30=V122=VI−VOF and capacitor 122 is charged to offset potential VOF.

When, at time point t2, switches S1 and S2 are caused to be in off state, offset voltage VOF is held in capacitor 122. When, at time point t3, switch S3 is caused to be in on state, potential V122 at node N122 is V122=VI and input potential V20 of drive circuit 121 becomes V20=VI+VOF. As a result, output potential V30 of drive circuit 121 becomes V30=V20−VOF=VI, leading to cancellation of offset voltage VOF of drive circuit 121. Then, when, at time point t4, switch S4 is caused to be in on state, output potential VO becomes VO=VI, which is supplied to a load.

In the twelfth embodiment, offset voltage VOF of drive circuit 121 can be cancelled, thereby enabling coincidence between output potential VO and input potential VI.

Note that switch S4 is not always necessary. Without switch S4 provided, however, in a case where a capacitance value of load capacitance 36 is large, a long time is required for stabilization of an inter-terminal voltage VOF of capacitor 122 after switches S1 and S2 are caused to be in on state at time point t1.

Thirteenth Embodiment

Figure 40:
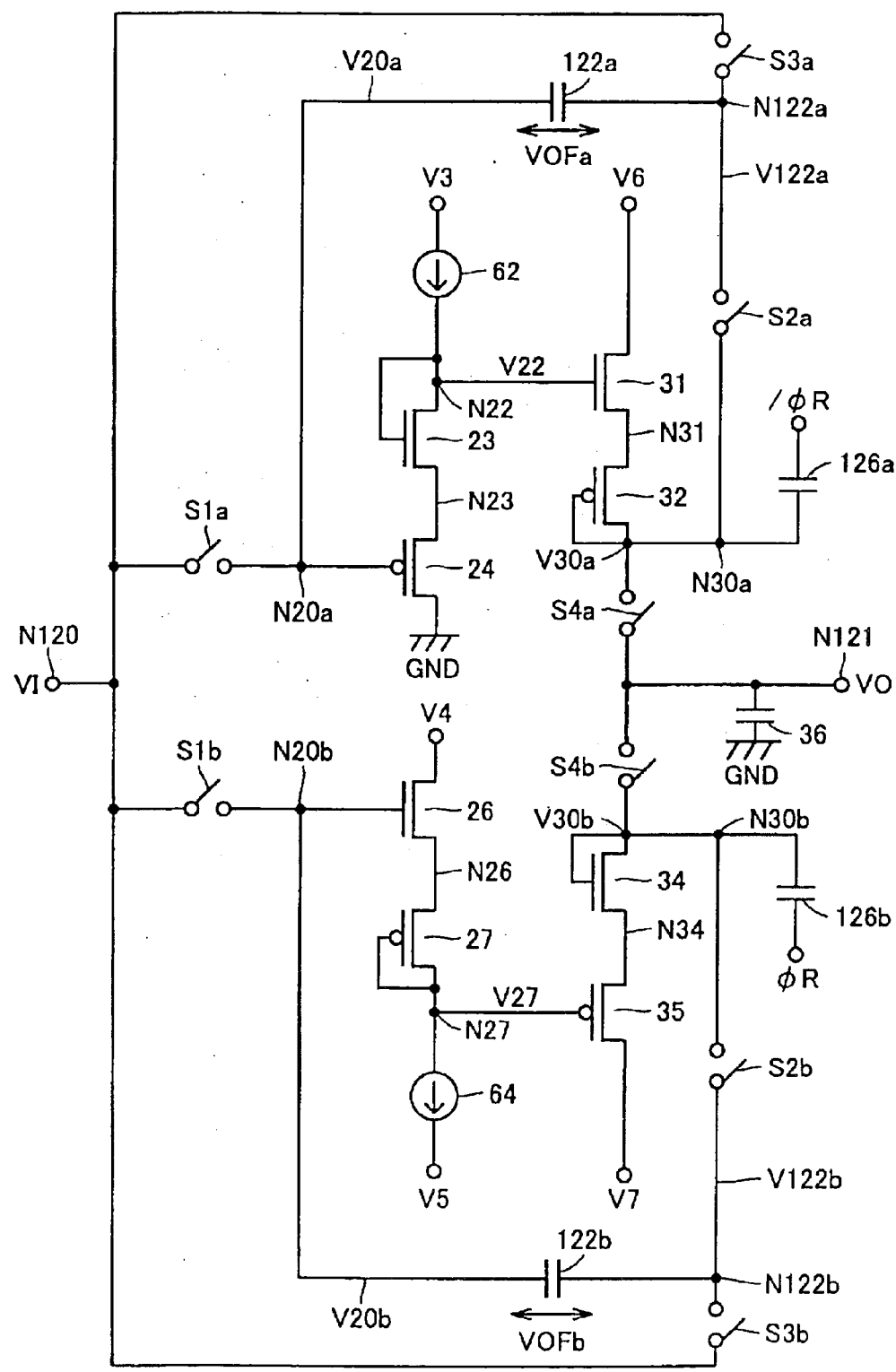
FIG. 40 is a circuit block diagram showing a configuration of a drive circuit with an offset compensation capability according to a thirteenth embodiment of the present invention.

FIG. 40 is a circuit block diagram showing a configuration of a drive circuit with an offset compensation capability 125 according to a thirteenth embodiment of the present invention. In FIG. 40, driver circuit with an offset compensation capability 125 is of a configuration obtained by adding capacitors 122a, 122b, 126a and 126b and switches S1a to S4a and S1b to S4b to drive circuit 60 of FIG. 17.

Switches S1a and S1b are connected between input node N120 and the gate (node N20a) of transistor 24 and between input node N120 and the gate (node N20b) of transistor 26, respectively. Switches S4a and S4b are connected between output node N121 and the drain (node N30a) of transistor 32 and between output node N121 and the drain (node N30b) of transistor 34. Capacitor 122a and switch S2a are series-connected between nodes N20a and N30a. Capacitor 122b and switch S2b are series-connected between nodes N20b and N30b. Switch S3a is connected between input node N120 and node 122a between capacitor 122a and switch S2a. Switch S3b is connected between input node N120 and node 122b between capacitor 122b and switch S2b. One electrodes of capacitors 126a and 126b are connected to respective nodes N30a and N30b and the other electrodes thereof receive reset signal /φR and a complementary signal φR thereof, respectively.

Figure 41:
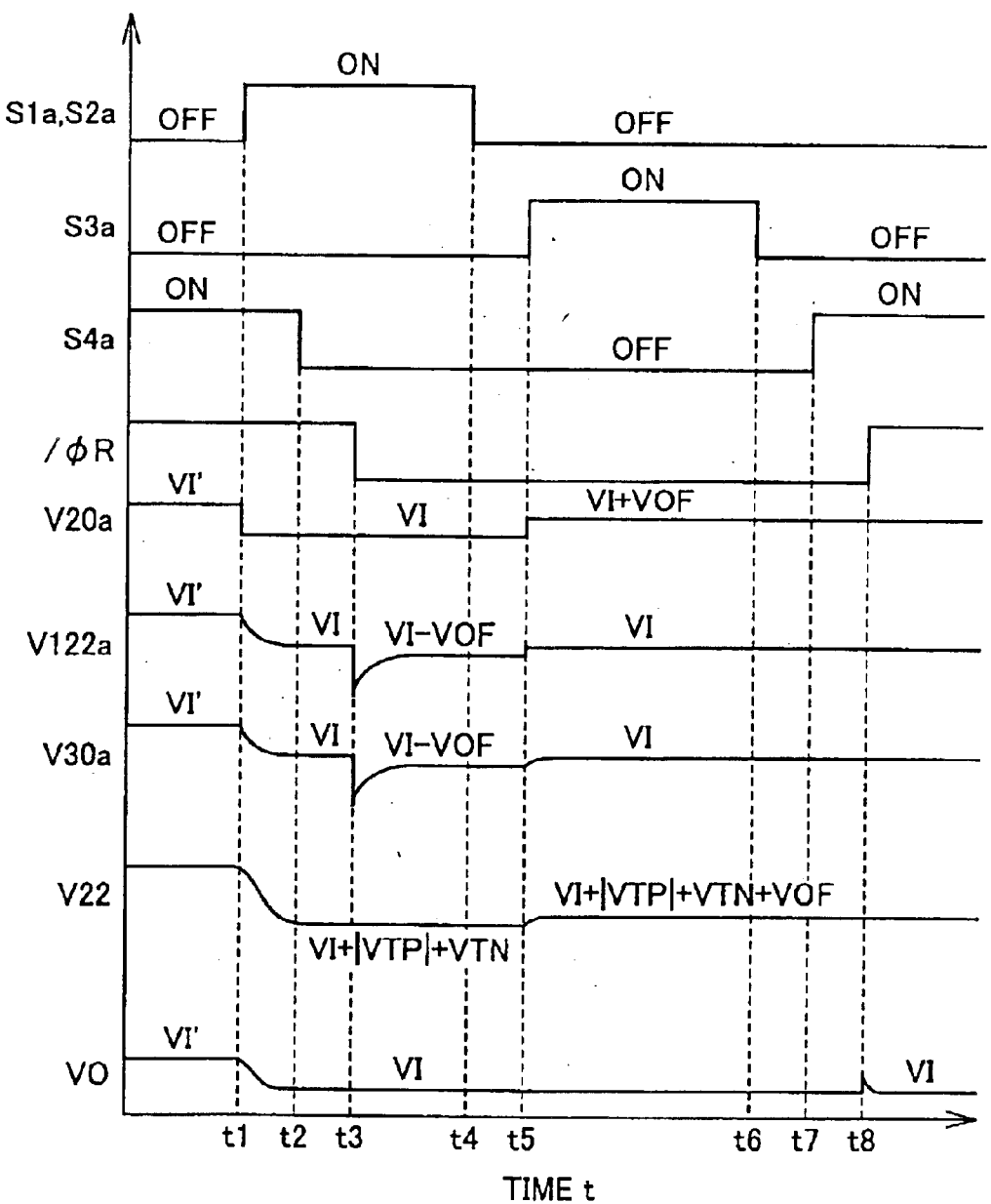
FIG. 41 is a time chart showing operations in the drive circuit with an offset compensation capability shown in FIG. 40.

FIG. 41 is a time chart showing operations in drive circuit with an offset compensation capability 125 shown in FIG. 40. Since a charge circuit constituted of constant current source 62 and transistors 23, 24, 31 and 32 and a discharge circuit constituted of constant current source 64 and transistors 26, 27, 34 and 35 perform similar operations, though there is a functional difference between charge and discharge, in FIG. 41, description will be given only of operations in the charge circuit. Now, it is assumed that there is an offset voltage VOFa on the charge circuit side since a threshold voltage VTN of N-type transistor 31 is larger than a threshold voltage VTN of an N-type transistor by VOFa, without offset voltage VOFb on the discharge circuit side.

In an initial state, not only are switches S1a to S3a caused to be in off state, but switch S4a is also caused to be in on state and nodes N20a, N122a, N30a and N121 are held at a potential VI' in the previous run. When, at time point t1, switches S1a and S2a are caused to be in on state, potentials V20a, V122a, V30a and VO of node N20a, N122a, N30a and N121 all become a potential equal to input potential VI. Potential V22 at node N22, becomes V22=VI+|VTP|+VTN. The reason why V20a, V122a, V30a and VO all take a potential equal to VI though a threshold voltage VTN' of N-type transistor 31 is higher than a threshold voltage VTN of N-type transistor 23 by VOFa is that while output node N121 is discharged down to input potential VI by the discharge circuit, it is not discharged further to a potential equal to or lower than input potential VI.

Then, at time point t2, switch S4a is caused to be in off state to disconnect electrically output node N30a of the charge circuit from output node N30b of the discharge circuit. Then, when, at time point t3, reset signal /φR is lowered from H level to L level, potentials V30a and V122a of nodes N30a and N122a are lowered by a prescribed voltage through capacitor 126a by capacitive coupling. Thereby, transistors 31 and 32 become conductive to raise potentials V30a and V122a of nodes N30a and N122a up to VI−VOFa and to thereby charge capacitor 122a to VOFa.

After potentials V30a and V122a of nodes N30a and N122a are stabilized, when, at time point t4, switches S1a and S2a are caused to be in off state and, at time point t5, switch S3a is further caused to be in on state, a potential VI+VOFa obtained by adding offset voltage VOFa to input potential VI is given to node N20a. Thereby, potential V22 at node N22 becomes V22=VI+|VTP|+VTN+VOFa and potentials V30a and V122a of nodes N30a and N122a take the same level as input potential VI.

While output potential V30a of the charge circuit becomes V30a=VI starting at time point t1, output potential V30a is only a potential held by wiring capacitance and others during a period from time point t1 to t2 and if noise of a negative polarity arises, V33a falls down to VI−VOFa. In contrast to this, after time point t5, V30a is maintained at VI since even if noise of a negative polarity arises, node 30a is charged by transistors 31 and 32.

When, at time point t6, switch S3a is caused to be in off state, and at time point t7, switch S4a is further caused to be in on state, load circuit 36 is driven by the drive circuit. When, at time point t8, reset signal /φR is raised to H level, the circuit is restored to the initial state. At time point t8, since output impedance is sufficiently low, almost no change occurs in output potential VO even if reset signal /φR is raised to H level. Similar operations are performed on the discharge circuit side and output potential VO is maintained at VI.

Figure 42:
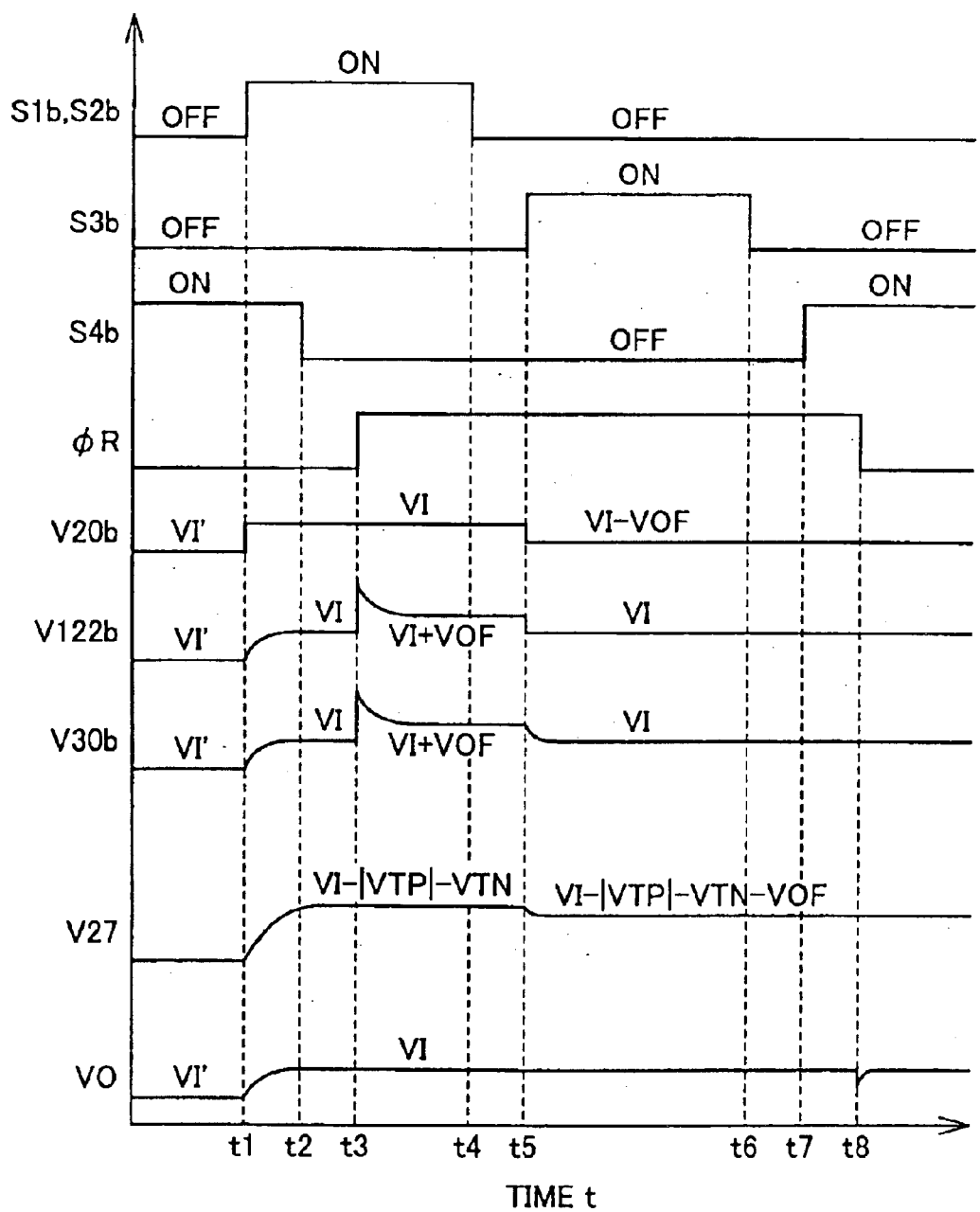
FIG. 42 is another time chart showing operations in the drive circuit with an offset compensation capability shown in FIG. 40.

FIG. 42 is another time chart showing operations in drive circuit with an offset compensation capability 125 shown in FIG. 40. Since a charge circuit constituted of constant current source 62 and transistors 23, 24, 31 and 32 and a discharge circuit constituted of constant current source 64 and transistors 26, 27, 34 and 35 perform similar operations, though there is a functional difference between charge and discharge, in FIG. 42, description will be given only of operations in the discharge circuit. Now, it is assumed that there is an offset voltage VOFb on the discharge circuit side since the absolute value |VTP'| of a threshold voltage of P-type transistor 35 is larger than the absolute value |VTP| of a threshold voltage of P-type transistor 27 by VOFb, without offset voltage VOFa on the charge circuit side.

In an initial state, not only are switches S1b to S3b caused to be in off state, but switch S4b is also caused to be in on state and nodes N20b, N122b, N30b and N121 are held at a potential VI' in the previous run. When, at time point t1, switches S1*b* and S2*b* are caused to be in on state, potentials V20*b*, V122*b*, V30*b* and VO of node N20*b*, N122*b*, N30*b* and N121 all become a potential equal to input potential VI. Potential V27 of node N27 becomes V27=VI−|VTP|−VTN. The reason why V20*b*, V122*b*, V30*b* and VO all take a potential equal to VI though the absolute value |VTP'| of a threshold voltage of P-type transistor 35 is higher than the absolute value |VTP| of a threshold voltage of P-type transistor 27 by VOFb is that while output node N121 is charged up to input potential VI by the charge circuit, it is not charged further to a potential equal to or higher than input potential VI.

Then, at time point t2, switch S4*b* is caused to be in off state to disconnect electrically output node N30*a* of the charge circuit from output node N30*b* of the discharge circuit. Then, when, at time point t3, reset signal φR is raised from L level to H level, potentials V30*b* and V122*b* at nodes N30*b* and N122*b* are raised by a prescribed voltage through capacitor 126*b* by capacitive coupling. Thereby, transistors 34 and 35 become conductive to lower potentials V30*b* and V122*b* of nodes N30*b* and N122*b* to VI+VOFb and to thereby charge capacitor 122*b* to VOFb.

After potentials V30*b* and V122*b* of nodes N30*b* and N122*b* are stabilized, when, at time point t4, switches S1*b* and S2*b* are caused to be in off state and, at time point t5, switch S3*b* is further caused to be in on state, a potential VI−VOFb obtained by subtracting offset voltage VOFb from input potential VI is given to node N20*b*. Thereby, potential V27 of node N27 becomes V27=VI−VTN−|VTP|−VOFb and potentials V30*b* and V122*b* of nodes N30*b* and N122*b* take the same level as input potential VI.

While output potential V30*b* of the discharge circuit is V30*b*=VI starting at time point t1, output potential V30*b* is only a potential held by wiring capacitance and others during a period from time point t1 to t2 and if noise of a positive polarity arises, V33*b* rises up to VI+VOFb. In contrast to this, after time point t5, V30*b* is maintained at VI since even if noise of a positive polarity arises, node 30*b* is discharged by transistors 34 and 35.

When, at time point t6, switch S3*b* is caused to be in off state, and at time point t7, switch S4*a* is further caused to be in on state, load circuit 36 is driven by the drive circuit. When, at time point t8, reset signal φR is lowered to L level, the circuit is restored to the initial state. At time point t8, since output impedance is low, almost no change occurs in output potential VO even if reset signal φR is lowered to L level. Similar operations are performed on the charge circuit side and output potential VO is maintained at VI.

Figure 43:
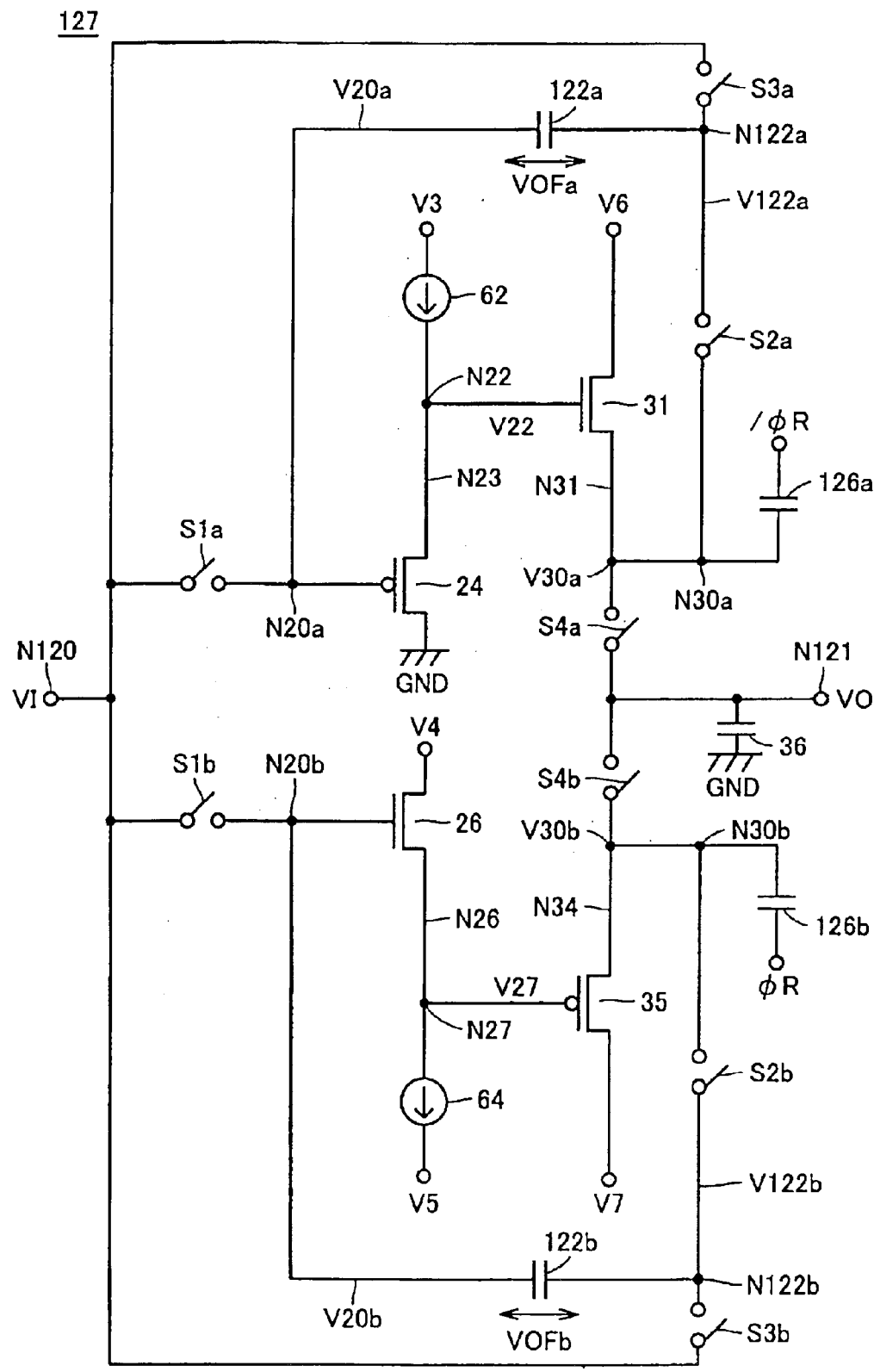
FIG. 43 is a circuit diagram showing an example modification of the thirteenth embodiment.

Description will be given of various example modifications of the thirteenth embodiment below. Drive circuit with an offset compensation capability 127 of FIG. 43 is of a configuration obtained by removing N-type transistors 23 ad 34 and P-type transistors 27 and 32 from drive circuit with an offset compensation capability 125 of FIG. 40. In this example modification, an occupancy area of the circuit is reduced.

Figure 44:
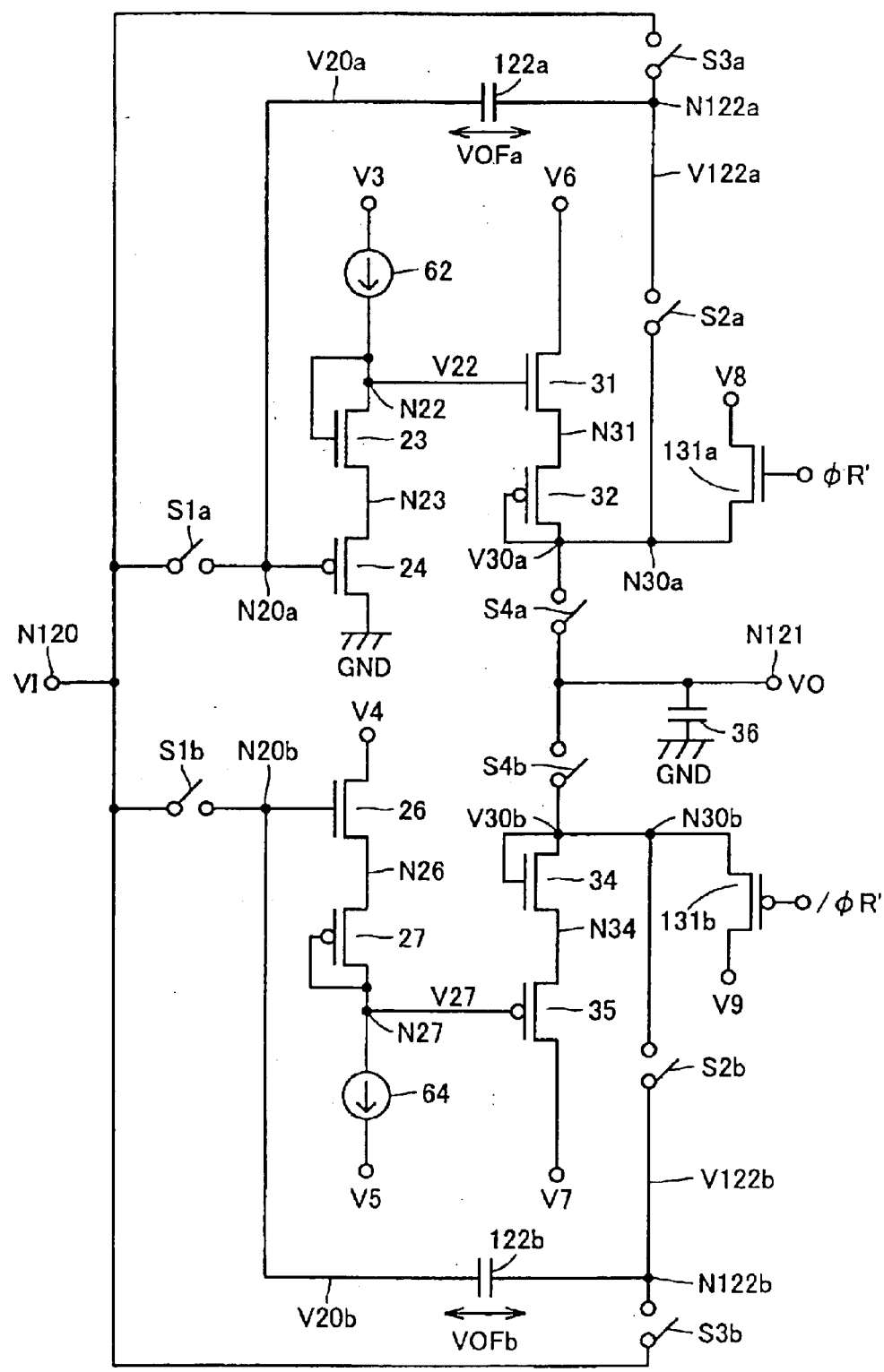
FIG. 44 is a circuit diagram showing another example modification of the thirteenth embodiment.

Drive circuit with an offset compensation capability 130 of FIG. 44 is of a configuration obtained by replacing capacitors 126*a* and 126*b* of drive circuit with an offset compensation capability 125 of FIG. 40 with N-type transistor 131*a* and P-type transistor 131*b*, respectively. N-type transistor 131*a* is connected between a line of eighth power supply potential V8 and node N30*a* and receives reset signal φR' at the gate thereof. P-type transistor 131*b* is connected between node N30*b* and a line of ninth power supply potential and receives a complementary signal /φR' of reset signal φR' at the gate thereof.

In an ordinary mode, signals φR' and /φR' are at L and H levels, respectively and N-type transistor 131*a* and P-type transistor 131*b* are both non-conductive. At time point t4 of FIGS. 41 and 42, not only is signal φR' set pulsewise to H level for a prescribed time, but signal /φR' is also set pulsewise to L level for the prescribed time. By doing so, not only does N-type transistor 131*a* become pulsewise conductive to lower potential V30*a* at node N30*a* to eighth power supply potential V8, but P-type transistor 131*b* also becomes pulsewise conductive to raise potential V30*b* at node N30*b* to ninth power supply potential V9. Thereafter, in a case described in FIG. 41, node 30*a* is charged to VI−VOF, while in a case described in FIG. 42, node N30*b* is discharged to VO+VOF. In this example modification, there is no chance to generate noise in output potential VO even at time point t8 of FIGS. 41 and 42. Note that a pulse width of signals φR' and /φR' is set to the minimum necessary value.

Figure 45:
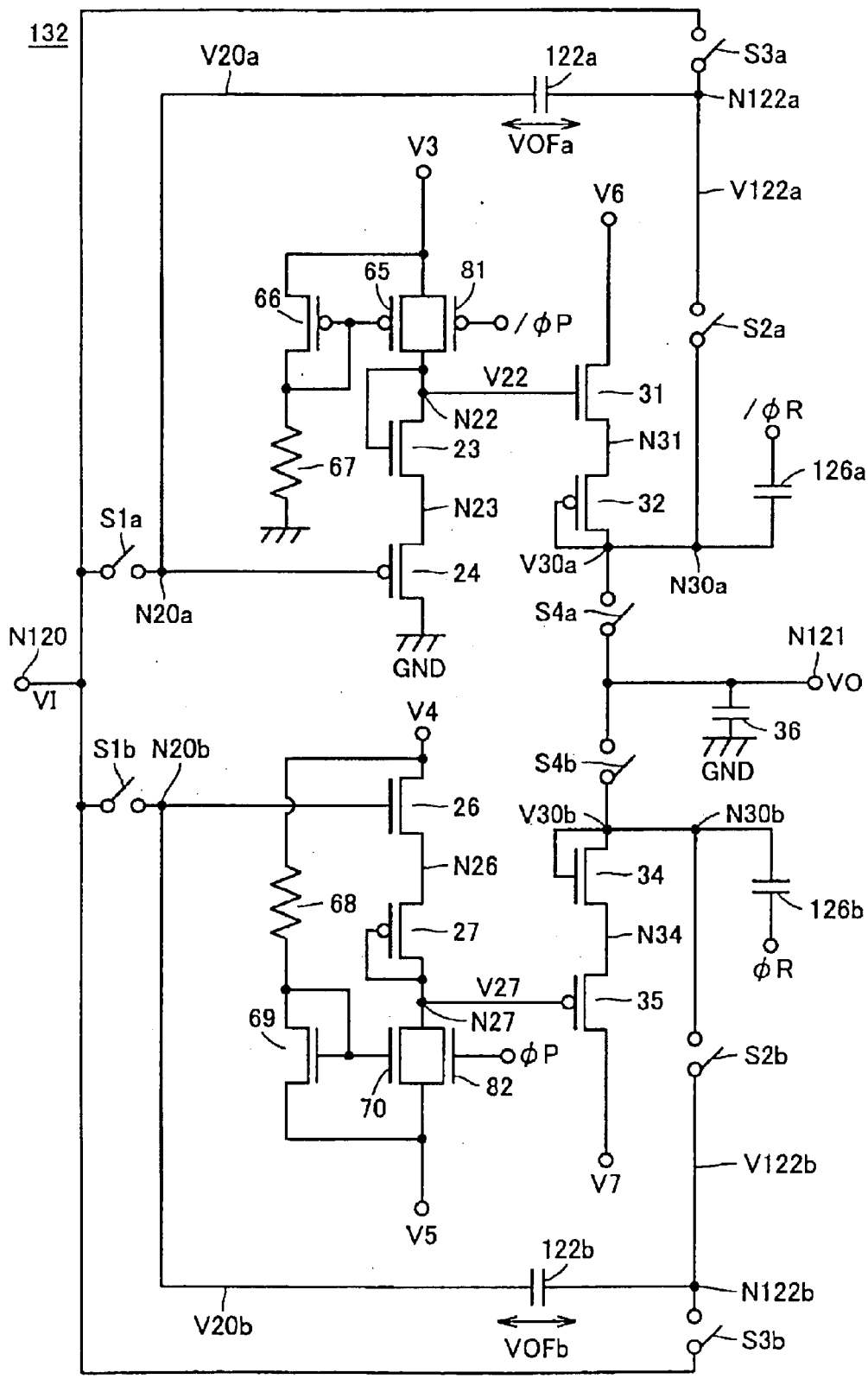
FIG. 45 is a circuit diagram showing still another example modification of the thirteenth embodiment.

Drive circuit with an offset compensation capability 132 of FIG. 45 is of a configuration obtained by adding an offset compensation circuit constituted of capacitors 122*a*, 122*b*, 126*a* and 126*b* and switches S1*a* to S4*a* and S1*b* to S4*b* to drive circuit 80 of FIG. 25; In a period from time point t1 to time point t2 of FIGS. 41 and 42, not only is signal /φP set pulsewise to L level, but signal φP is also set to H level. In this example modification, since potentials V22 and V27 at nodes N22 and N27 reach prescribed values rapidly, thereby enabling a high operating speed to be realized.

Figure 46:
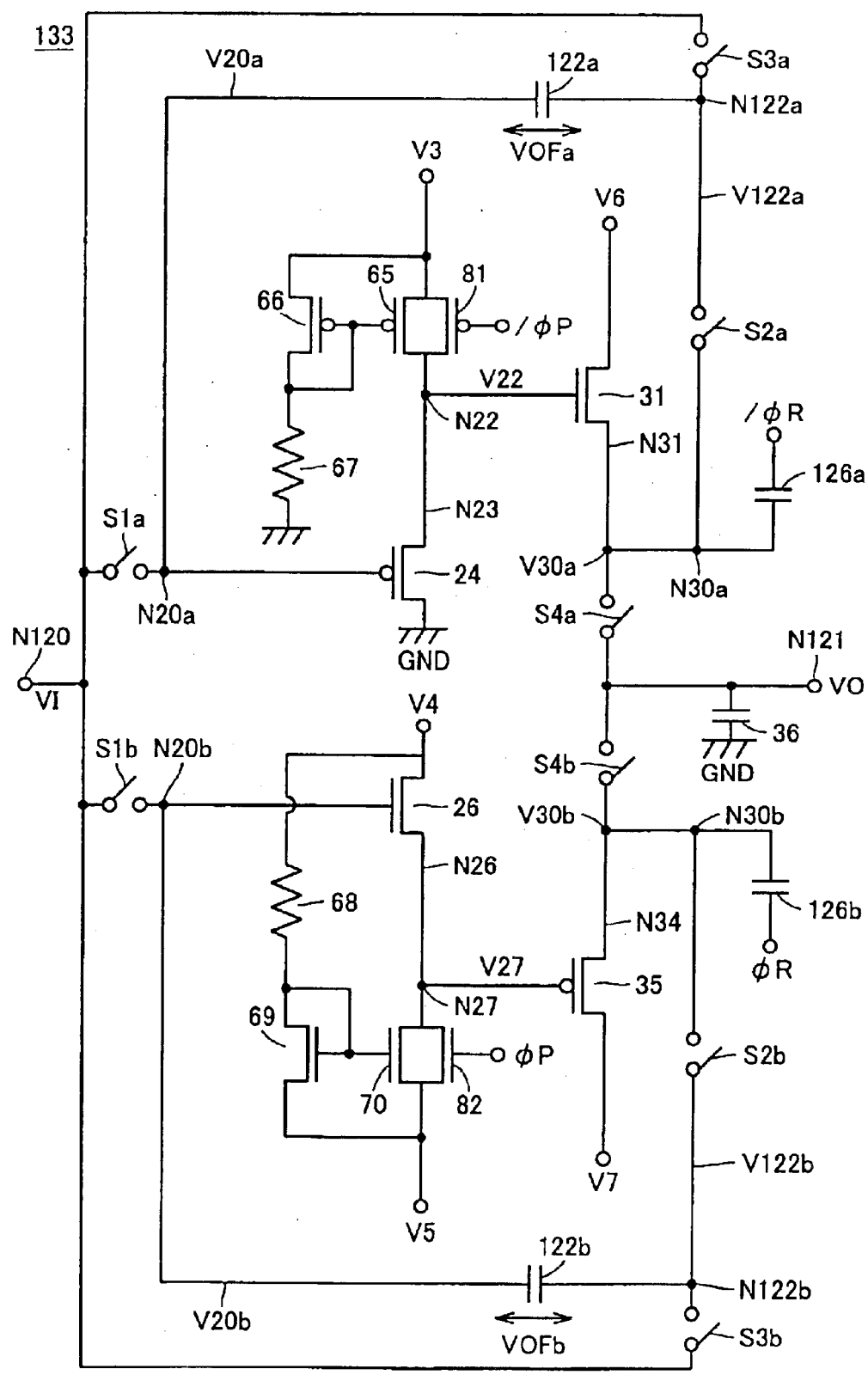
FIG. 46 is a circuit diagram showing still another example modification of the thirteenth embodiment.

Drive circuit with an offset compensation capability 133 of FIG. 46 is of a configuration obtained by removing N-type transistors 23 and 34 and P-type transistors 27 and 32 from drive circuit with an offset compensation capability 132 of FIG. 45. In this example modification, an occupancy area of the circuit is reduced.

Figure 47:
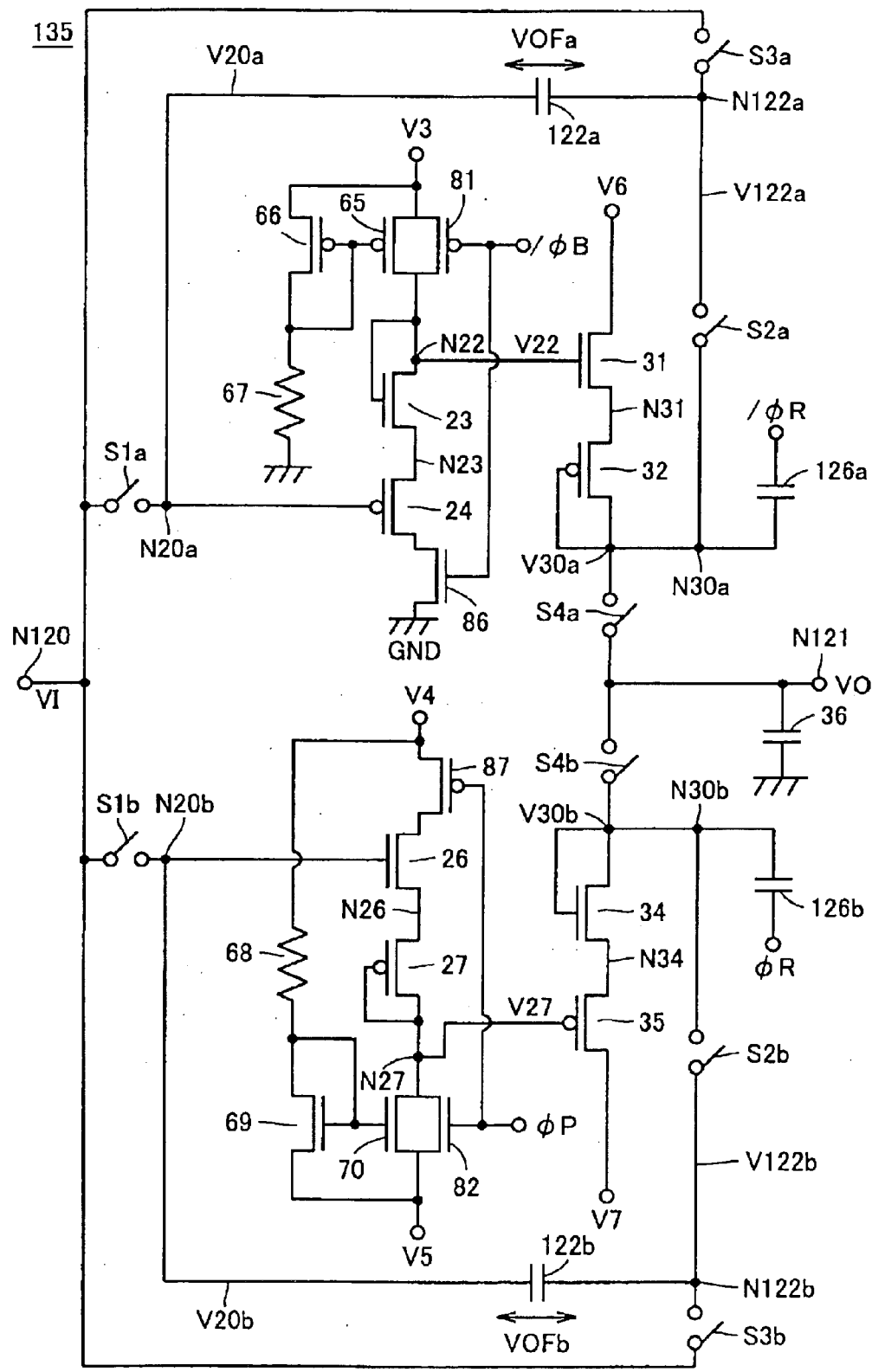
FIG. 47 is a circuit diagram showing still another example modification of the thirteenth embodiment.

A drive circuit with an offset compensation capability 135 of FIG. 47 is of a configuration obtained by adding an offset compensation circuit constituted of capacitors 122*a*, 122*b*, 126*a* and 126*b*, and switches S1*a* to S4*a* and S1*b* to S4*b* to drive circuit with an offset compensation capability 85 of FIG. 27. In this example modification, since when signals /φP and φP are set to L and H levels, respectively, to cause transistors 81 and 82 to be conductive, transistors 86 and 87 both become non-conductive, flowing of a through-current can be prevented to thereby reduce current consumption.

Figure 48:
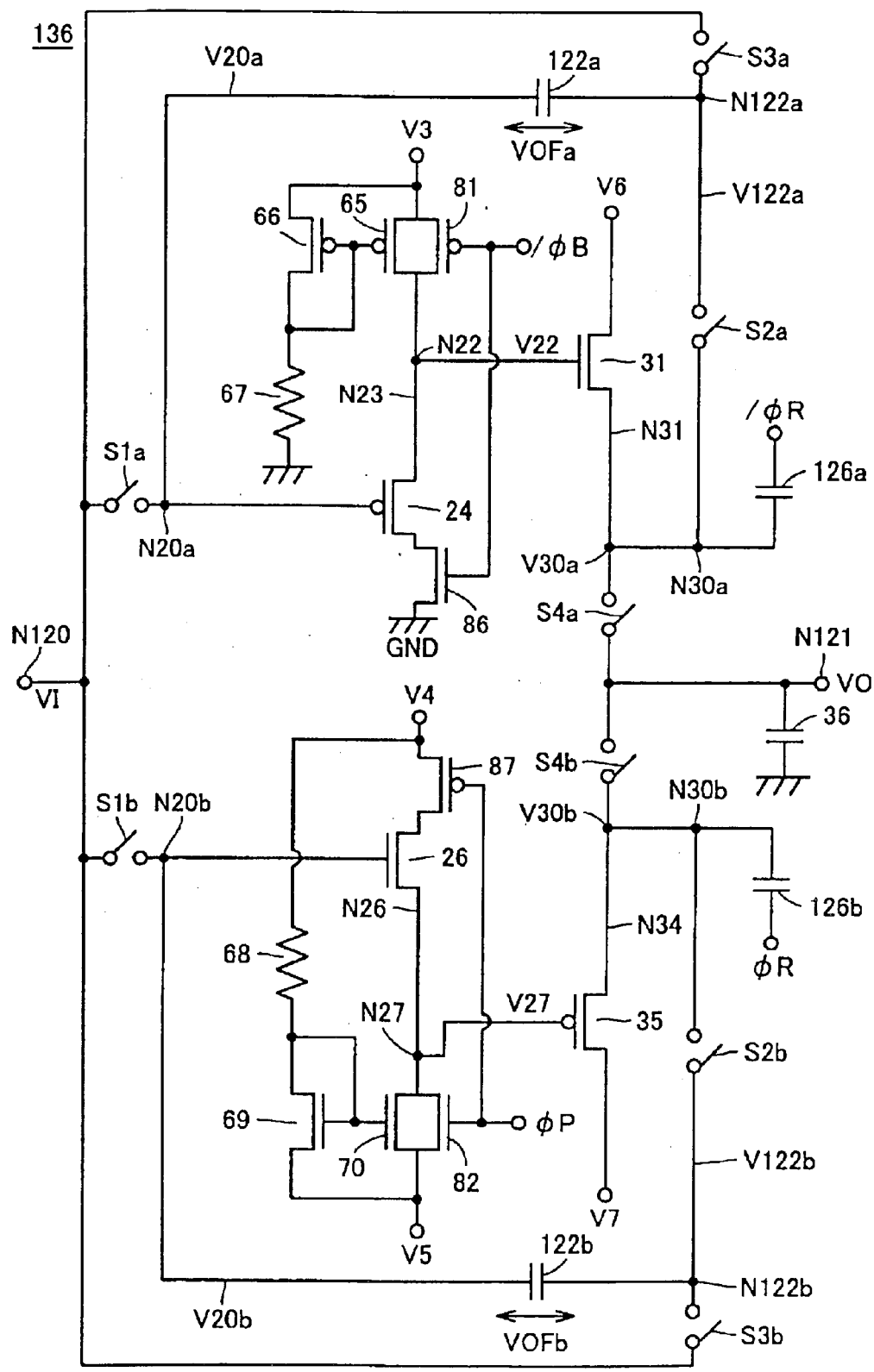
FIG. 48 is a circuit diagram showing still another example modification of the thirteenth embodiment.

A drive circuit with an offset compensation capability 136 of FIG. 48 is of a configuration obtained by removing N-type transistors 23 and 34 and P-type transistors 27 and 32 from drive circuit with an offset compensation capability 135 of FIG. 47. In this example modification, an occupancy area of the circuit is reduced.

Figure 49:
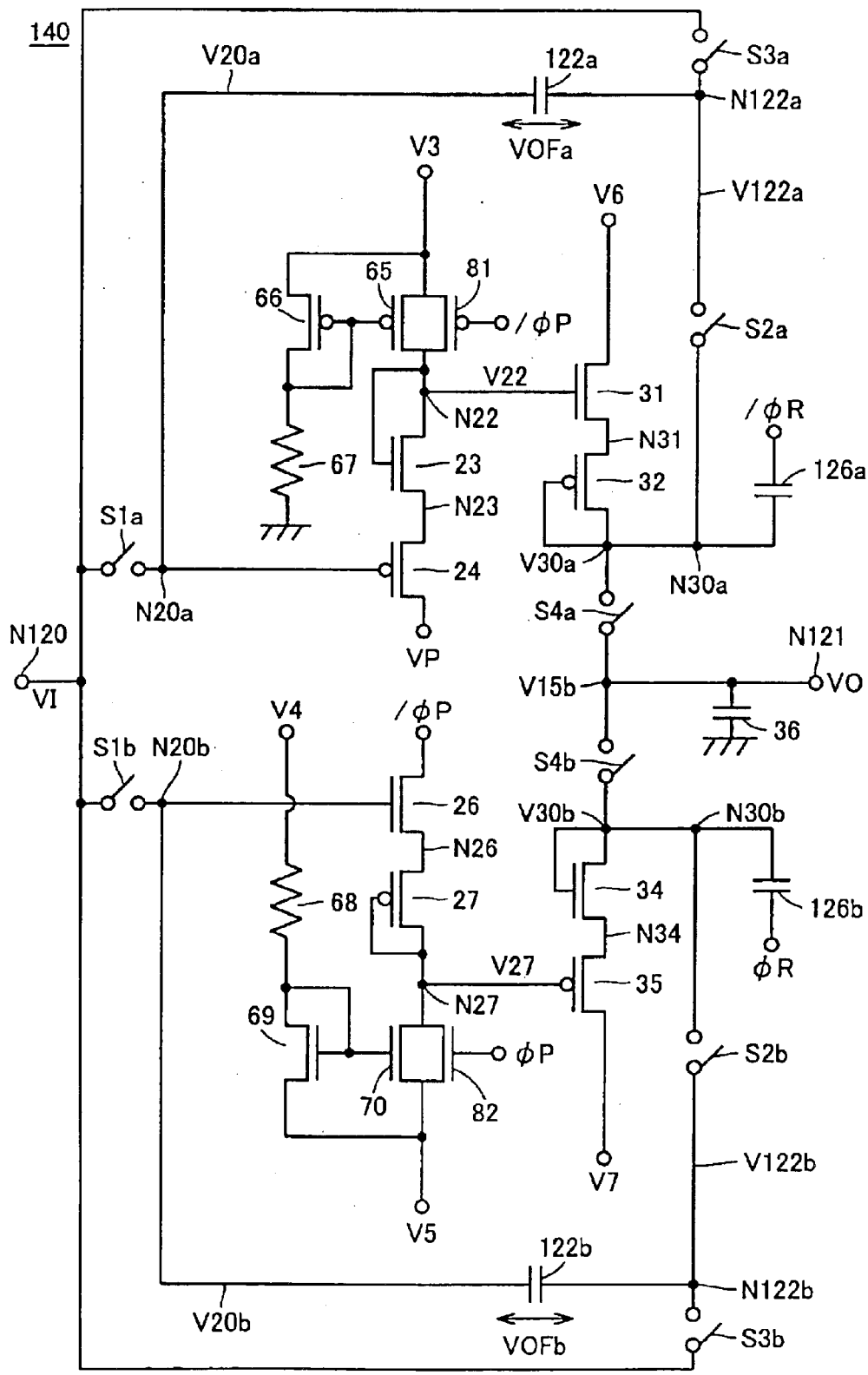
FIG. 49 is a circuit diagram showing still another example modification of the thirteenth embodiment.

A drive circuit with an offset compensation capability 140 of FIG. 49 is of a configuration obtained by adding an offset compensation circuit constituted of capacitors 122*a*, 122*b*, 126*a* and 126*b*, and switches S1*a* to S4*a* and S1*b* to S4*b* to drive circuit 90 of FIG. 29. In this example modification, since when signal /φP is set to L level to cause P-type transistor 81 to be conductive, the drain of P-type transistor 24 is driven to H level, and when signal φP is set to H level to cause N-type transistor 82 to be conductive, the drain of N-type transistor 26 is driven to L level, flowing of a through-current can be prevented to thereby reduce current consumption.

Figure 50:
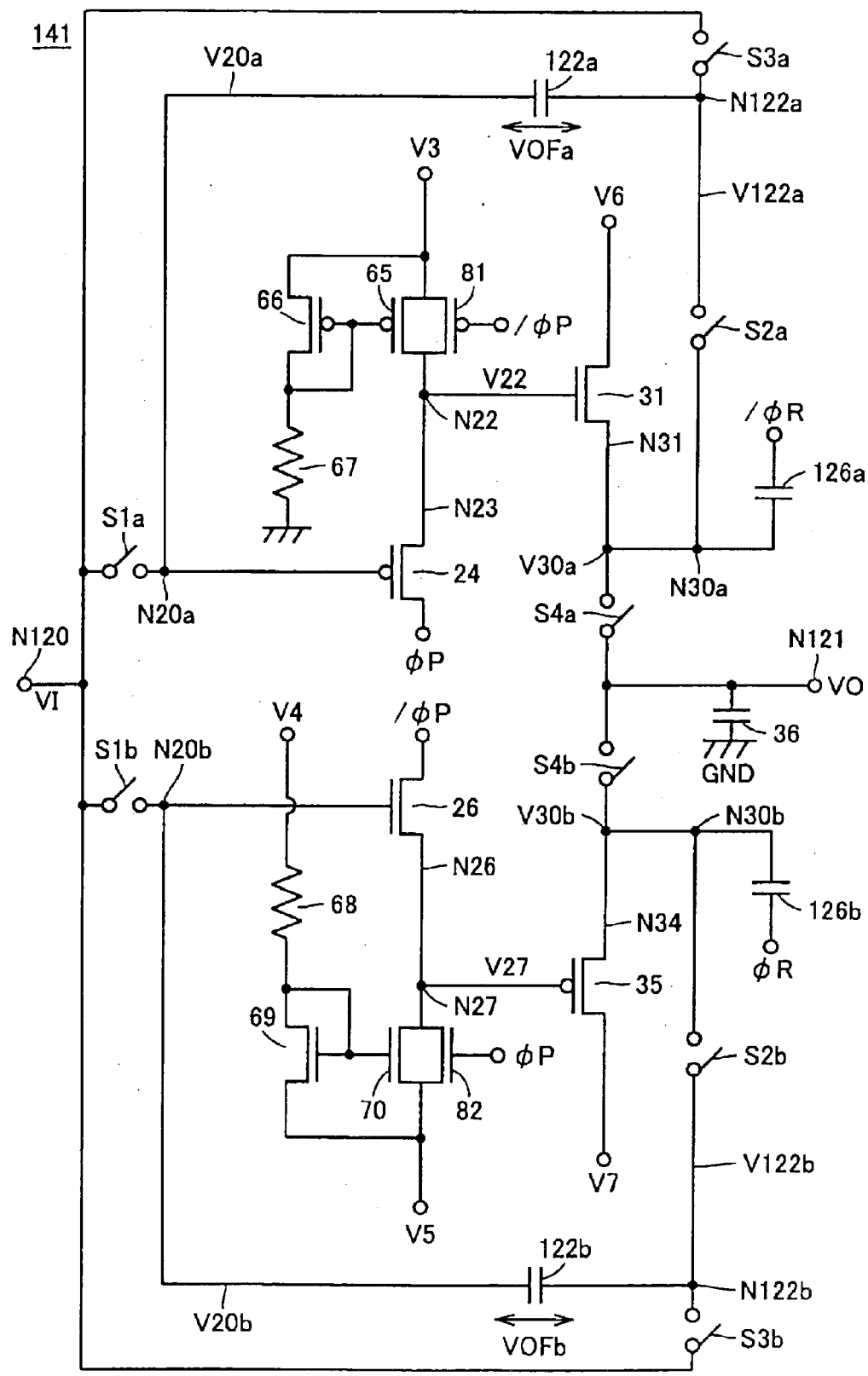
FIG. 50 is a circuit diagram showing still another example modification of the thirteenth embodiment.

A drive circuit with an offset compensation capability 141 of FIG. 50 is of a configuration obtained by removing N-type transistors 23 and 34 and P-type transistors 27 and 32 from drive circuit with an offset compensation capability 140 of FIG. 49. In this example modification, an occupancy area of the circuit is reduced.

Figure 51:
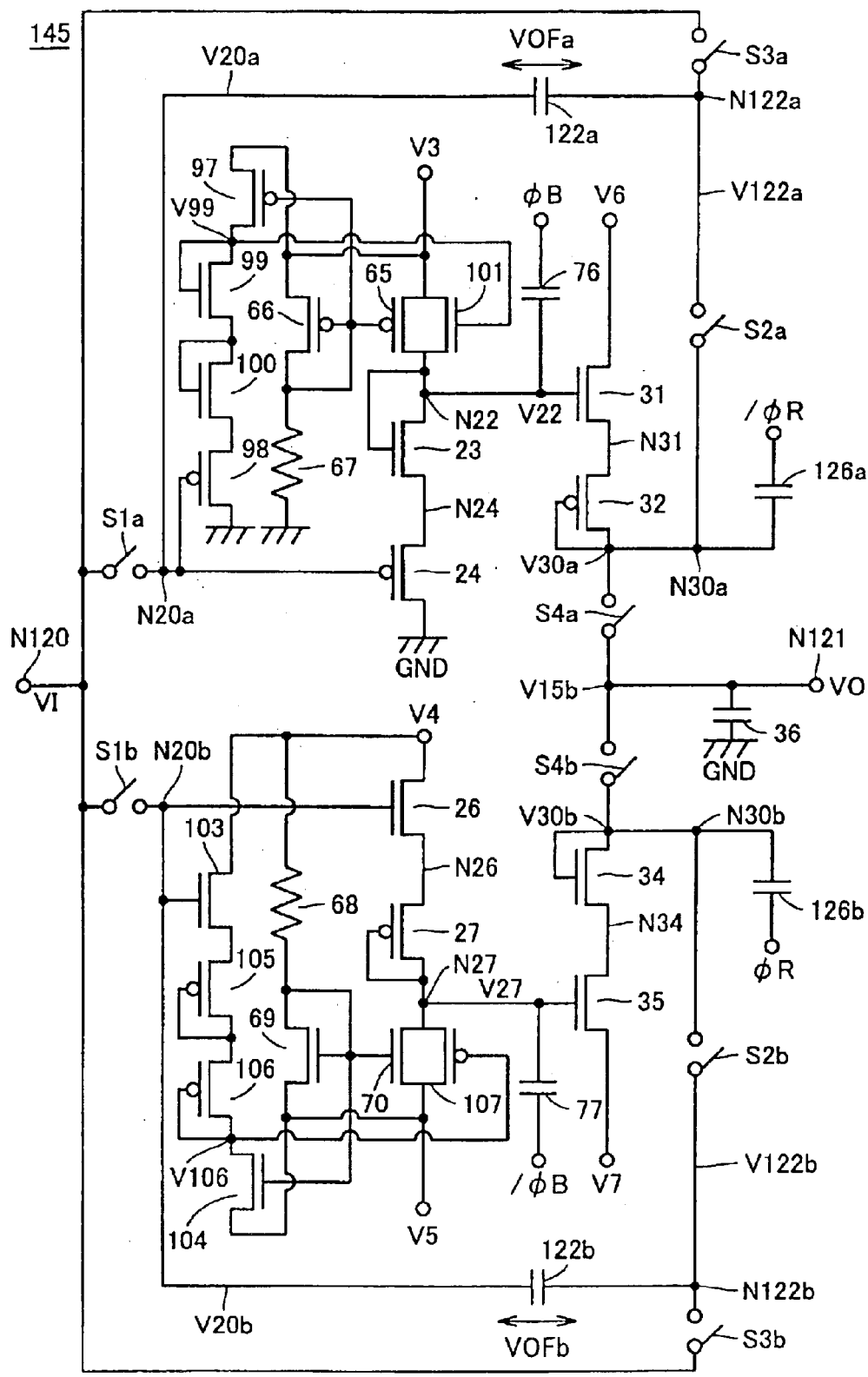
FIG. 51 is a circuit diagram showing still another example modification of the thirteenth embodiment.

A drive circuit with an offset compensation capability 145 of FIG. 51 is of a configuration obtained by adding an offset compensation circuit constituted of capacitors 122a, 122b, 126a and 126b, and switches S1a to S4a and S1b to S4b to drive circuit with an offset compensation capability 95 of FIG. 31. In a period from time point t1 to time point t2 of FIGS. 41 and 42, not only is signal /φB set pulsewise to H level, but signal φB is also set pulsewise to L level. In this example modification, since potentials V22 and V27 at nodes N22 and N27 reach prescribed values rapidly, thereby enabling a high operating speed to realized.

Figure 52:
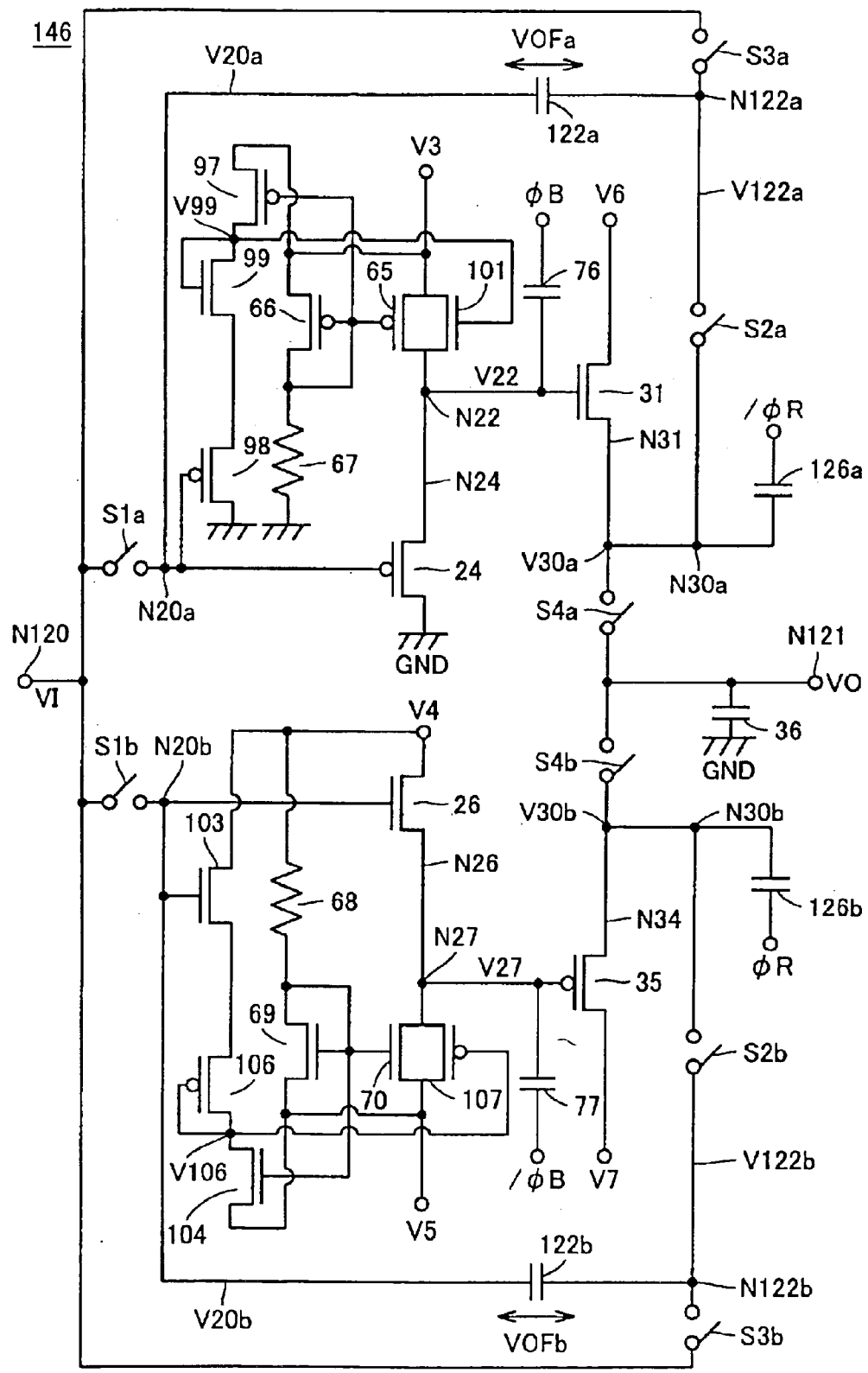
FIG. 52 is a circuit diagram showing still another example modification of the thirteenth embodiment.

A drive circuit with an offset compensation capability 146 of FIG. 52 is of a configuration obtained by removing N-type transistors 23, 34 and 100 and P-type transistors 27, 32 and 105 from drive circuit with an offset compensation capability 145 of FIG. 51. In this example modification, an occupancy area of the circuit is reduced.

Figure 53:
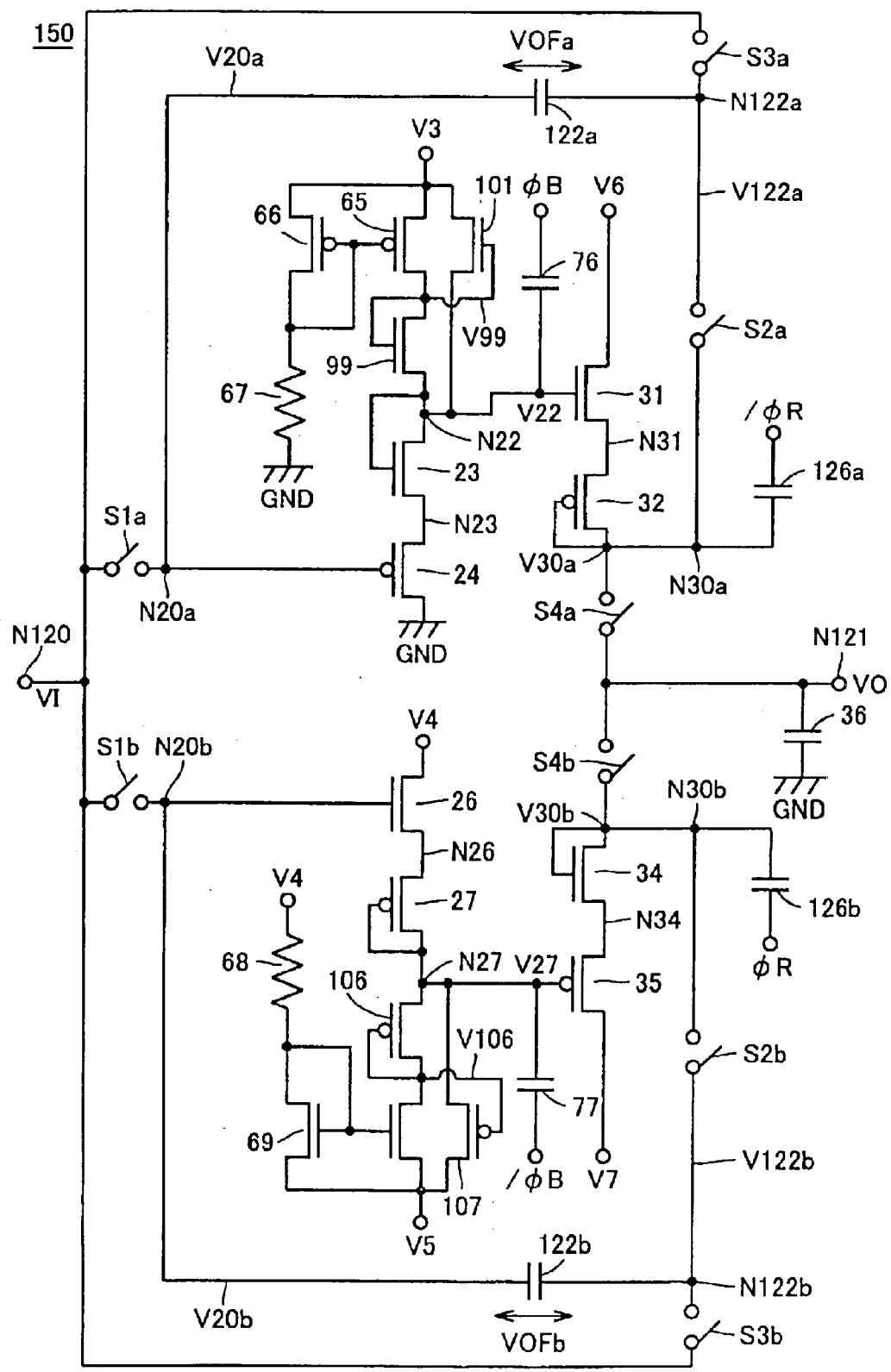
FIG. 53 is a circuit diagram showing still another example modification of the thirteenth embodiment.

A drive circuit with an offset compensation capability 150 of FIG. 53 is of a configuration obtained by adding an offset compensation circuit constituted of capacitors 122a, 122b, 126a and 126b, and switches S1a to S4a and S1b to S4b to drive circuit 110 of FIG. 34. In a period from time point t1 to time point t2 of FIGS. 41 and 42, not only is signal /φB set pulsewise to H level, but signal φB is also set pulsewise to L level. In this example modification, since potentials V22 and V27 at nodes N22 and N27 reach prescribed values rapidly, thereby enabling a high operating speed to be realized.

Figure 54:
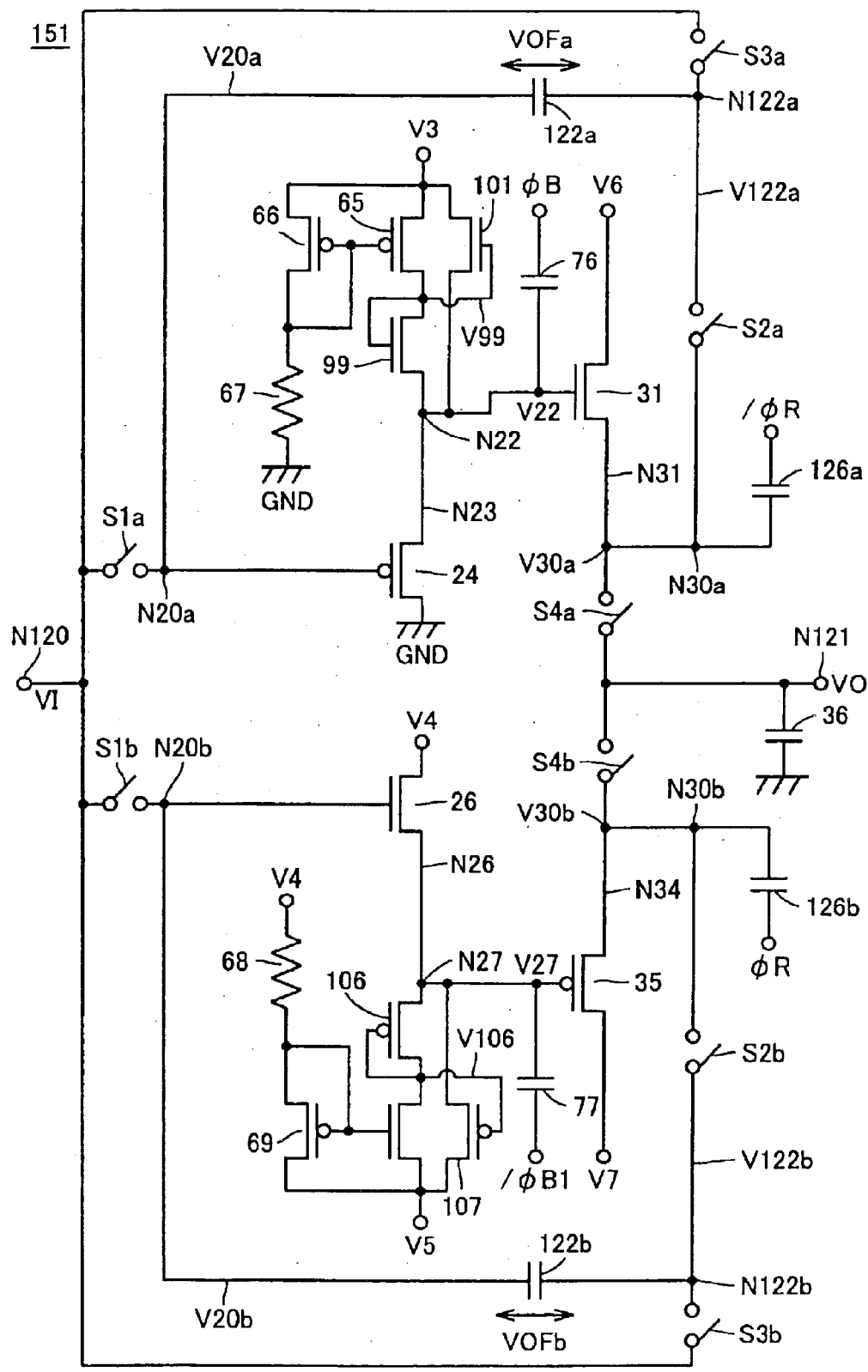
FIG. 54 is a circuit diagram showing still another example modification of the thirteenth embodiment.

A drive circuit with an offset compensation capability 151 of FIG. 54 is of a configuration obtained by removing N-type transistors 23 and 34 and P-type transistors 27 and 32 from drive circuit with an offset compensation capability 150 of FIG. 53. In this example modification, an occupancy area of the circuit is reduced.

Fourteenth Embodiment

Figure 55:
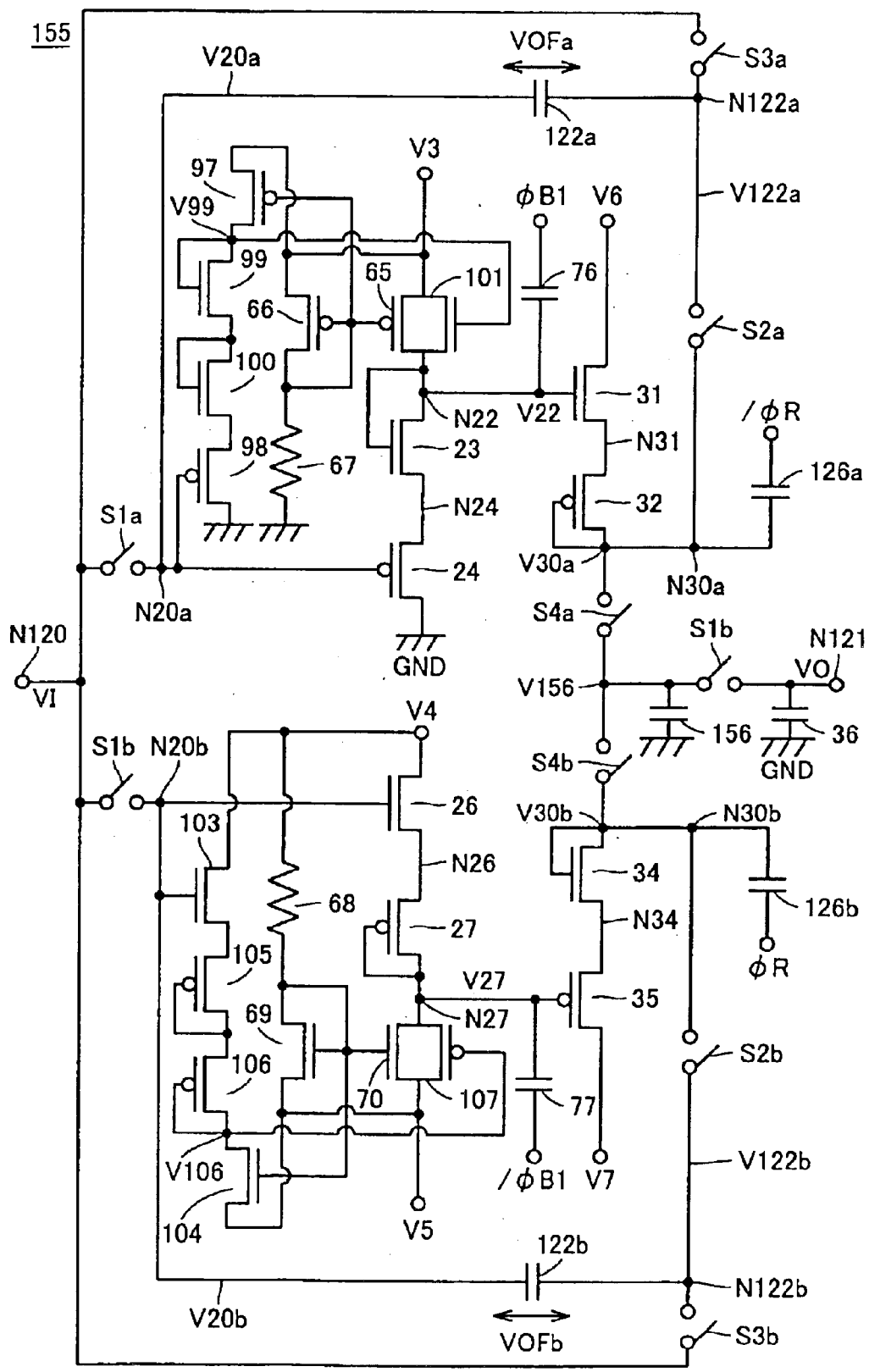
FIG. 55 is a circuit block diagram showing a configuration of a drive circuit with an offset compensation capability according to a fourteenth embodiment of the present invention.

FIG. 55 is a circuit block diagram showing a configuration of a drive circuit with an offset compensation capability 155 according to a fourteenth embodiment of the present invention. In FIG. 55, drive circuit with an offset compensation capability 155 is different from drive circuit with an offset compensation capability 145 of FIG. 51 in that a switch S5 and a capacitor 156 are added and step-up signal φB and /φB are replaced with respective step signals φB1 and /φB1.

Switch S5 is connected between a node between switches S4a and S4b, and output node N121. Capacitor 156 is connected between a node between switches S4a and S4b, and a line of ground potential GND. A capacitance value of capacitor 156 is set smaller than a capacitance value of a load capacitance 36.

Figure 56:
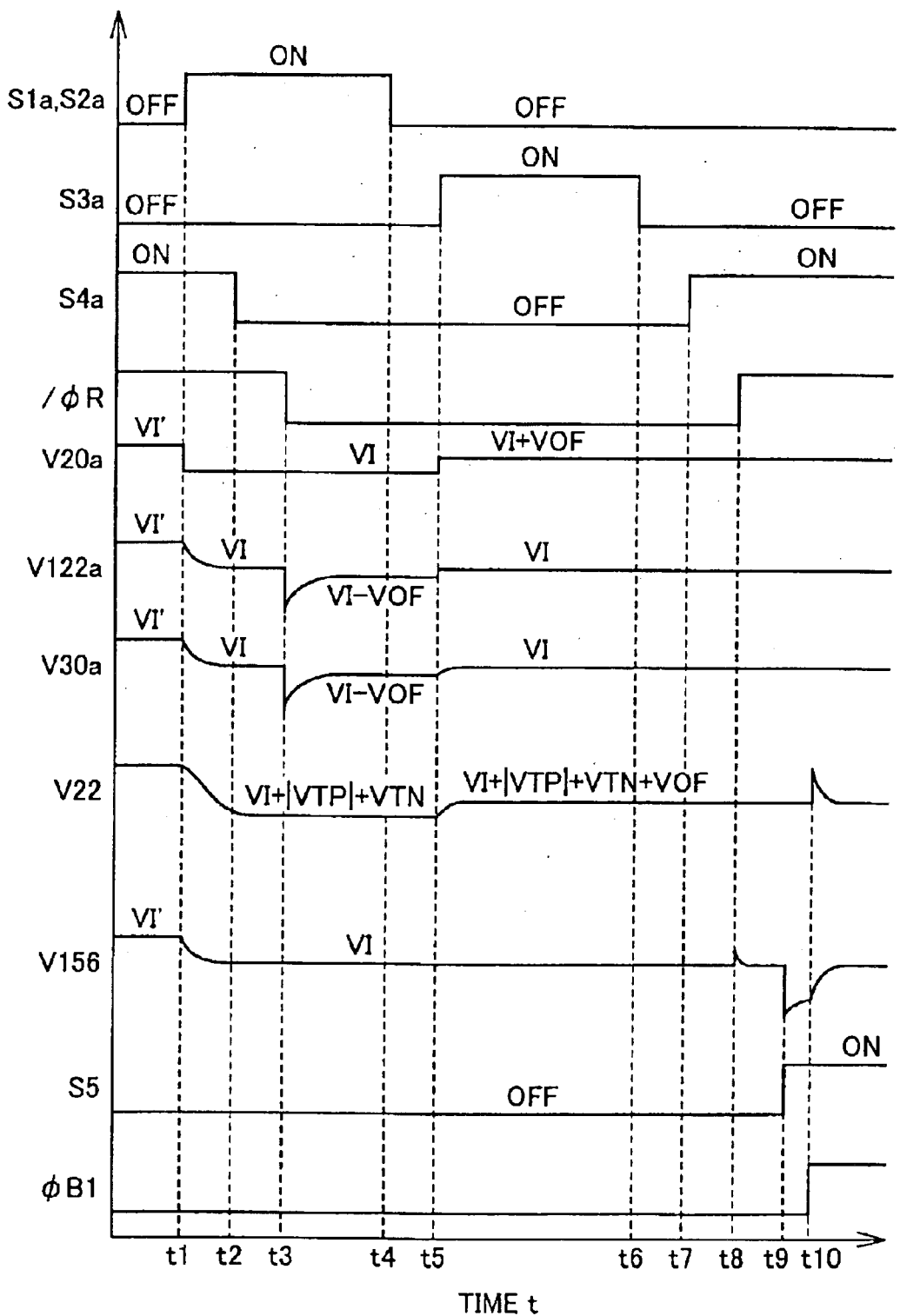
FIG. 56 is a time chart showing operations in the drive circuit with an offset compensation capability shown in FIG. 55.

FIG. 56 is a time chart showing operations in drive circuit with an offset compensation capability 155 shown in FIG. 55, which is compared with FIG. 41. Here, too, description will be given of operations in the charge circuit side. Referring to FIG. 56, since switch S5 is held in off state and load circuit 36 is electrically disconnected till time point 9, potentials V22, V30a and V122a reach input potential VI rapidly, for example, in a period from time point t1 to time point t2.

When, at time point t9, switch S5 is turned on, potential V156 between switches S4a and S4b alters according to potential VO on a data line connected to output node N121. In FIG. 56, there is shown a case where potential VO on the data line is lower than V156 and after potential V156 falls at time point t9, a current is supplied to the node by transistors 31 and 32 to raise potential V156 gradually. Then, at time point t10, signal φB1 is raised from L level to H level to raise potential V22 at node N22 pulsewise, to thereby, increase a current flowing in N transistor 31 and to cause potential V156=VO to reach input potential VI rapidly.

Figure 57:
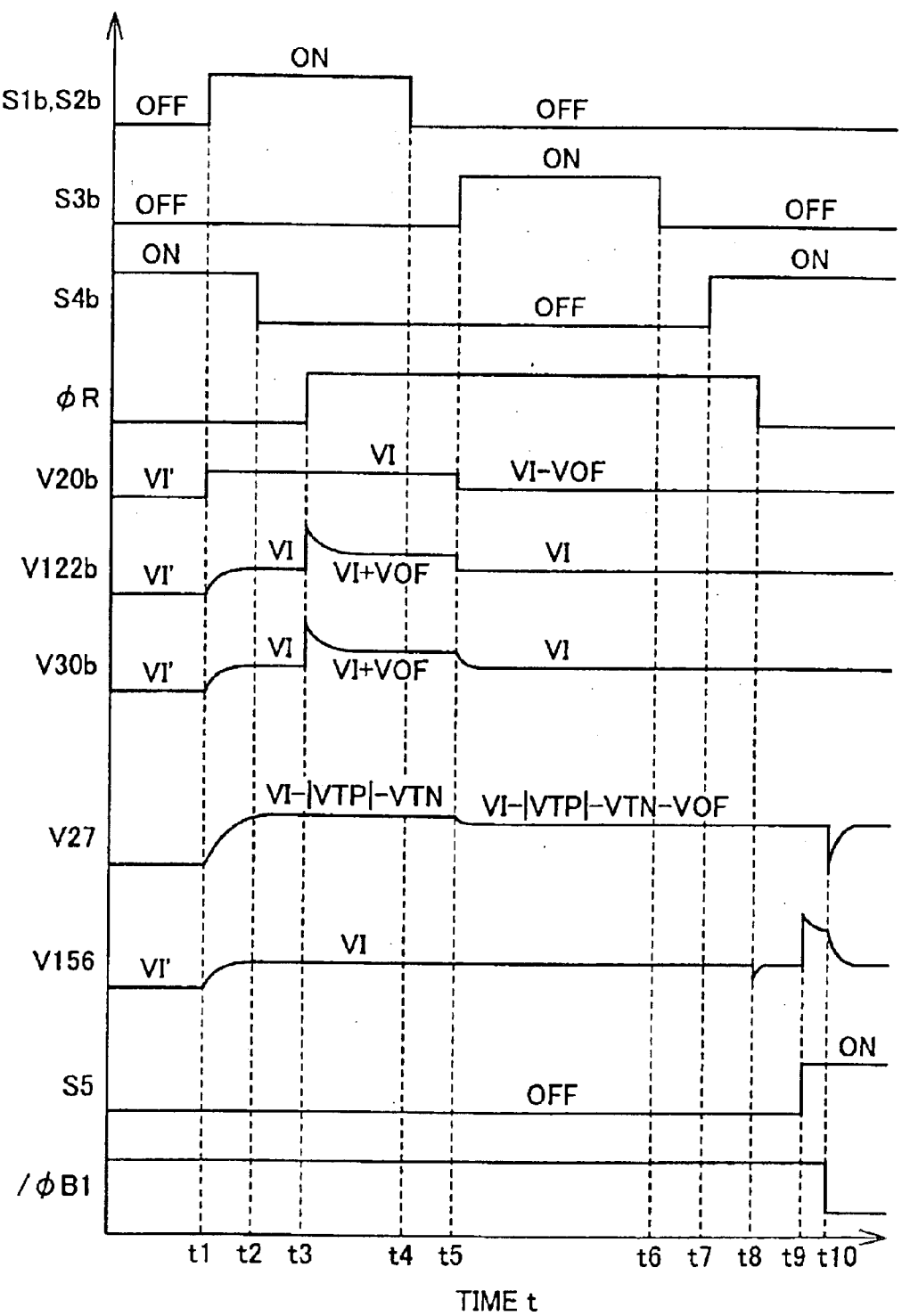
FIG. 57 is another time chart showing operations in the drive circuit with an offset compensation capability shown in FIG. 55.

FIG. 57 is another time chart showing operations in drive circuit with an offset compensation capability 155 shown in FIG. 55, which is compared with FIG. 42. Here, too, description will be given only of operations in the discharge circuit side. Referring to FIG. 57, since switch S5 is held in off state and load capacitance 36 is electrically disconnected till time point t9, potentials V27, V30b and V122b reach to input potential VI rapidly, for example, in a period from time point t1 to time point t2.

When, at time point t9, switch S5 is tuned on, potential V156 between switches S4a and S4b alters according to potential VO on a data line connected to output node N121. In FIG. 57, there is shown a case where potential VO on the data line is higher than V156 and after potential V156 rises at time point t9, a current is caused to flow out by transistors 34 and 35 to lower potential V156 gradually.

Then, at time point t10, signal /φB1 is lowered from H level to L level to lower potential V27 at node N27 pulsewise, to increase a current flowing in P-type transistor 35 and to cause potential V156=VO to reach input potential VI rapidly.

In the fourteenth embodiment, even in a case where a capacitance value of load capacitance 36 is large, a high operating speed can be attained.

Fifteenth Embodiment

Figure 58:
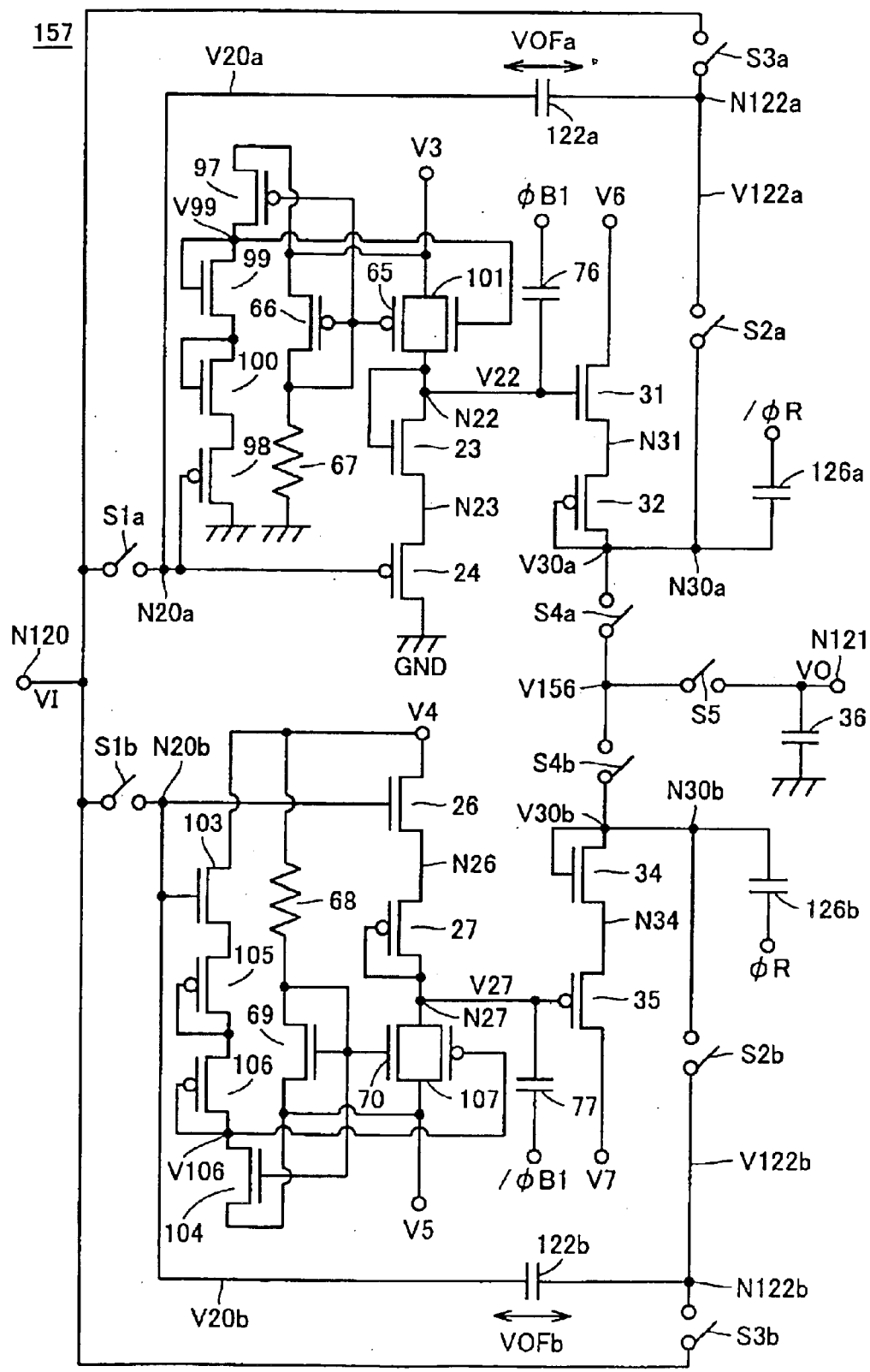
FIG. 58 is a circuit block diagram showing a configuration of a drive circuit with an offset compensation capability according to a fifteenth embodiment of the present invention.

FIG. 58 is a circuit diagram showing a configuration of a drive circuit with an offset compensation capability 157 according to a fifteenth embodiment of the present invention. Referring to FIG. 58, drive circuit with an offset compensation capability 157 is different from drive circuit with an offset compensation capability 155 of FIG. 55 in respect to removal of capacitor 156, on/of timings of switch S5 and timings of level change of signals φB1 and φB1.

Figure 59:
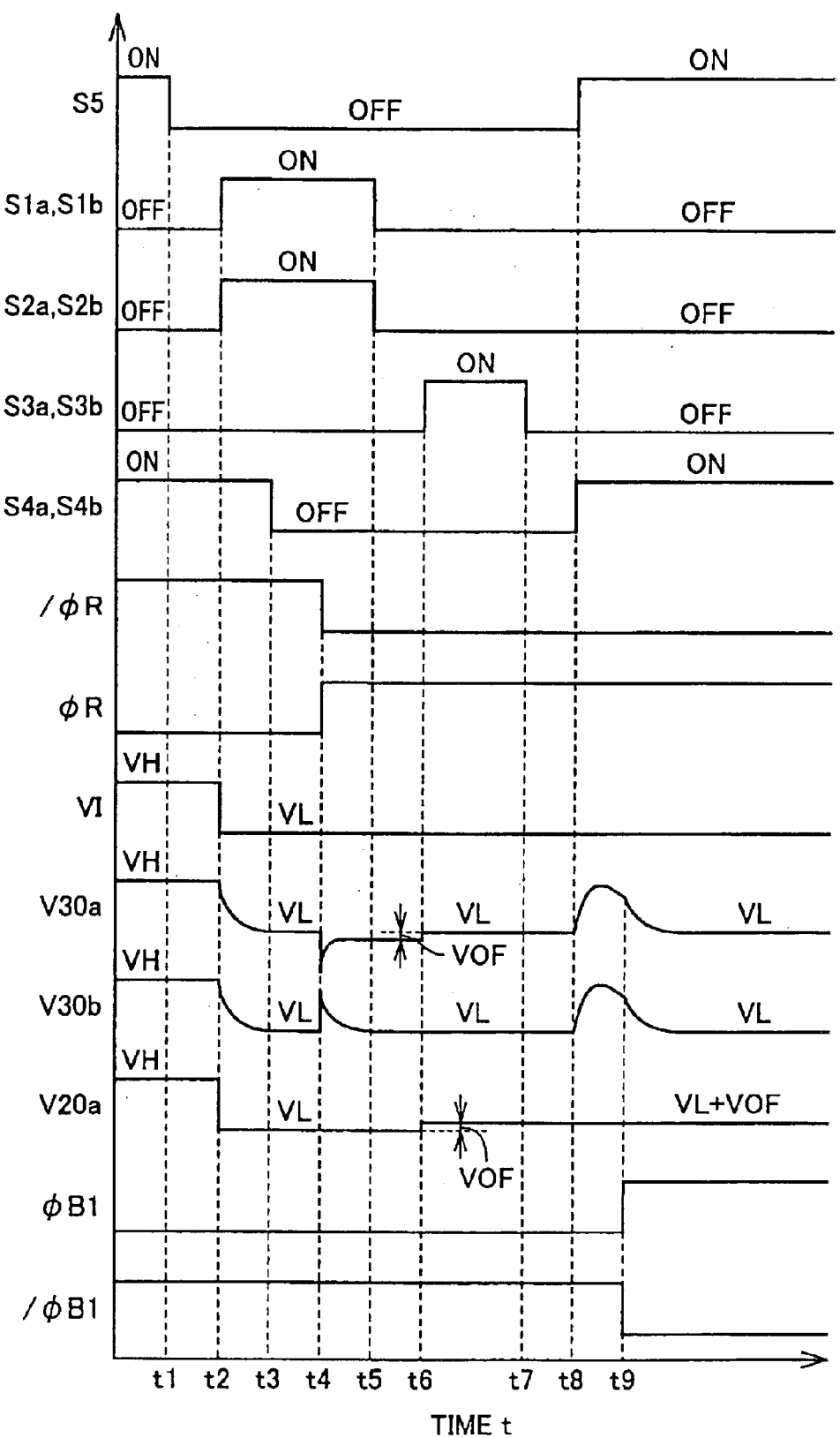
FIG. 59 is a time chart showing operations in the drive circuit with an offset compensation capability shown in FIG. 58.

FIG. 59 is a time chart showing operations in drive circuit with an offset compensation capability 157 shown in FIG. 58. In this case, it is assumed that threshold value voltage VTN' of N-type transistor 31 is larger than threshold voltage VTN of N-type transistor 23 by VOF. In an initial state, not only are switches S1a to S3a and S1b to S3b in off state but also switches S4a, S4b and S5 are in on state, and potentials V30a, V30b and V20a at nodes N30a, N30b and N20a are at input potential (in the figure, VH) in the previous run.

At time point t1, switch S5 is caused to be in off state to disconnect electrically a node between switches S30a and S30b from load capacitance 36. At time point t2, not only are switches S1a, S1b, S2a and S2b caused to be in on state, but input potential VI is set to a potential this time (in the figure, VL). In such a way, potentials V30a, V30 and V20b at nodes N30a, N30b and N20b all is VI=VL. Why V30a and V30b is VI−VL though threshold voltage VTN' of N transistor 31 is higher than a threshold voltage VTN of another N-type transistor is that while the discharge circuit discharges nodes N30a and N30b down to VI=VL, the nodes are not discharged further to a potential equal to or lower than input potential VI=VL.

At time point t3, switches S4a and S4b are caused to be in off state to disconnect electrically the charge circuit from the discharge circuit. At time point t4, not only is reset signal /φR lowered from H level to L level, but signal φR is also raised from L level to H level. Thereby, not only does potential V30a at node N30a become VL−VOF after being lowered pulsewise from VL, but potential V30b at node V30b also becomes VL after being raised pulsewise from VL.

When, at time point t5, switches S1a, S1b, S2a and S2b are caused to be in off state and then at time point t6, switches S3a and S3b are caused to be in on state, potential V20a at node N20a becomes VL+VOF and offset voltage VOF is cancelled to cause potential V30a at node N30a to be VI=VL.

When, at time point t7, switches S3a and S3b are caused to be in off state and then at time point t8, switches S4a, S4b and S5 are caused to be in on state, potentials V30a and V30b at nodes N30a and N30b are once raised and thereafter, lowered gradually since load capacitance 36 is charged to VH, which is a potential in the previous run. At time point t9, not only is signal φB1 raised from L level to H level, but signal /φB1 is also lowered from H level to L level.

In such a way, not only is potential V22 at node N22 raised through capacitor 76, but potential V27 at node N27 is also lowered through capacitor 77. At this time, since an operation is performed in which VL at L level is outputted to output node N121 and an on-resistance value of P-type transistor 35 is lower than an on-resistance value of N-type transistor 31, a level lowering action by V27 is exerted more strongly than a level raising action by V22 to cause potentials V30a, V30b and VO at nodes N30a, N30b and N121 to fall rapidly down to VL.

In this fifteenth embodiment, a high operating speed can be realized.

Sixteenth Embodiment

Figure 60:
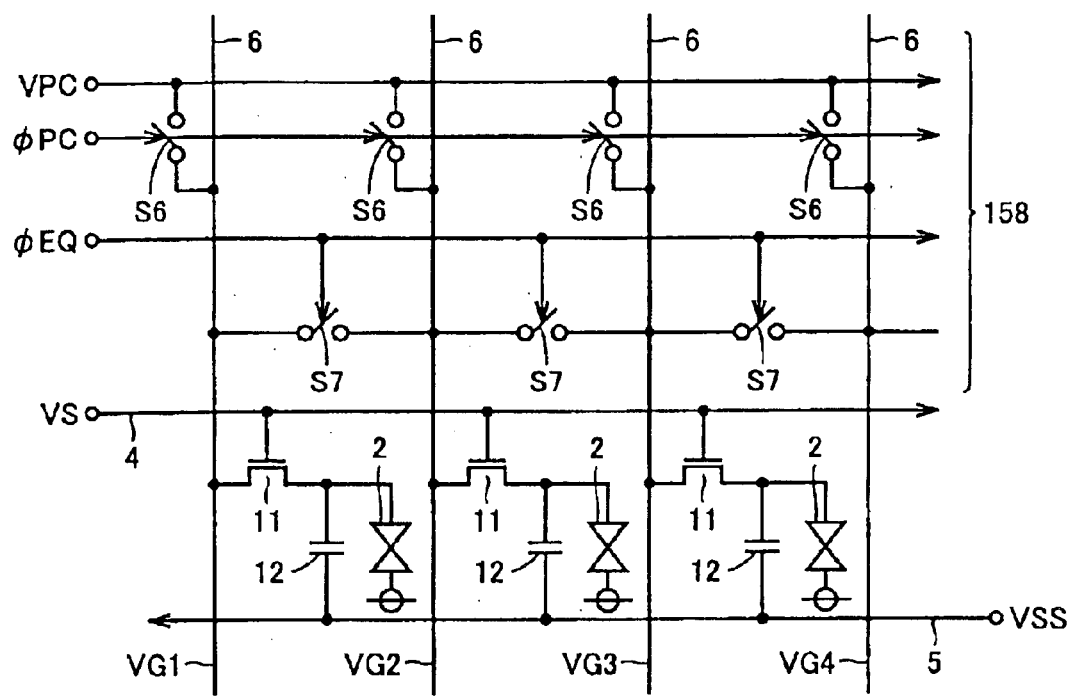
FIG. 60 is a circuit diagram showing a main part of a color liquid crystal display apparatus according to a sixteenth embodiment of the present invention.

FIG. 60 is a circuit diagram showing a main part of a color liquid crystal display apparatus according to a sixteenth embodiment of the present invention. In FIG. 60, the color liquid crystal display apparatus includes an equalize precharge circuit 158 for driving potentials on data lines 6 to a precharge potential VPC before gradation potentials are applied on data lines 6.

Equalize precharge circuit 158 includes: switches S6 provided correspondingly to respective data lines 6; and switches S7 each provided correspondingly to two adjacent data lines 6. One terminal of switch S6 is applied with precharge potential VPC and the other terminal is connected to corresponding data line 6. Switches S6 are turned into an on state in response to H level at an active level to which precharge signal φPC is driven. When switches S6 are turned into an on state, data lines 6 are driven to precharge potential VPC. Switch S7 is connected between two data lines 6 and turned into an on state in response to H level at an active level to which equalize signal φEQ is driven. When switches S7 are turned into an on state, potentials on all data lines 6 are equalized. After switches S6 and S7 are turned in to an off state, a degradation potentials are applied to data lines 6.

Here, precharge voltage VCP is adopted at 0 V. Since the gradation potentials range from 0 to 5 V (see FIG. 3), the drive circuits have only to charge data lines 6 without a necessity for discharge. Therefore, in this color liquid crystal display apparatus, push type drive circuits are used.

Figure 61:
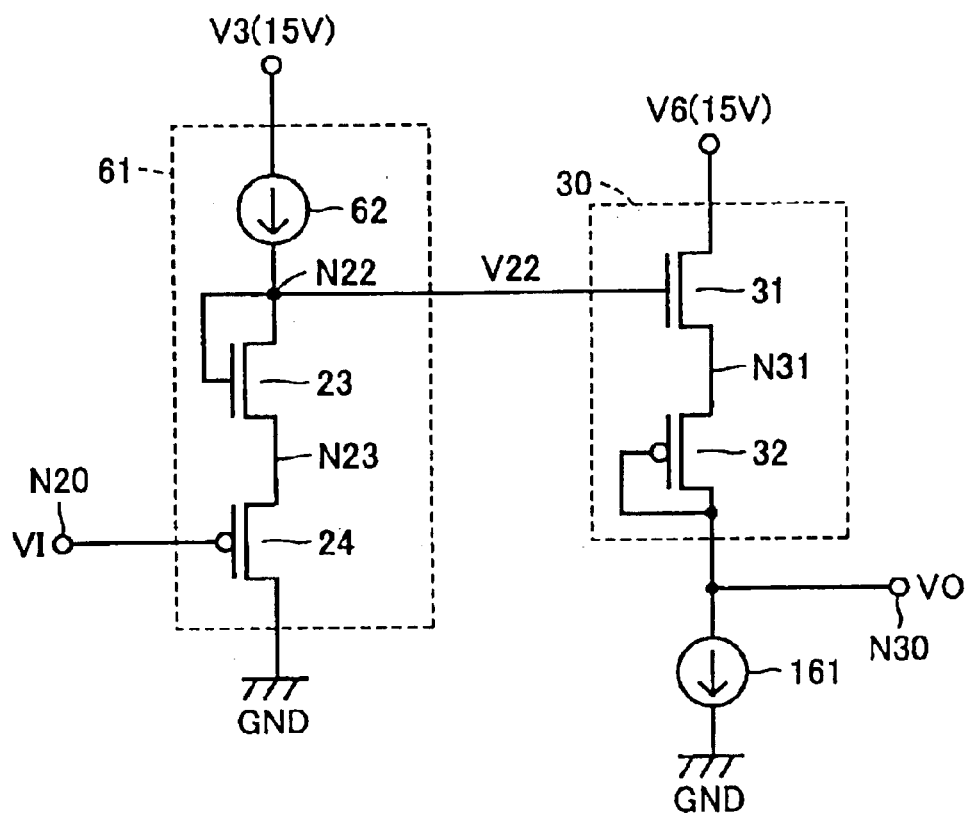
FIG. 61 is a circuit diagram showing a configuration of a push type drive circuit included in the color liquid crystal display apparatus shown in FIG. 60.

FIG. 61 is a circuit diagram showing a configuration of push type drive circuit 160. In FIG. 61, push type drive circuit 160 includes a level shift circuit 61, a pull-up circuit 30 and a constant current source 161. Level shift circuit 61 and pull-up circuit 30 are the same as those shown in FIG. 17.

Figure 62:
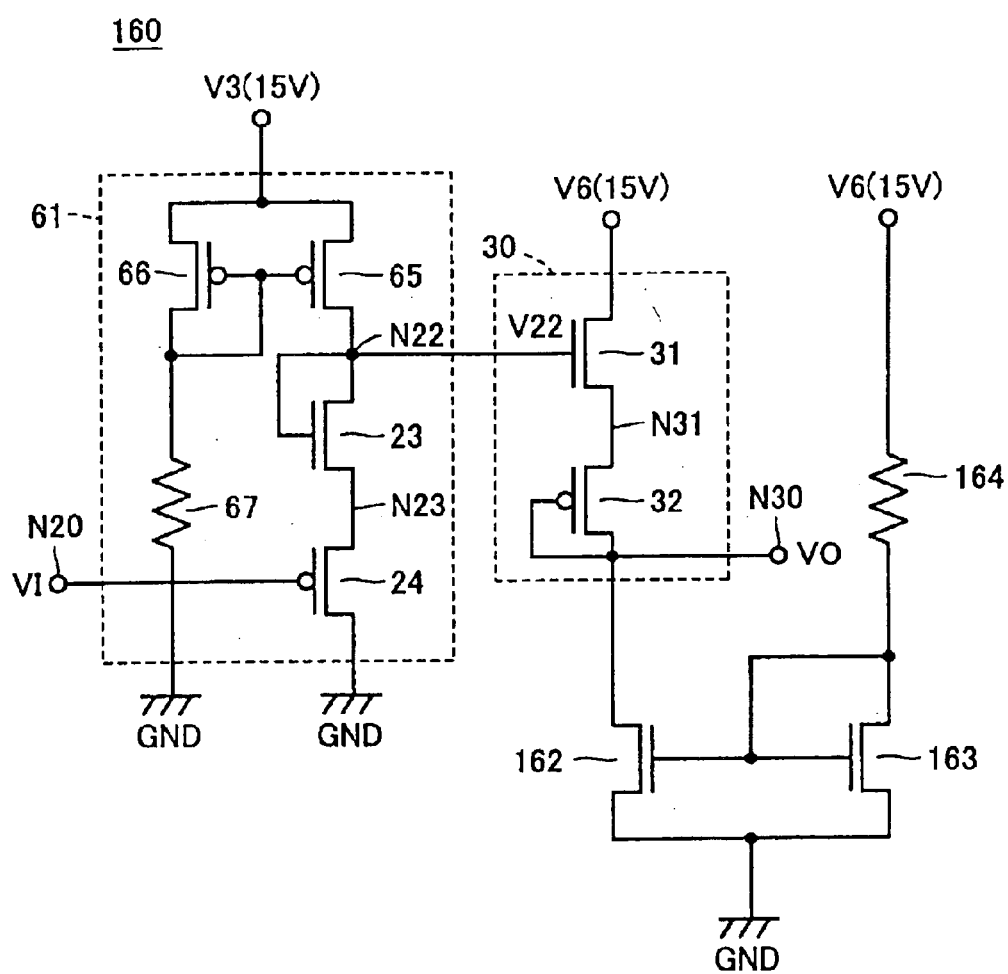
FIG. 62 is a circuit diagram showing a more detailed configuration of the push type drive circuit shown in FIG. 60.

That is, level shift circuit 61 includes: a constant current source 62 connected in series between the node of third power supply potential V3 (15 V) and the node of ground potential GND; an N-type transistor 23; and a P-type transistor 24. Constant current source 62, as shown in FIG. 62, includes P-type transistors 65 and 66, and a resistance element 67. A P-type transistor 65 is connected between the node of third power supply potential V3 and the drain (a node N22) of an N-type transistor 23, and a P-type transistor 66 and a resistance element 67 are in series between the node of third potential V3 and the node of ground potential GND. The gates of P-type transistors 65 and 66 are connected both to the drain of P-type transistor 66. P-type transistors 65 and 66 constitute a current mirror circuit. A constant current corresponding to a resistance value of resistance element 67 flows through P-type transistor 66 and resistance element 67 and a constant current corresponding to the constant current flowing in P-type transistor 66 flows through P-type transistor 65. The gate of N-type transistor 23 is connected to the drain thereof (node N22). N-type transistor 23 works as a diode element. The gate of P-type transistor 24 is connected to input node N20. A current value of constant current source 62 is set to the minimum value necessary for generating prescribed threshold values of respective transistors 23 and 24.

If a potential (gradation potential) at input node N20 is VI, a threshold voltage of a P-type transistor is VTP and a threshold voltage of an N-type transistor is VTN by definition, a potential V23 at the source (node N23) of P-type transistor 24 is given by V23=VI+|VTP| and a potential V22 at the drain (node N22) of N-type transistor 23 is given by V22=VI+|VTP|+VTN. Therefore, level shift circuit 61 outputs a potential V22 obtained by shifting input potential VI by |VTP|+VTN.

Pull-up circuit 30 includes an N-type transistor 31 and a P-type transistor 32 connected in series between the node of sixth power supply potential V6 (15 V) and output node N30. The gate of N-type transistor 31 is applied with output potential V22 of level shift circuit 61. The gate of P-type transistor 32 is connected to the drain thereof. P-type transistor 32 works as a diode element. Since sixth power supply potential V6 is set so that N-type transistor 31 operates in its saturation region, N-type transistor 31 performs a so-called source-follower operation.

Constant current source 161 is connected between output node N30 and the node of ground potential GND. Constant current source 161, as shown in FIG. 62, includes N-type transistors 162 and 163, and a resistance element 164. N-type transistor 162 are connected between output node N30 and the node of ground potential GND, and resistance element 164 and N-type transistor 163 are connected in series between the node of sixth potential V6 and the node of ground potential GND. The gates of N-type transistors 162 and 163 are connected both to the drain of N-type transistor 163. N-type transistors 162 and 163 constitute a current mirror circuit. A constant current of a value corresponding to a resistance value of resistance element 164 flows through resistance element 164 and N-type transistor 163 and a constant current of a value corresponding to the constant current flowing in N-type transistor 163 flows through N-type transistor 162. A current value of constant current source 161 is set to the minimum value necessary for generating prescribed threshold values of respective transistors 31 and 32.

A potential V31 at the source (node N31) of N-type transistor 31 is given by V31=V22−VTN=VI+|VTP| and potential VO at output node N30 is given by VO=V31−|VTP|=VI.

In the sixteenth embodiment, since through currents of the minimum value necessary for generating prescribed voltages of respective transistors 23, 24, 31 and 32 have only to flow therethrough, a total consumed current can be reduced. It is needless to say that constant current sources 62 and 161 may be replaced with respective resistance elements.

Figure 63:
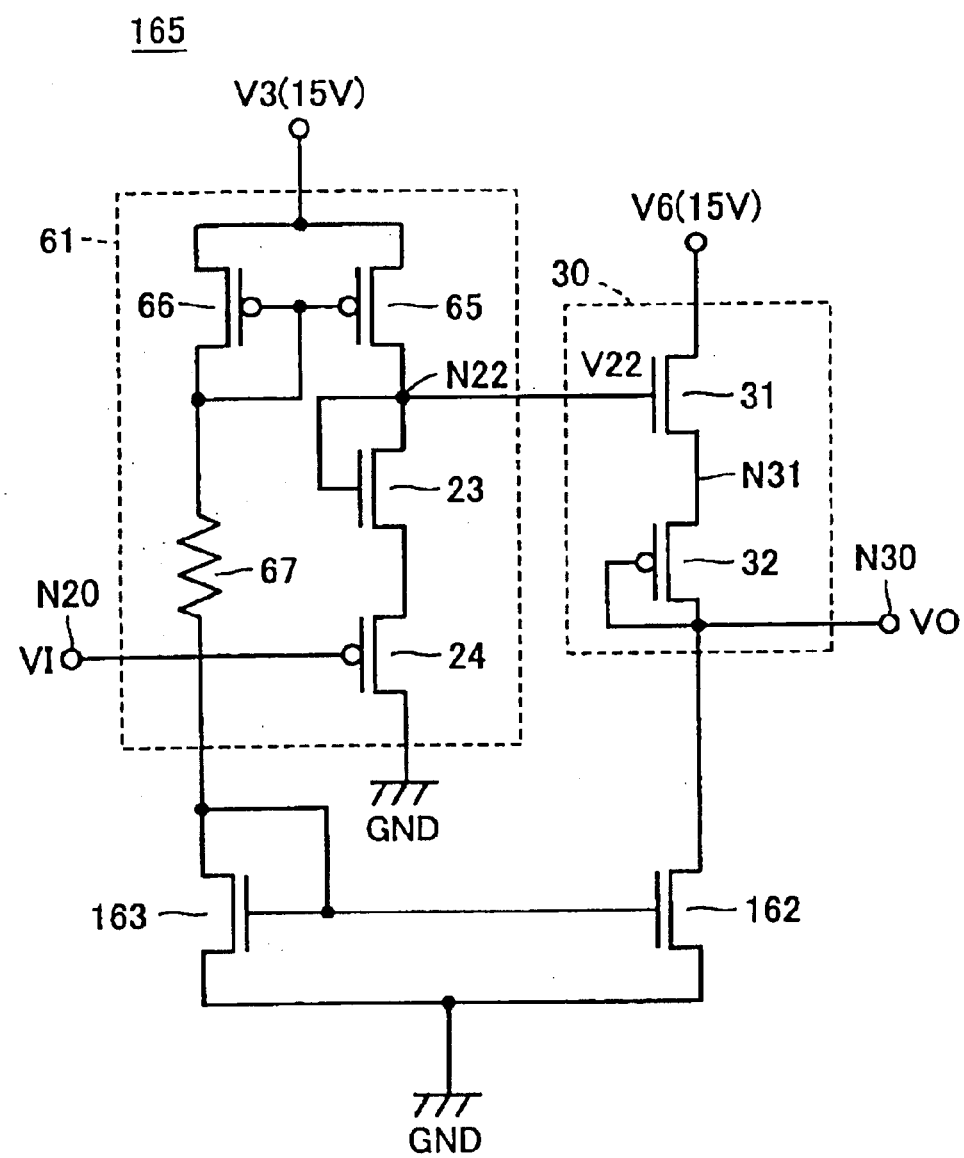
FIG. 63 is a circuit diagram showing an example modification of the sixteenth embodiment.

FIG. 63 is a circuit diagram showing a configuration of push type drive circuit 165 according to an example modification of the sixteenth embodiment. Referring to FIG. 63, drive circuit 165 is different from drive circuit 160 of FIG. 62 in that in drive circuit 160, a resistance element 164 is eliminated and resistance element 67 is shared by constant current sources 62 and 161. Resistance element 67 and N-type transistor 163 are connected in series between the source of P-type transistor 66 and the node of ground potential GND. The gate of N-type transistor 163 is connected to the drain thereof. In this example modification, it can be prevented that an offset voltage is generated by variations in resistance values of resistance elements 67 and 164.

Figure 64:
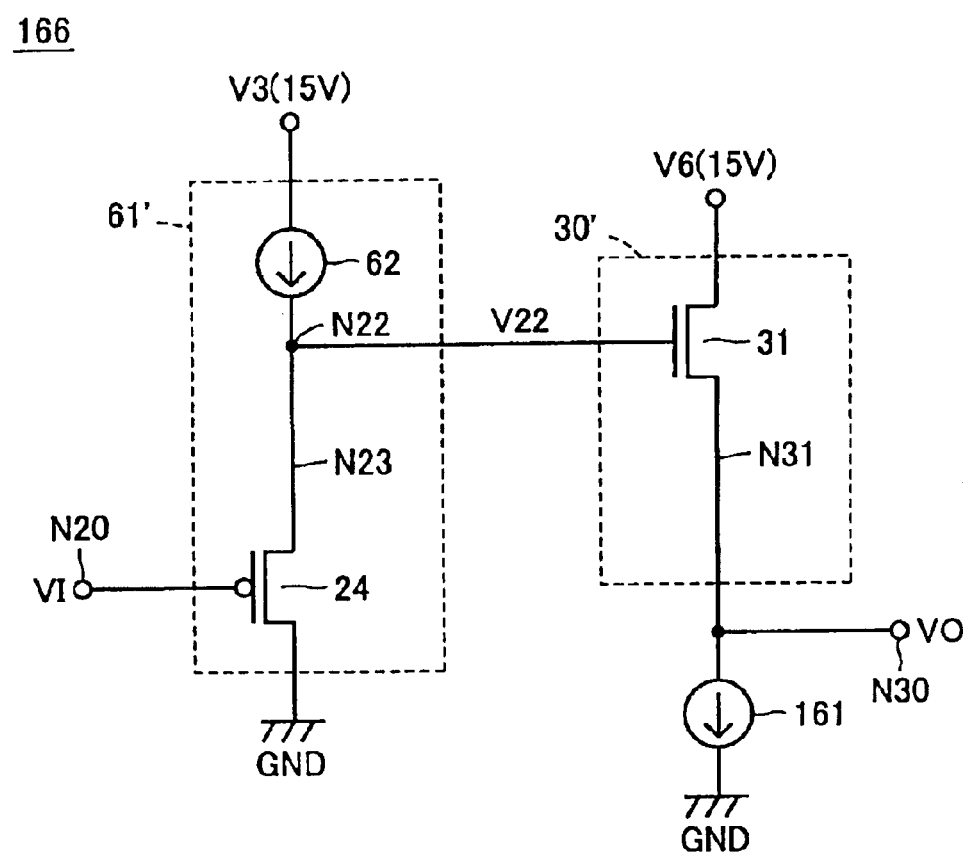
FIG. 64 is a circuit diagram showing another example modification of the sixteenth embodiment.

A push type drive circuit 166 of FIG. 64 is of a configuration obtained by eliminating transistors 23 and 32 in diode connection from push type drive circuit 160 of FIG. 61. Output potential VO is given by VO=VI+|VTP|−VTN. If it is set so that |VTP|≈VTN, VO≈VI. Alternatively, if consideration is given to a value of |VTP|−VTN as an offset value in its usage, drive circuit 166 can be used similarly to drive circuit 160 of FIG. 61. In this example modification, since transistors 23 and 32 are eliminated, an occupancy area of the circuit can be reduced.

Seventeenth Embodiment

If precharge potential VCP is set to 5 V in the color liquid crystal display apparatus shown in FIG. 60, degradation potentials ranges from 0 V to 5 V (see FIG. 3); therefore a drive circuit has only to perform discharge of data line 6 without a necessity of charge thereof. Therefore, pull type drive circuits are used in this color liquid crystal display apparatus.

Figure 65:
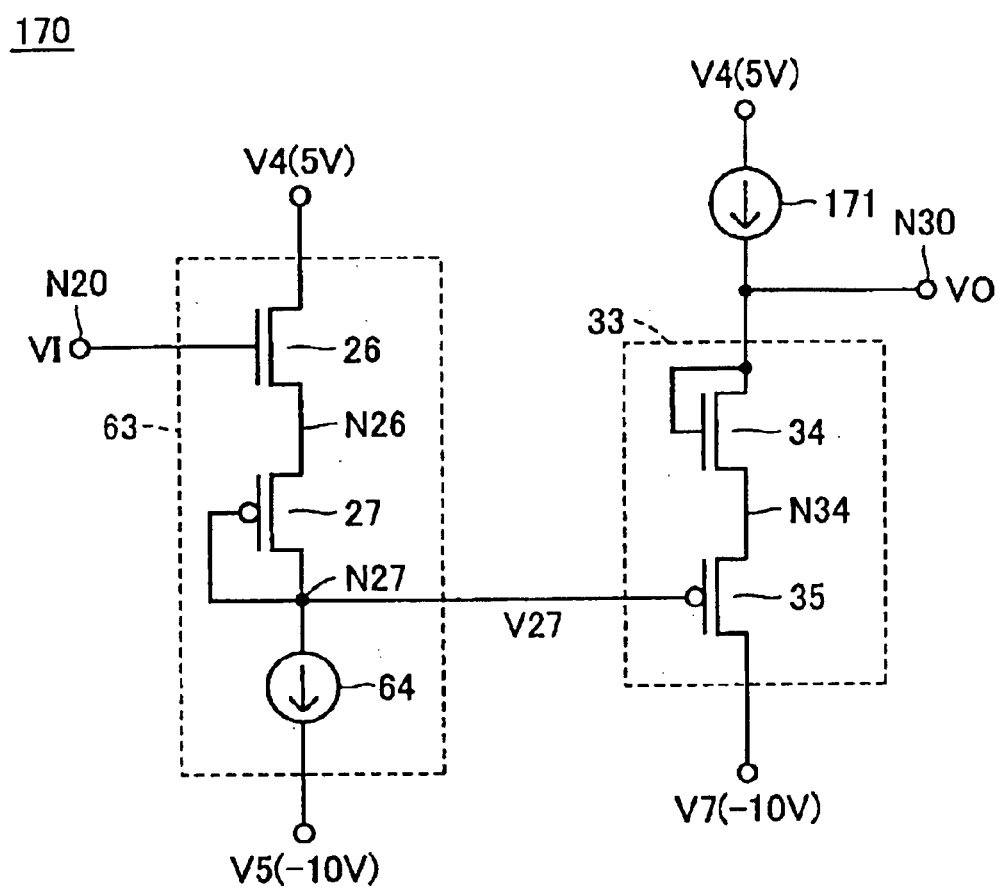
FIG. 65 is a circuit diagram showing a configuration of a pull type drive circuit according to a seventeenth embodiment of the present invention.

FIG. 65 is a circuit diagram showing a configuration of a pull type drive circuit 170 according to a seventeenth embodiment of the present invention. In FIG. 65, drive circuit 170 includes a level shift circuit 63, a constant current source 171 and a pull-down circuit 33. Level shift circuit 63 and pull down circuit 33 are the same as those shown in FIG. 17.

That is to say, level shift circuit 63 includes: an N-type transistor 26 connected in series between the node of fourth power supply potential V4 (5 V) and the node of fifth power supply potential V5 (−10 V); a P-type transistor 27; and a constant current source 64. The gate of N-type transistor 26 is applied with potential VI at input node N20. The gate of P-type transistor 27 is connected to the drain thereof (node N27). P-type transistor 27 works as a diode element. A current value of constant current source 64 is set to the minimum value necessary for generating prescribed threshold voltages of transistors 26 and 27.

A potential V26 at the source (node N26) of N-type transistor 26 is given by V26=VI−VTN. A potential V127 at the drain (node N27) of P-type transistor 27 is given by V27=VI−VTN−|VTP|. Therefore, level shift circuit 63 outputs potential V27 obtained by shifting input potential by −VTN−|VTP|.

Constant current source 171 is connected between the node of fourth power supply potential V4 and output node N30. Pull down circuit 33 includes a P-type transistor 35 and an N-type transistor 34 connected in series between the node of seventh power supply potential V7 (−10 V) and output node N30. The gate of P-type transistor 35 is applied with an output potential V27 of level shift circuit 63. The gate of N-type transistor 34 is connected to the drain thereof N-type transistor 34 works as a diode element. Since seventh power supply potential V7 is set so that P-type transistor 35 operates in its saturation region, P-type transistor 35 performs a so-called source-follower operation. A current value of constant current source 71 is set to the minimum value necessary for generating prescribed threshold voltages of respective transistors 34 and 35.

A potential V34 at the source (node N34) of P-type transistor 35 is given by V34=V27+|VTP|=VI−VTN. Potential VO at output node N30 is given by VO=V34+VTN=VI.

In the seventeenth embodiment, since through currents of the minimum value necessary for generating prescribed threshold voltages of respective transistors 26, 27, 34 and 35 have only to flow in the transistors, a total consumed current is small.

Figure 66:
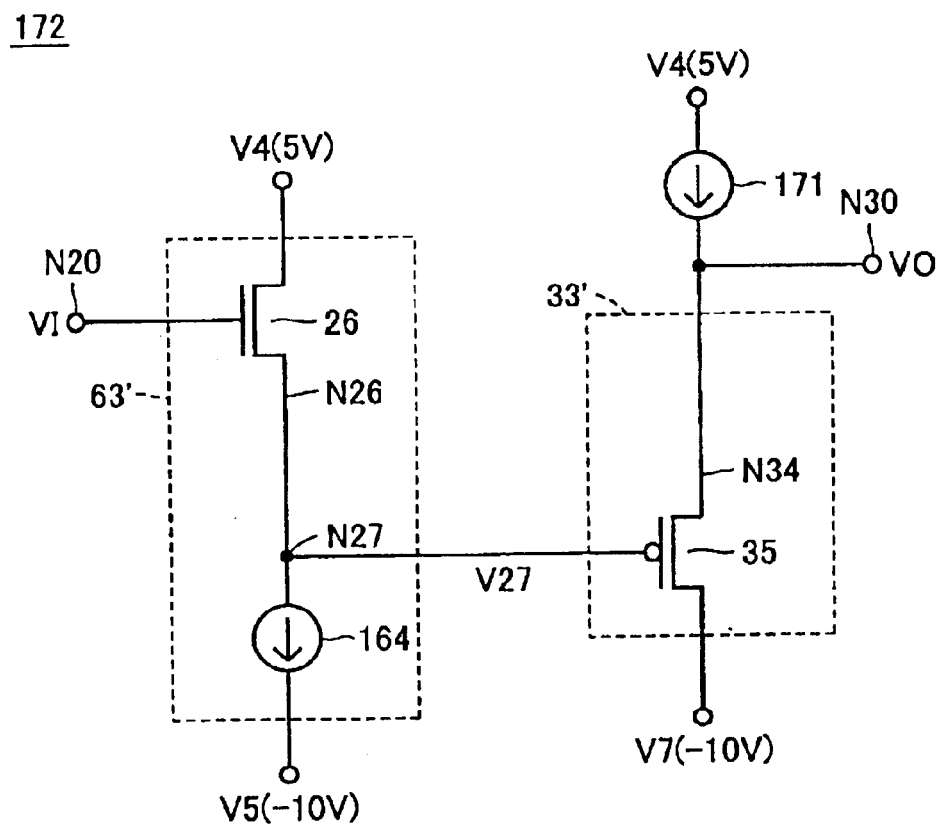
FIG. 66 is a circuit diagram showing an example modification of the seventeenth embodiment.

FIG. 66 is a circuit diagram showing a configuration of pull type drive circuit 172 according to an example modification of the seventeenth embodiment. Referring to FIG. 66, pull type drive circuit 172 is of a configuration obtained by eliminating transistors 27 and 34 in diode connection from pull type drive circuit 170 of FIG. 65. Output potential VO is given by VO=VI+|VTP|−VTN. If it is set that |VTP|≈VTN, however, VO≈VI. Alternatively, if consideration is given to a value of |VTP|−VTN as an offset value in its usage, drive circuit 172 can be used similarly to drive circuit 170 of FIG. 65. In this example modification, since transistors 27 and 34 are eliminated, an occupancy area of the circuit can be reduced.

Eighteenth Embodiment

Figure 67:
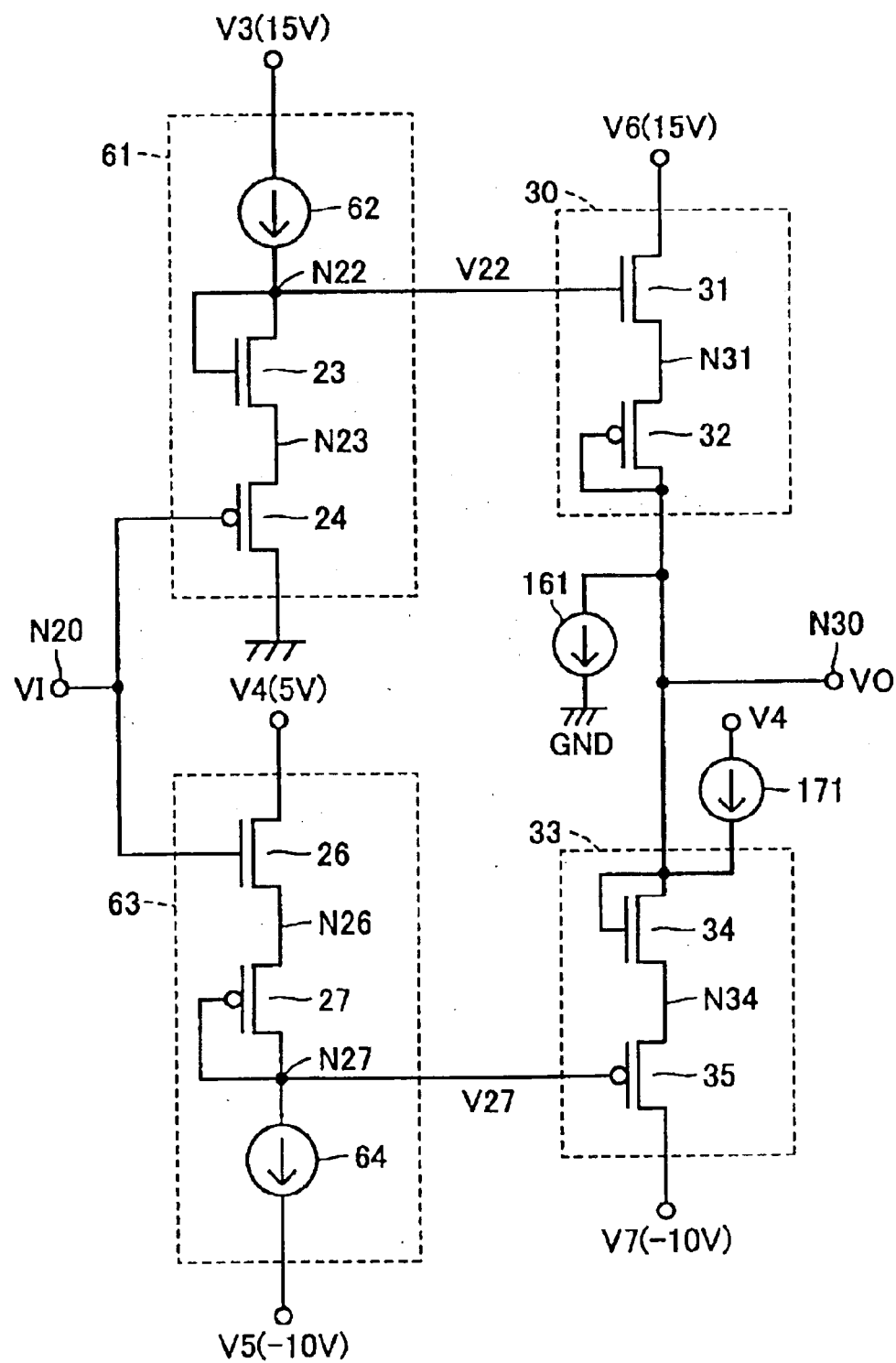
FIG. 67 is a circuit block diagram showing a configuration of a drive circuit according to an eighteenth embodiment of the present invention.

FIG. 67 is a circuit diagram showing a configuration of a drive circuit 175 according to an eighteenth embodiment of the present invention. In FIG. 67, drive circuit 175 is of a configuration obtained by combining push type drive circuit 160 of FIG. 61 and a pull type drive circuit 170 of FIG. 65. Potential VI at input node N20 is applied to the gate of P-type transistor 24 of level shift circuit 61 and the gate of N-type transistor 26 of level shift circuit 63. Connected to output node N30 are both the drain of P-type transistor 32 of pull-up circuit 30 and the drain of N-type transistor 34 of pull-down circuit 33.

When output potential VO is higher than input potential VI, not only does transistors 31 and 32 of pull-up circuit 30 become non-conductive, but transistors 34 and 35 of pull down circuit 33 also become conductive to lower output potential VO. When output potential VO is lower than input potential VI, not only does transistors 34 and 35 of pull-down circuit 33 become non-conductive, but transistors 31 and 32 of pull-up circuit 30 also become conductive to raise output potential VO. Accordingly, VO=VI.

Drive circuit 175 is used as a push type drive circuit, a pull type drive circuit or a push-pull type drive circuit. When drive circuit 175 is used as a push type drive circuit, current drive abilities of transistors 34 and 35 of pull-down circuit 33 are set to a level sufficiently lower as compared with current drive abilities of transistors 31 and 32 of pull-up circuit 30. When drive circuit 175 is used as a pull type drive circuit, current drive abilities of transistors 31 and 32 of pull-up circuit 30 are set to a level sufficiently lower as compared with current drive abilities of transistors 34 and 35 of pull-down circuit 30. When drive circuit 175 is used as a push-pull type drive circuit, current drive abilities of transistors 31 and 32 of pull-up circuit 30 are set to the same level as current drive abilities of transistors 34 and 35 of pull-down circuit 33.

In the eighteenth embodiment as well, there can be obtained drive circuit 175 with a small through current, enabling reduction in consumed power.

Figure 68:
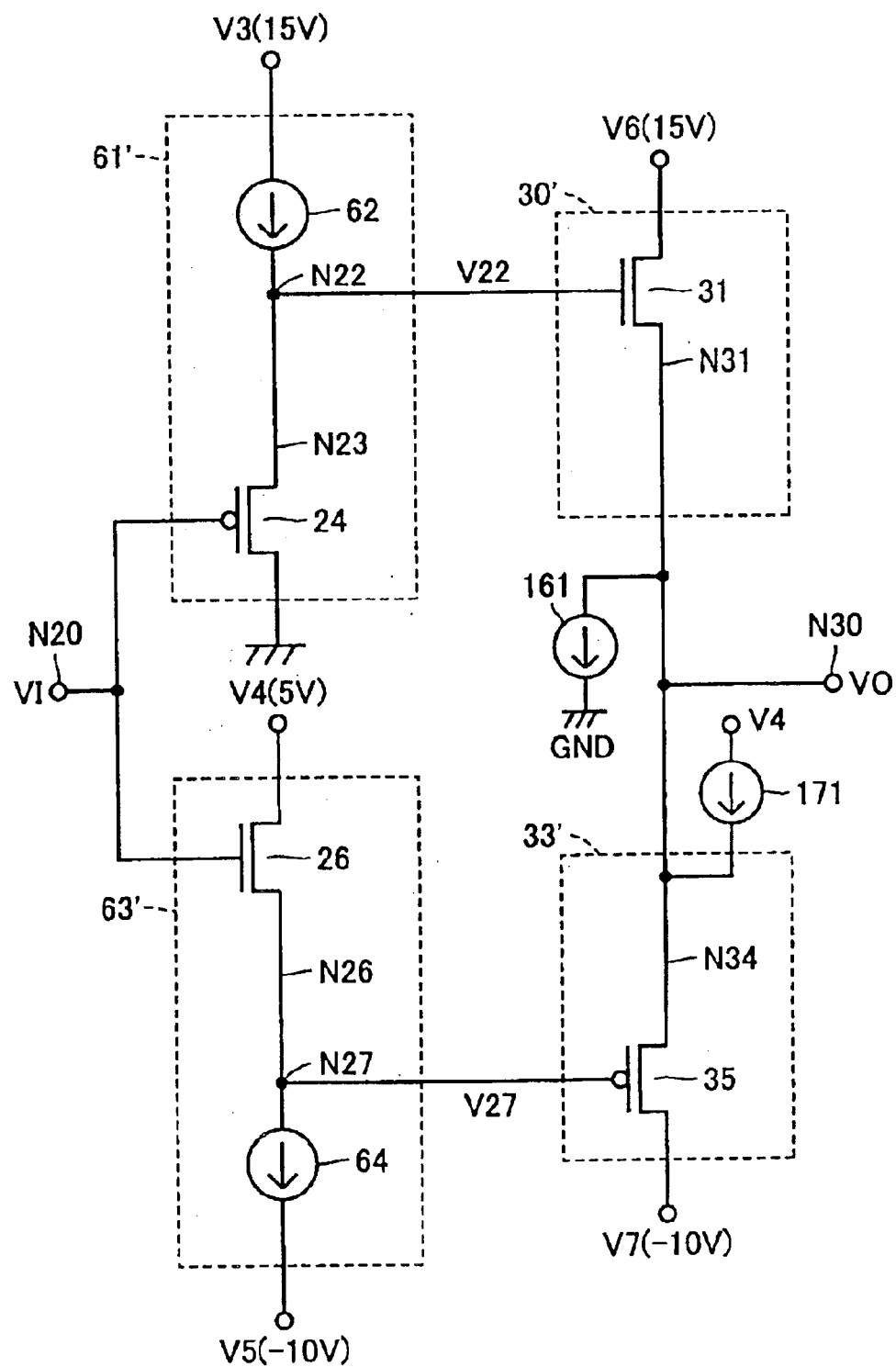
FIG. 68 is a circuit diagram showing an example modification of the eighteenth embodiment.

FIG. 68 is a circuit diagram showing a configuration of a drive circuit 176 according to an example modification of the eighteenth embodiment. Referring to FIG. 68, drive circuit 176 is of a configuration obtained by eliminating transistors 23, 27, 32 and 34 each in diode connection from drive circuit 170 of FIG. 67. Output potential VO is given by VO=VI+|VTP|−VTN. If it is set that |VTP|≈VTN, VO≈VI. Alternatively, if consideration is given to a value of |VTP|−VTN as an offset value in its usage, drive circuit 176 can be used similarly to drive circuit 175 of FIG. 67. In this example modification, since transistors 23, 27, 32 and 34 are eliminated, an occupancy area of the circuit can be reduced.

Figure 69:
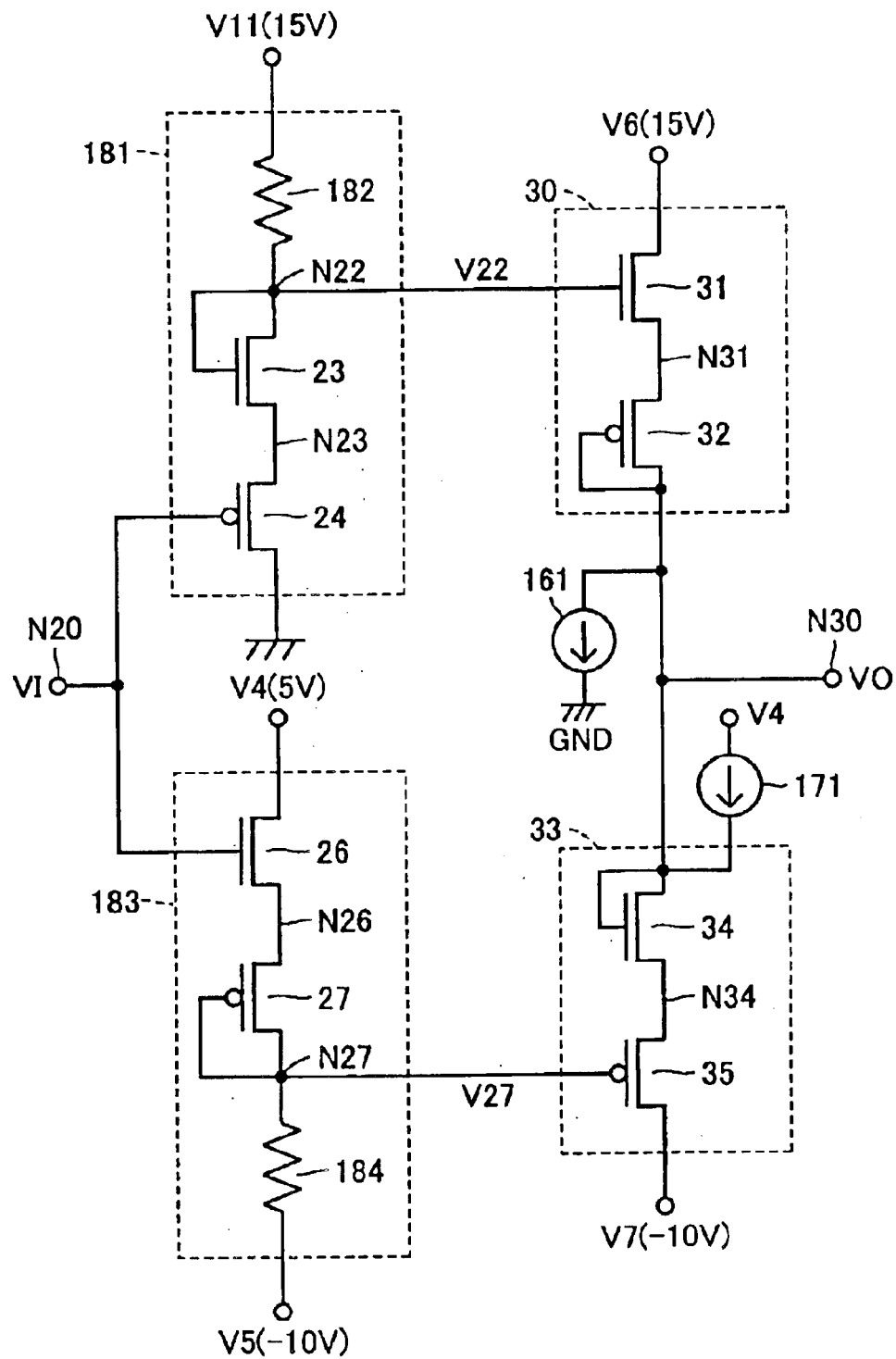
FIG. 69 is a circuit diagram showing another example modification of the eighteenth embodiment.

FIG. 69 is a circuit diagram showing a drive circuit 180 according to another example modification of the eighteenth embodiment. In FIG. 69, drive circuit 180 is of a configuration obtained by replacing level shift circuits 61 and 63 of drive circuit 175 of FIG. 67 with respect level shift circuits 181 and 183. Level shift circuit 181 is of a configuration obtained by replacing constant current source 62 of level shift circuit 61 with a resistance element 182. Level shift circuit 183 is of a configuration obtained by replacing constant current source 64 of level shift circuit 63 with a resistance element 184. Resistance values of resistance elements 182 and 184 are set to values at which resistance elements 182 and 184 flow currents at the same levels as constant current sources 62 and 64. In this example modification as well, the same effect as that of drive circuit 175 of FIG. 67 can be obtained.

Figure 70:
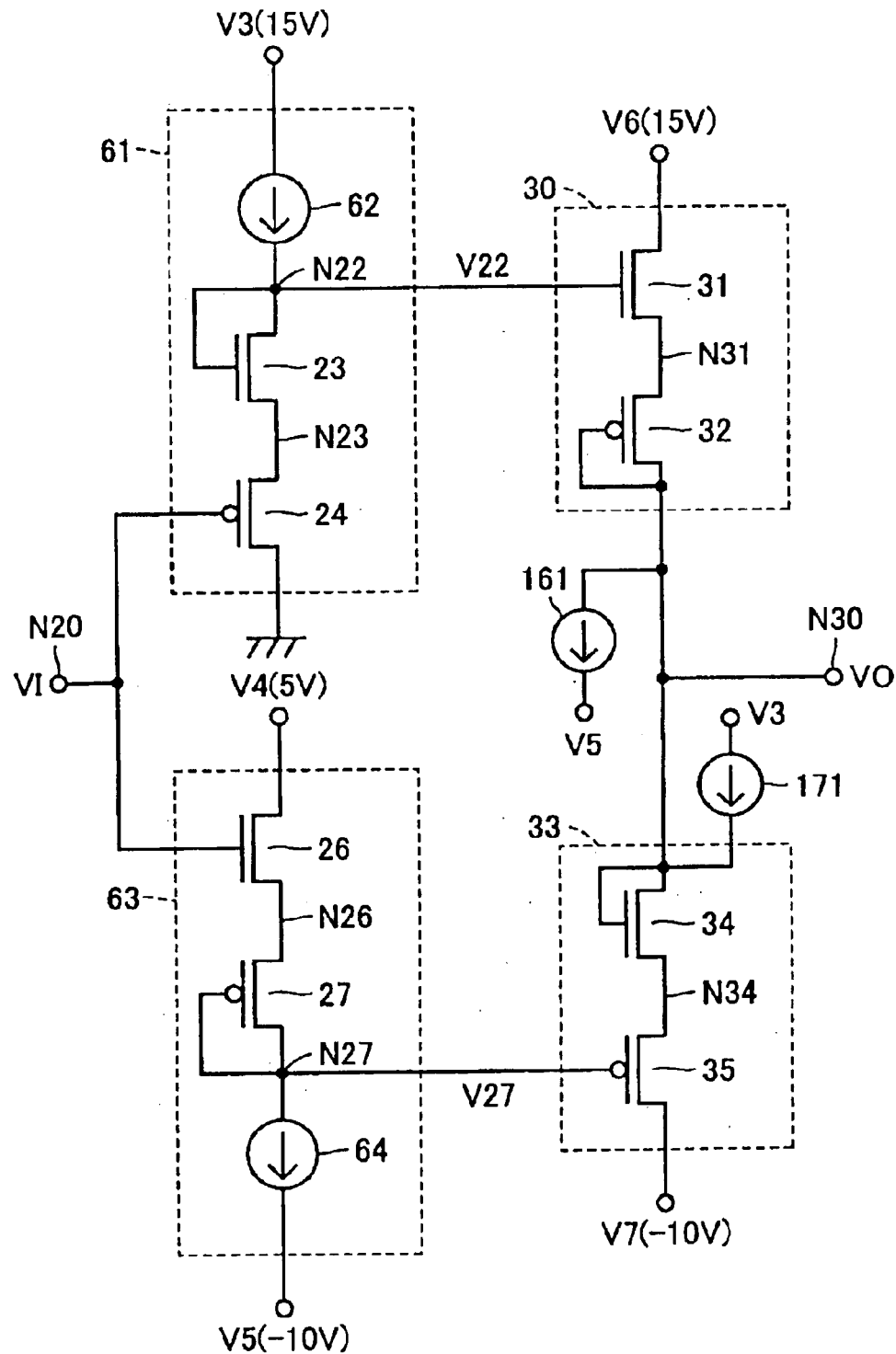
FIG. 70 is a circuit diagram showing still another example modification of the eighteenth embodiment.

FIG. 70 is a circuit diagram showing a configuration of a drive circuit 185 according to still another example modification of the eighteenth embodiment. Referring to FIG. 70, drive circuit 185 is different from drive circuit 175 of FIG. 67 in that constant current source 161 is connected between output node N30 and the node of fifth power supply potential V5, and constant current source 171 is connected between the node of third power supply potential V3 and output node N30.

Figure 71:
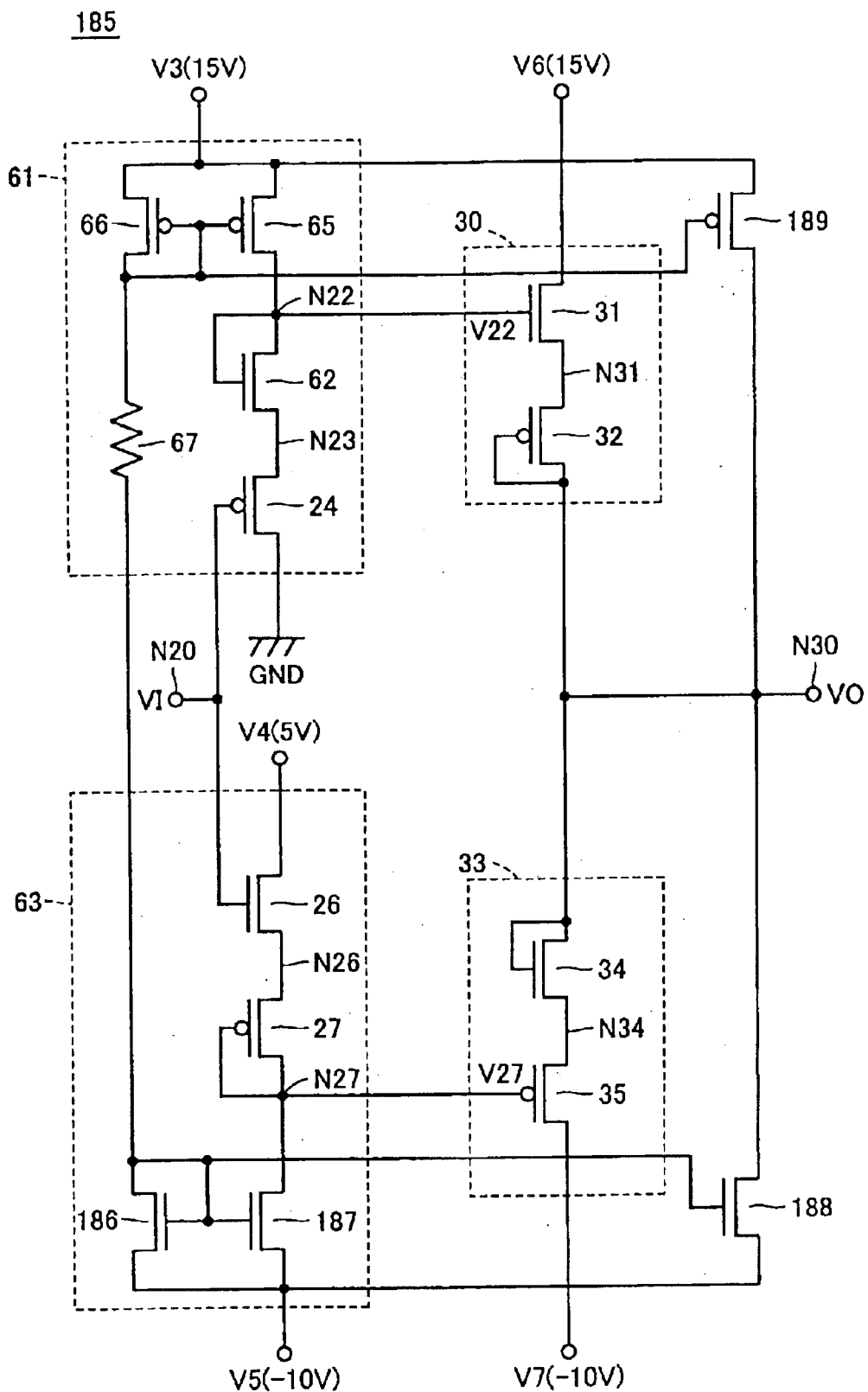
FIG. 71 is a circuit diagram showing a more detailed configuration of the drive circuit shown in FIG. 70.

Constant current sources 62, 64, 161 and 171, as shown in FIG. 71, are each constituted of a resistance element 67, P-type transistors 65, 66 and 189, and N-type transistors 186 to 188. P-type transistor 66, resistance element 67 and N-type transistor 186 are connected in series between the node of third potential V3 and the node of fifth potential V5. The gate of P-type transistor 66 is connected to the drain thereof and the gate of N-type transistor 186 is connected to the drain thereof. Transistors 66 and 186 each work as a diode element.

P-type transistor 65 is connected between the node of third power supply potential V3 and node N22, and the gate thereof is connected to the gate of P-type transistor 66. P-type transistor 189 is connected between the node of third power supply V3 and output node N30, and the gate thereof is connected to the gate of P-type transistor 66. P-type transistors 66, 65 and 189 constitute a current mirror circuit. Currents of a value corresponding to a current flowing in P-type transistor 66 flow in respective P-type transistors 65 and 189. P-type transistors 65 and 189 work as respective constant current sources 62 and 171.

N-type transistor 187 is connected between the node of fifth power supply potential V5 and node N27, and the gate thereof is connected to the gate of N-type transistor 186. N-type transistor 188 is connected between the node of fifth power supply potential V5 and output node N30, and the gate thereof is connected to the gate of N-type transistor 186. N-type transistors 186 to 188 constitute a current mirror circuit. Currents of a value corresponding to a current flowing in N-type transistor 186 flow through respective N-type transistors 187 and 188. N-type transistors 187 and 188 work as respective constant current sources 64 and 161. Since the other parts and operations therein of the configuration are the same as in drive circuit 175 of FIG. 67, any of descriptions thereof will not be repeated. With this example modification applied, the same effect as in drive circuit 175 of FIG. 67 is obtained.

Nineteenth Embodiment

Figure 72:
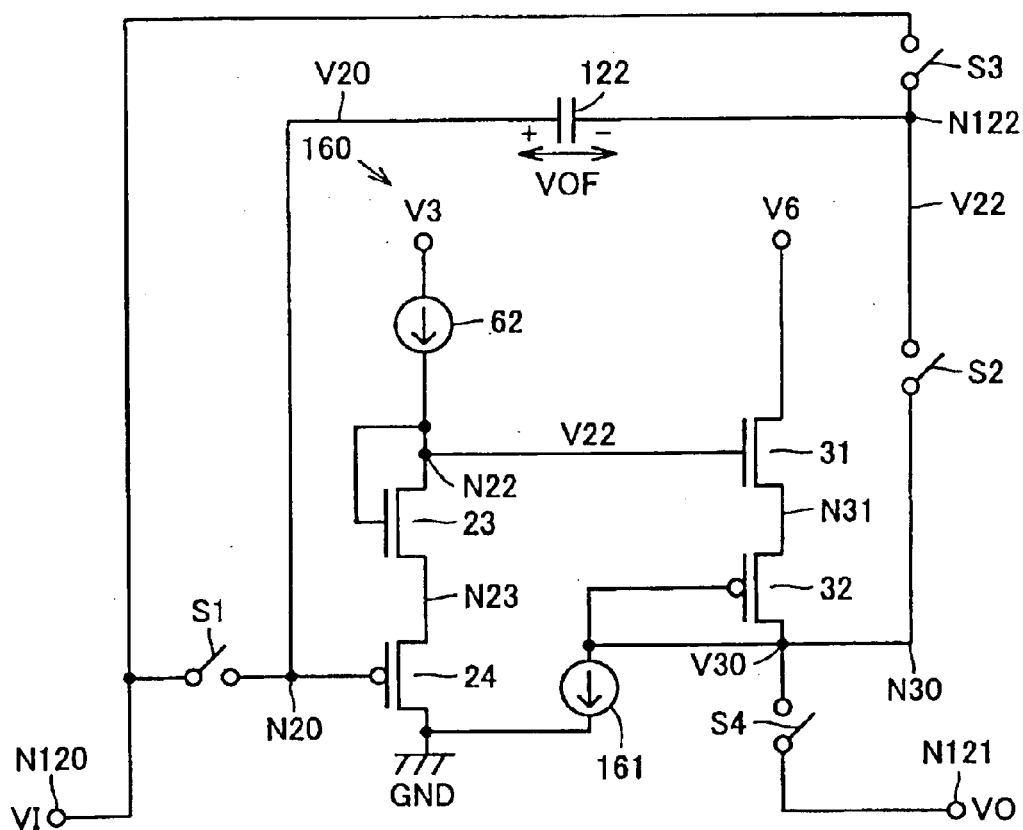
FIG. 72 is a circuit block diagram showing a configuration of a push type drive circuit with an offset compensation capability according to a nineteenth embodiment of the present invention.

FIG. 72 is a circuit block diagram showing a configuration of a drive circuit 190 with an offset compensation capability according to a nineteenth embodiment of the present invention. In FIG. 72, drive circuit 190 with an offset compensation capability is of a configuration obtained by adding a capacitor 122 and switches S1 to S4 to push type drive circuit 160 of FIG. 61. Capacitor 122 and switches S1 to S4 constitute an offset compensation circuit for compensating an offset voltage VOF of push type drive circuit 160.

That is, switch S1 is connected between input node N120 and input node N20 of drive circuit 160, and switch S4 is connected between output node N121 and output node N30 of drive circuit 160. Capacitor 122 and switch S2 are connected in series between input node N20 of drive circuit 160 and output node N30. Switch S3 is connected between input node N120 and node N122, which is interposed between capacitor 122 and switch S2.

Then, description will be given of operations in drive circuit 190 with an offset compensation capability. In an initial state, all switches S1 to S4 are set in an off state. When switches S1 and S2 are turned into an on state at a time point, potential V20 at input node N20 of drive circuit 160 takes V20=VI, and output potential V30 of drive circuit 121 and potential V122 at node 122 take V30=V122=VI−VOF to charge capacitor 122 to offset voltage VOF.

Then, when switches S1 and S2 are turned into an off state, offset voltage VOF is held in capacitor 122. Then, when switch S3 is turned into an on state, potential V122 at node N122 takes V122=VI and input potential V20 of drive circuit 160 is driven to V20=VI+VOF. As a result, output potential V30 of drive circuit 160 takes V30=V20−VOF=VI and offset voltage VOF of drive circuit 160 is cancelled. Then, when switch S4 is turned into an on state, output potential VO is driven to VO=VI and supplied to a load.

In the nineteenth embodiment, offset voltage VOF of push type drive circuit 160 can be cancelled to cause output potential VO and input potential VI to coincide with each other.

Figure 73:
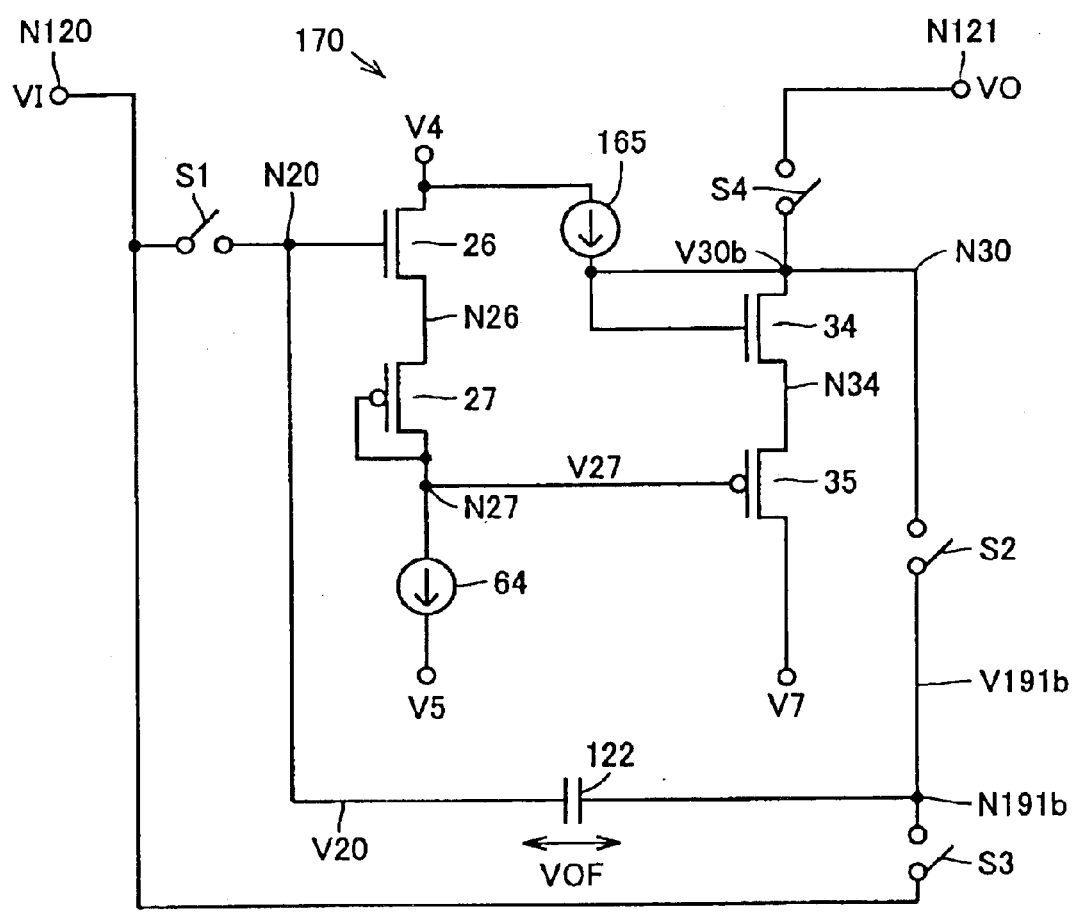
FIG. 73 is a circuit diagram showing an example modification of the nineteenth embodiment.

A pull type drive circuit 191 with an offset compensation capability of FIG. 73 is of a configuration obtained by adding a capacitor 122 and switches S1 to S4 to pull type drive circuit 170 of FIG. 65. In this example modification, offset voltage VOF of pull type drive circuit 191 can be cancelled to cause output voltage VO and input potential VI to coincide with each other. Furthermore, it is needless to say that the same effect can be also obtained in a configuration obtained by adding capacitor 122 and switches S1 and S4 to each of drive circuits 165, 166 and 172.

Twentieth Embodiment

Figure 74:
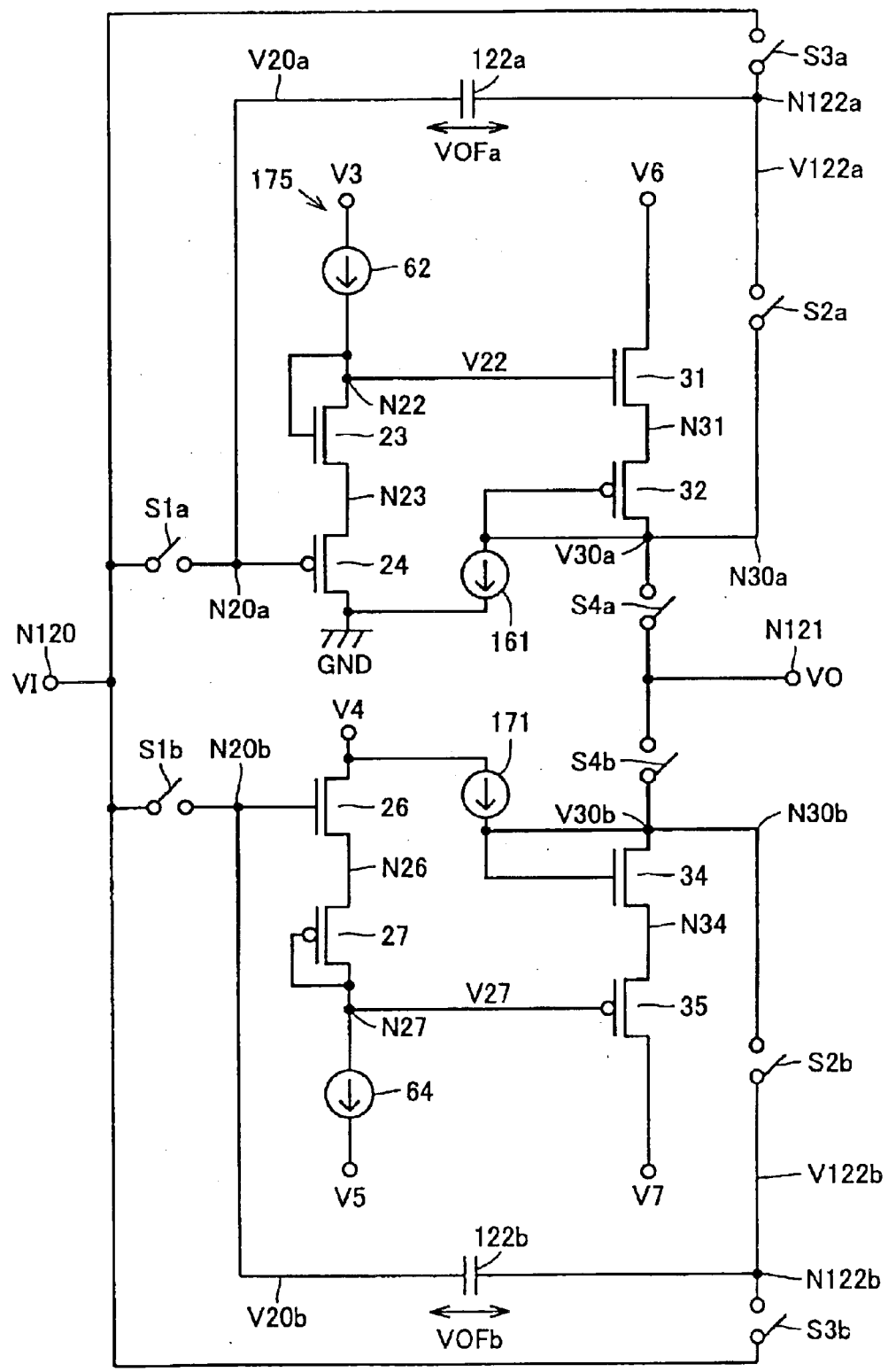
FIG. 74 is a circuit block diagram showing a configuration of a drive circuit with an offset compensation capability according to a twentieth embodiment of the present invention.

FIG. 74 is a circuit block diagram showing a configuration of a drive circuit 195 with an offset compensation capability according to a twentieth embodiment of the present invention. In FIG. 74, drive circuit 195 with an offset compensation capability is of a configuration obtained by adding capacitors 122a and 122b and switches S1a to S4a and S1b to S4b to drive circuit 175 of FIG. 67.

Switches S1a and S1b are connected between input node N120 and the gates (nodes N20a and N20b) of respective of transistors 24 and 26. Switches S4a and S4b are connected between output node N121 and the drains (nodes N30a and N30b) of respective transistors 32 and 34. Capacitor 122a and switch S2a are connected in series between nodes N20a and N30a. Capacitor 121b and switch S2b are connected in series between nodes N20b and N30b. Switch S3a is connected between input node N120 and node 122a, which is interposed between capacitor 122a and switch S2a. Switch 3b is connected between input node N120 and node 122b, which is interposed between capacitor 122b and switch S2b.

Then, description will be given of operation in drive circuit 195. In an initial state, all switches S1a to S4a and S1b to S4b are turned into an off state. When switches S1a, S2a, S1b and S2b are turned into an on state at a time point, potentials V30a and 30b at nodes N30a and N30b take V30a=VI−VOFa and V30b=VI−VOFb, respectively, and capacitors 122a and 122b are charged to respective offset voltages VOFa and VOFb.

Then, when switches S1a, S2a, S1b and S2b are turned into an off state, offset voltages VOFa and VOFb are held in capacitors 122a and 122b. Subsequent to this, when switches S3a and S3b are turned into an on state, potentials of the gates of transistors 24 and 26 take VI+VOFa and VI+VOFb, respectively. As a result, potentials V30a and V30b at nodes N30a and N30b are given by V30a=VI+VOFa−VOFa=VI and V30b=VI+VOFb−VOFb=VI, respectively, to cancel offset voltages VOFa and VOFb of drive circuit 175. At the last stage, switches S4a and S4b are turned into an on state to obtain a relation of VO=VI.

In the twentieth embodiment, no offset voltage arises; thereby obtaining drive circuit 195 with a small drive ability and a small consumed power.

It is needless to say that the same effect is also ensured when capacitors 122a and 122b, and switches S1a to S4a and S1b to S4b are added to each of drive circuits 176, 180 and 185.

Figure 75:
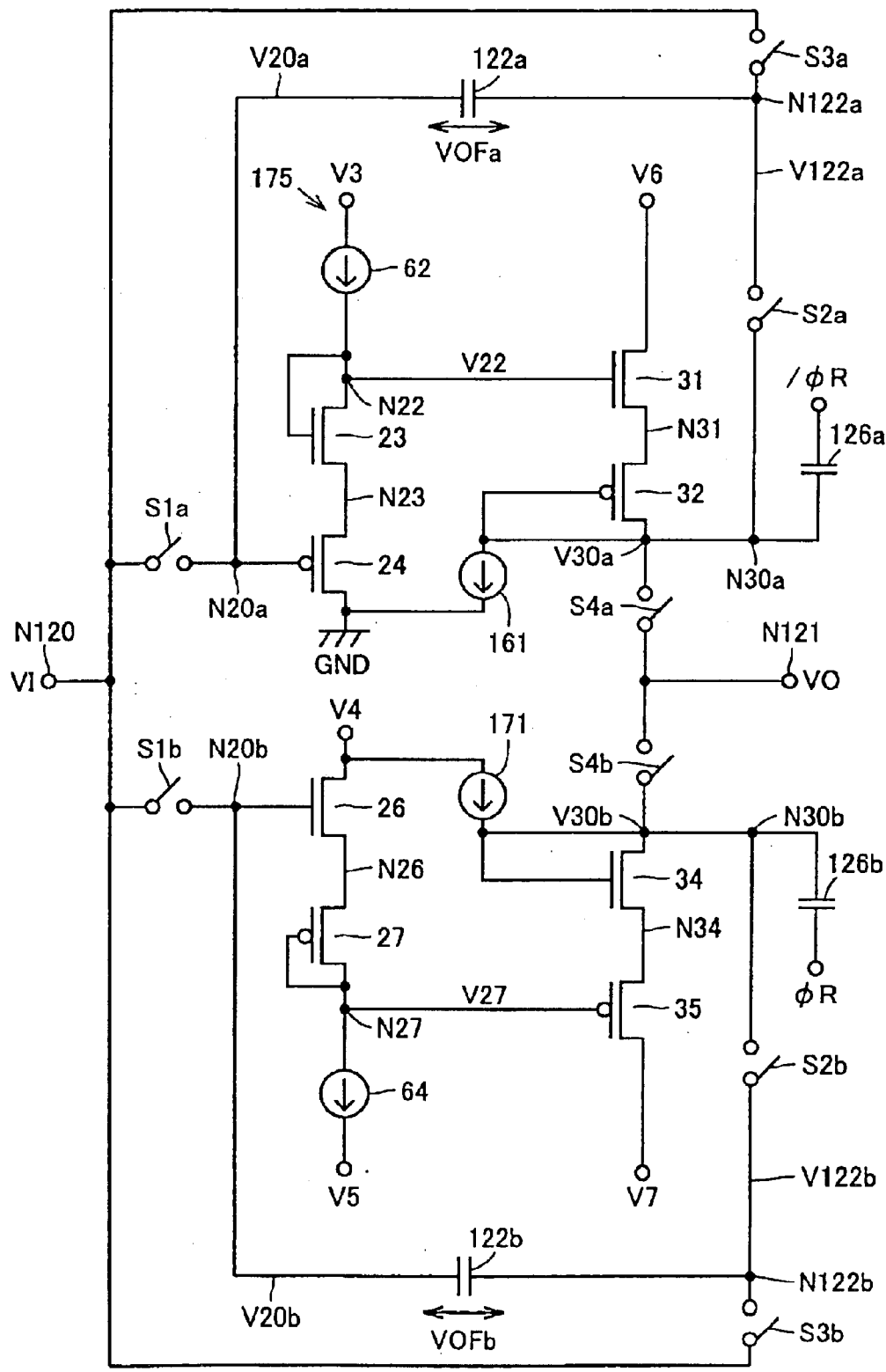
FIG. 75 is a circuit diagram showing an example modification of the twentieth embodiment.

A drive circuit 196 with an offset compensation capability of FIG. 75 is of a configuration obtained by adding capacitors 126a and 126b to drive circuit 195 with an offset compensation capability of FIG. 74. One electrodes of capacitors 126a and 126b are connected to respective nodes N30a and N30b, while the other electrodes thereof receive a reset signal /φR and a signal φR complementary thereto. In an initial state, signals signal /φR and φR are set to H level and L level, respectively. Since a current value of constant current source 161 is set to a small value, potential V30a at node N30a gradually falls even if switches S1a and S2a are turned into an on state when potential V30a at node N30a is higher than input potential V1. Since a current value of constant current source 171 is set to a small value, potential V30b at node N30b gradually rises even if switches S1b and S2b are turned into an on state when potential V30b at node N30b is lower than input potential V1. Therefore, in this example modification, not only is signal /φR lowered from H level to L level but signal φR is raised from L level to H level immediately after switches S1a, S2a, S1b and S2b are turned into an on state. Thereby, transistors 31, 32, 34 and 35 become conductive to cause potentials V30a and V30b at respective nodes N30a and N30b to quickly coincide with input potential VI. Accordingly, in the example modification, a high speed operation in a drive circuit can be realized.

Figure 76:
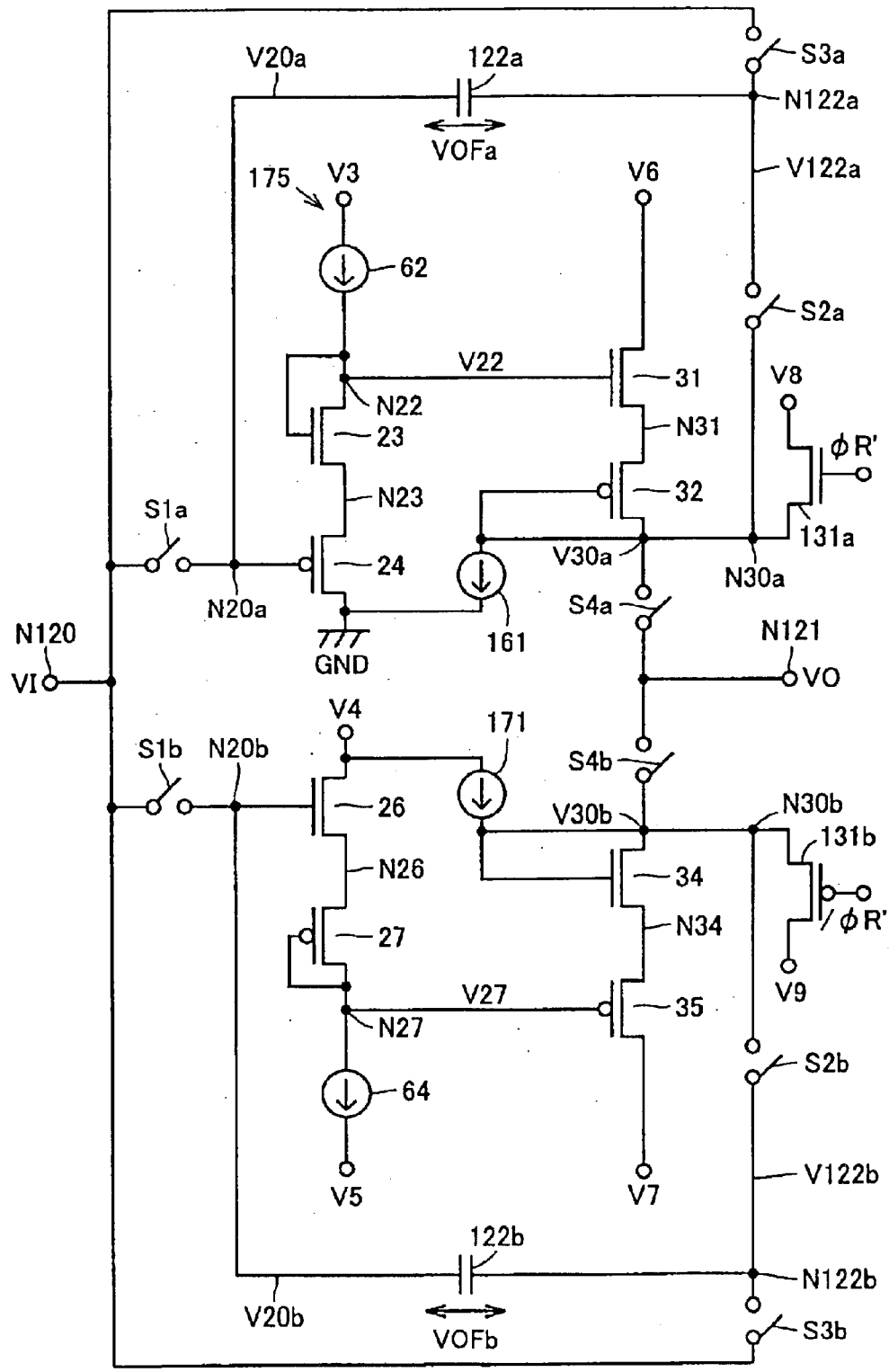
FIG. 76 is a circuit diagram showing another example modification of the twentieth embodiment.

A drive circuit 197 with an offset compensation capability of FIG. 76 is of a configuration obtained by replacing capacitors 126a and 126b of drive circuit 196 with an offset compensation capability with an N-channel transistor 131a and a P-type channel transistor 131b,respectively. N-channel transistor 131a is connected between the line of eighth power supply potential V8 and node N30a and receives reset signal φR' at the gate thereof. P-type transistor 131b is connected between node N30b and the line of ninth power supply potential V9 and receives reset signal /φRφ complementary to reset signal φR' at the gate thereof. Usually, signals φR' and /φR' are at L level and H level, respectively, to cause N-type transistor 131a and P-type transistor 131b to be non-conductive. Not only is signal φR' set to H level pulsewise for a prescribed time, but signal /φR' is set to L level pulsewise for a prescribed time immediately after switches S1a, S2a, S1b and S2b are turned into an on state. Thereby, not only does N-type transistor 131a become conductive pulsewise to lower potential V30a at node N30a to eighth-power supply potential V8, but P-type transistor 131b also becomes conductive pulsewise to raise potential V30b at node N30b to ninth power supply potential V9. In this example modification as well, a high speed operation can be realized.

Figure 77:
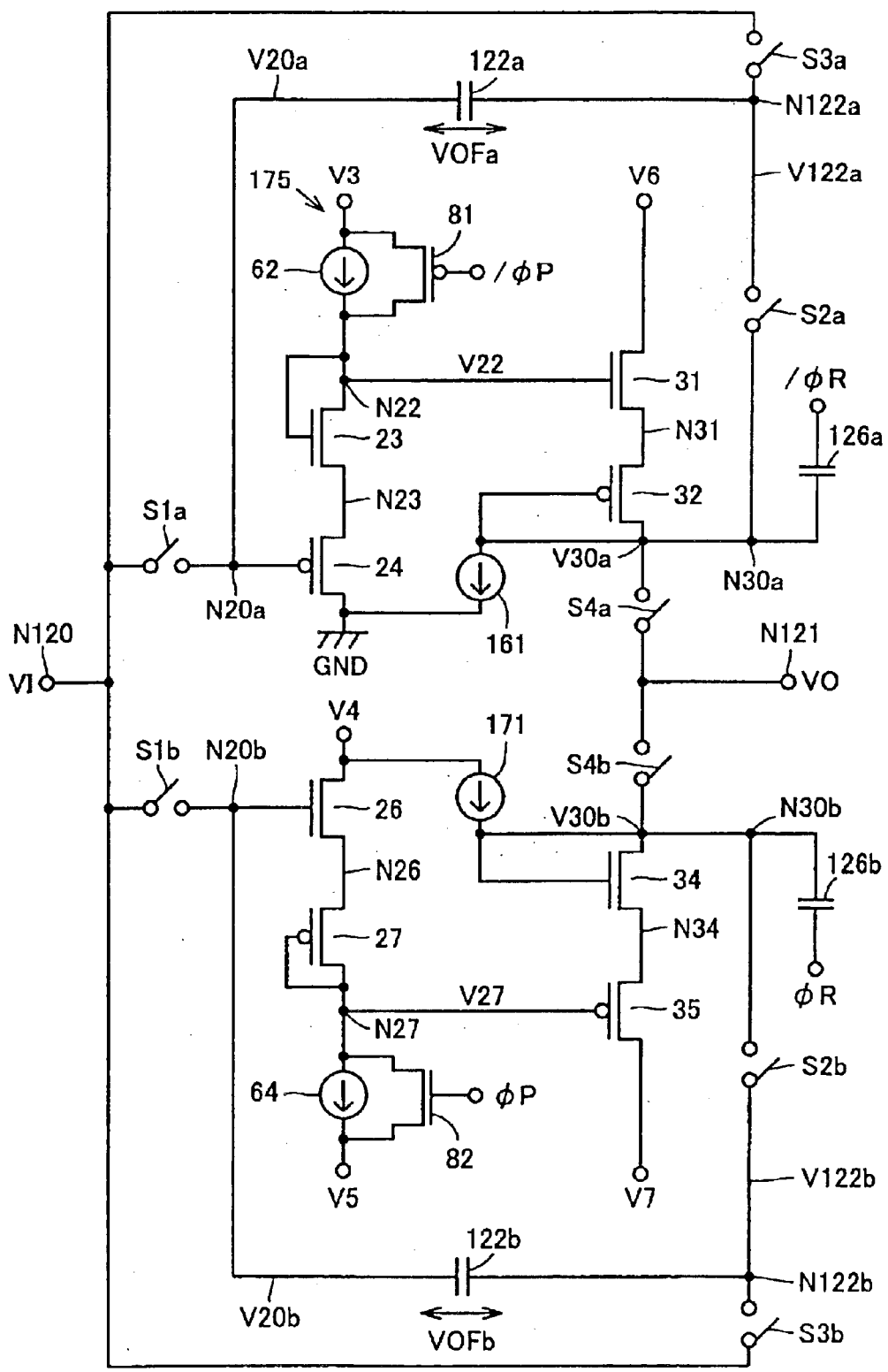
FIG. 77 is a circuit diagram showing still another example modification of the twentieth embodiment.

A drive circuit 198 with an offset compensation capability of FIG. 77 is of a configuration obtained by adding a P-type transistor 81 and an N-type transistor 82 to drive circuit 196 of FIG. 75. P-type transistor 81 is connected in parallel to a constant current source 62 and receives signal /φP at the gate thereof. N-type transistor 82 is connected in parallel to a constant current source 64 and receives signal φP at the gate thereof In an initial state, signals /φP and φP are set to H level and L level, respectively. Since a current value of constant current source 62 is set to a small value, potential V22 at node N22 gradually rises even if switches S1a and S2a are turned into an on state when potential V22 at node N22 is lower than input potential VI. Furthermore, since a current value of constant current source 64 is set to a small value, potential V27 at node N27 gradually falls even if switches S1b and S2b are turned into an on state when potential V27 at node N27 is higher than input potential VI. Therefore, in this example modification, not only is signal /φP lowered pulsewise for a prescribed time but signal φP is raised to H level pulsewise for a prescribed time immediately after switches S1a, S2a, S1b and S2b are turned into an on state. Thereby, transistors 81 and 82 become conductive pulsewise and not only does potential V22 at node N22 quickly rise, but potential V27 at node N27 quickly falls. Therefore, in the example modification, a high speed operation in a drive circuit can be realized.

Twenty-first Embodiment

Figure 78:
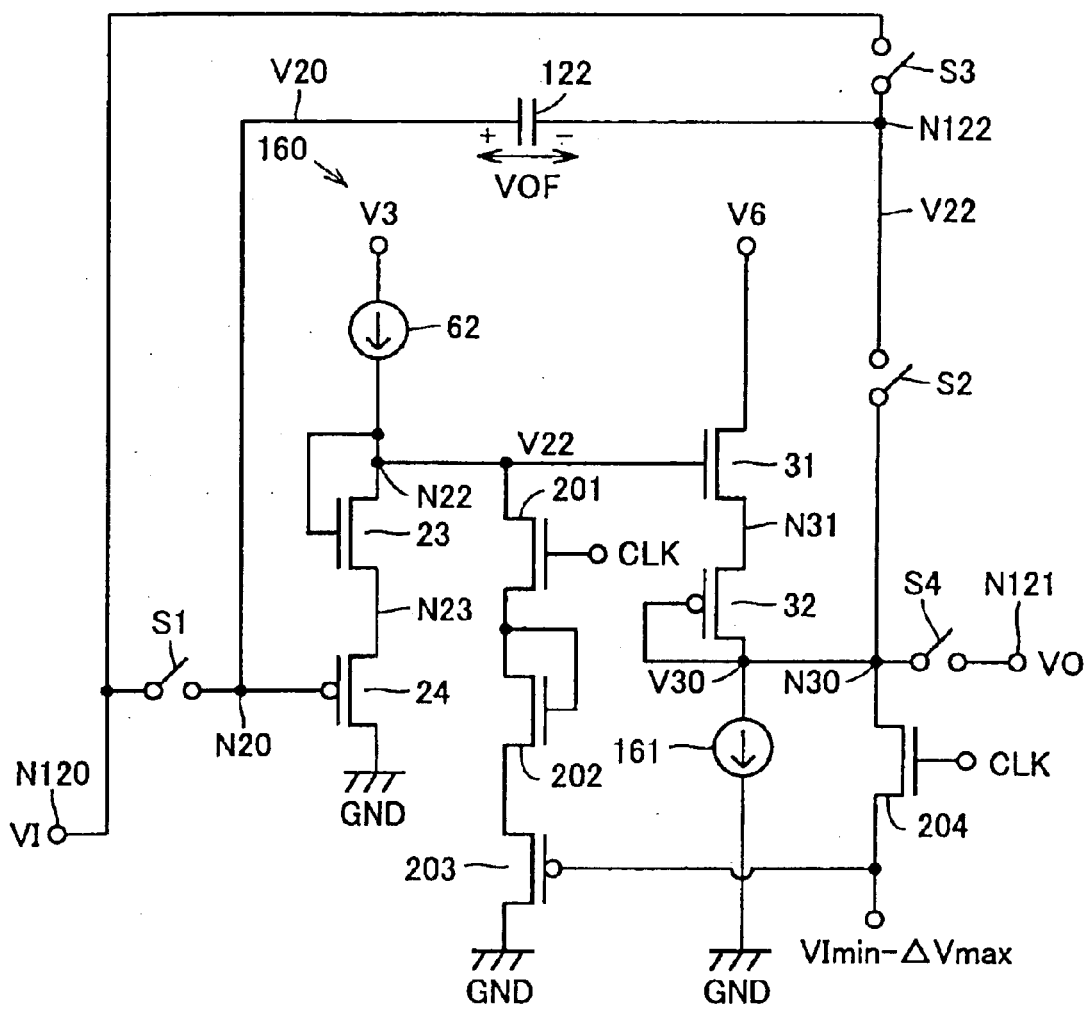
FIG. 78 is a circuit block diagram showing a configuration of a drive circuit with an offset compensation capability according to a twenty-first embodiment of the present invention.

In push type drive circuit 190 with an offset compensation capability of FIG. 72, transistors 31 and 32 are required to become conductive, in order to generate offset voltage VOF when switches S1 and S2 are turned into an on state. In order to cause transistors 31 and 32 to be conductive without fail when switches S1 and S2 are turned into an on state, potential V30 at node N30 is required to be reset to a fixed potential VImin−ΔVmax obtained by subtracting maximum value ΔVmax of offset voltage VOF from the minimum value VImin of input potential VI before switches S1 and S2 are turned into an on state. Moreover it is required to prevent a large current from flowing in transistors 31 and 32 when fixed potential VImin−ΔVmax is applied to node N30. In the twenty-first embodiment, this problem is solved., FIG. 78 is a circuit block diagram showing a configuration of a push type drive circuit 200 with an offset compensation capability according to a twenty-first embodiment of the present invention. In FIG. 78, push type drive circuit 200 with an offset compensation capability is of a configuration obtained by adding N-type transistors 201, 202 and 204, and a P-type transistor 203 to drive circuit 190 of FIG. 72. Transistors 201 to 204 constitute a reset circuit for initializing potential V30 at node N30.

That is, transistors 201 to 203 are connected in series between node N22 and the node of ground GND. The gate of N-type transistor 201 receives clock signal CLK. The gate of N-type transistor 202 is connected to the drain thereof.

N-type transistor 202 works as a diode element. The gate of P-type transistor 203 receives fixed potential VImin−ΔVmax obtained by subtracting maximum value ΔVmax of offset voltage VOF from minimum value VImin of input potential VI. The drain of N-type transistor 204 is connected to node N30, the source thereof receives fixed potential VImin−ΔVmax and the gate thereof receives clock signal CLK.

Clock signal CLK is set at H level pulsewise for a prescribed time during a period when switches S1 and S2 are kept in an on state. Thereby, N-type transistor 204 becomes conductive to drive potential V30 at node N30 to fixed potential VImin−ΔVmax, to cause transistors 31 and 32 to be conductive and to generate offset voltage VOF. N-type transistor 201 becomes conductive to cause potential V22 at node N22 to take a potential VImin−ΔVmax+|VTP|+VTN obtained by adding the absolute value |VTP| of a threshold value of P-type transistor 203 and threshold voltage VTN of N-type transistor 201 to fixed potential VImin−ΔVmax. At this time, since a potential difference between nodes N22 and N30 is |VTP|+VTN, only a small current flows in transistors 31 and 32. The other parts and operations therein are the same as in drive circuit 190 of FIG. 72; therefore, any of descriptions thereof will not be repeated.

In the twenty-first embodiment, output potential VO and input potential VI correctly coincide with each other and drive circuit 200 with low consumed power is obtained.

Note that N-type transistors 201 and 204 may be controlled using other signals. Furthermore, N-type transistors 201 and 204 may be replaced with P-type transistors. It is required, however, to give a complementary signal /CLK of signal CLK to the gates of P-type transistors. If a prescribed potential appears at node N22, the drain of P-type transistor 203 may be connected to a node at a potential other than ground potential GND. Moreover, if a prescribed current flows, a terminal on the lower potential side of constant current source 161 may be connected to a node at a potential other than ground potential GND.

Twenty-second Embodiment

In a pull type drive circuit 191 with an offset compensation capability of FIG. 73, in order to generate offset voltage VOF when switches S1 and S2 are turned into an on state, it is required to cause transistors 34 and 35 to be conductive. In order to cause transistors 34 and 35 to be conductive without fail when switches S1 and S2 are turned into an on state, it is required to reset potential V30 at node N30 to fixed potential VImax+ΔVmax obtained by adding maximum value ΔVmax of offset voltage VOF to maximum value VImax of input potential VI before switches S1 and S2 are turned into an on state. It is required to prevent that a large current flows through transistors 34 and 35 when fixed potential VImax+ΔVmax is applied to node N30. In the twenty-second embodiment, this problem is solved.

Figure 79:
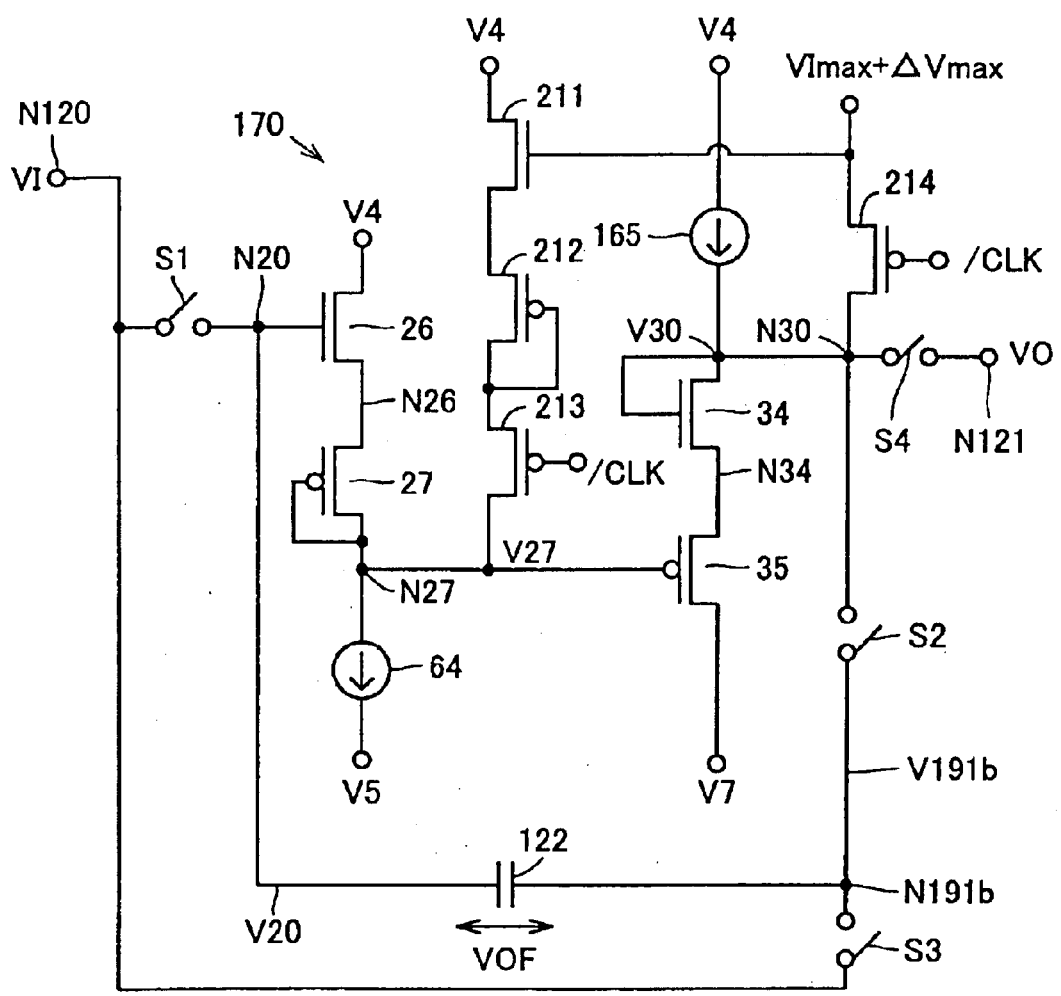
FIG. 79 is a circuit block diagram showing a configuration of a drive circuit with an offset compensation capability according a twenty-second embodiment of the present invention.
Figure 80:
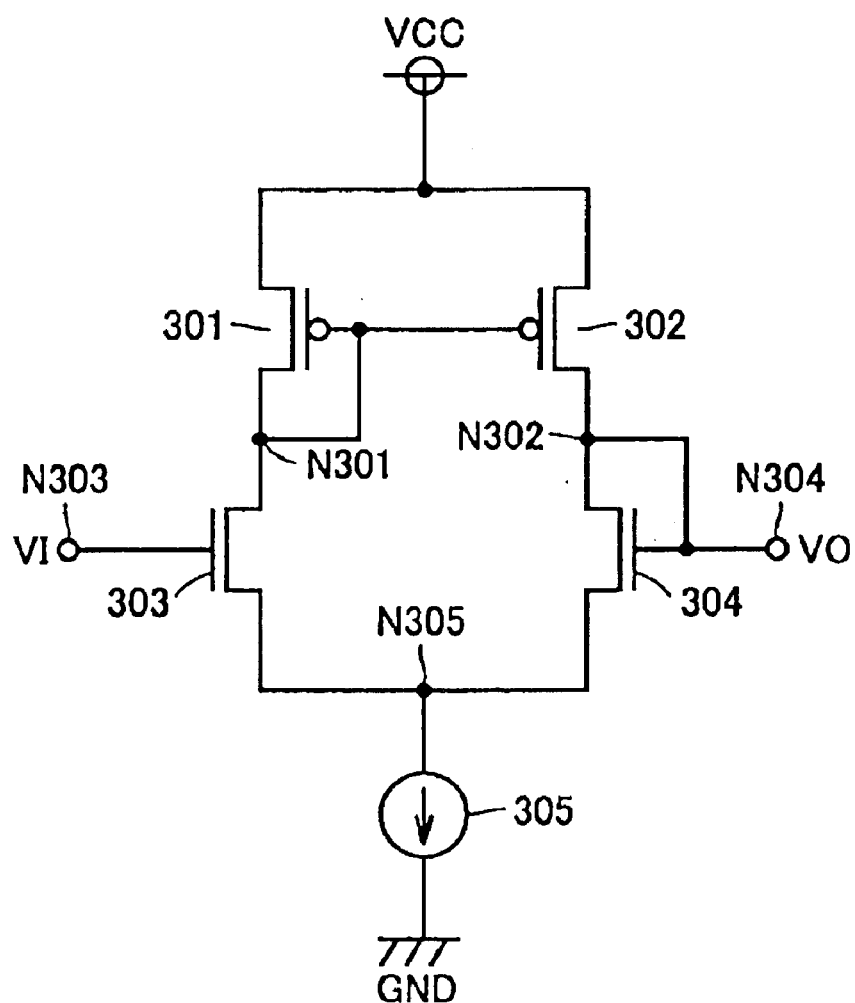
FIG. 80 is a circuit diagram showing a configuration of a conventional drive circuit.

FIG. 79 is a circuit block diagram showing a configuration of a pull type drive circuit 210 with an offset compensation-capability according a twenty-second embodiment of the present invention. In FIG. 79, pull type drive circuit 210 with an offset compensation capability is of a configuration obtained by adding an N-type transistor 211 and P-type transistors 212 to 214 to drive circuit 191 of FIG. 73. Transistors 211 to 214 constitute a reset circuit for initializing potential V30 at node N30.

That is, transistors 211 to 213 are connected in series between the node of fourth power supply potential V4 and node N27. The gate of P-type transistor 211 receives fixed potential VImax+ΔVmax obtained by adding maximum value ΔVmax of offset voltage VOF to maximum value VImax of input potential VI. The gate of P-type transistor 212 is connected to the drain thereof. P-type transistor 212 works as a diode element. The gate of P-type transistor 213 receives complementary clock signal /CLK. The drain of P-type transistor 214 is connected to node N30, the source thereof receives fixed potential VImax+ΔVmax and the gate thereof receives complementary clock signal /CLK.

Complementary clock signal /CLK is set to L level pulsewise for a prescribed time during a period when switches S1 and S2 are kept in an on state. Thereby, P-type transistor 214 becomes conductive to drive potential V30 at node N30 to fixed potential VImax+ΔVmax, and transistors 34 and 35 become conductive to generate offset voltage VOF. P-type transistor 213 becomes conductive to drive potential V27 at node N27 to a potential VImax+ΔVmax−VTN−|VTP| obtained by subtracting threshold voltage VTN of N-type transistor 211 and the absolute value |VTP| of a threshold value of P-type transistor 212 from fixed potential VImax+ΔVmax. Since a potential difference between nodes N30 and N27 takes VTN+|VTP|, only a small current flows through transistors 34 and 35. The other parts of the configuration and operation therein are the same as those in drive circuit 191 of FIG. 73, therefore, any of descriptions thereof will not be repeated.

In the twenty-second embodiment, output potential VO and input potential VI correctly coincide with each other and drive circuit 210 with low consumed power was obtained.

Note that P-type transistors 213 and 214 may be controlled by other signals. Moreover, each of P-type transistors 213 and 214 may be replaced with N-type transistors. It is required, however, that complementary signal CLK of signal /CLK is given to the gates of N-type transistors. If a prescribed potential appears at node N27, the drain of N-type transistor 211 may be connected to a node at a potential other than fourth power supply potential V4. If a prescribed current flows, a terminal on the higher potential side of constant current source 165 may be connected to a node at a potential other than fourth power supply potential V4. Moreover, if drive circuit 200 of FIG. 78 and drive circuit 210 of FIG. 79 are connected in parallel to each other, it is needless to say that a push-pull type drive circuit with a good offset compensation capability can be obtained.

Note that in the above first to twenty-second embodiments, field effect transistor may be either a MOS transistor or a thin film transistor (TFT). A thin film transistor may be either formed with a semiconductor thin film such as a polysilicon thin film, an amorphous silicon thin film or the like or formed on an insulating substrate such as a resin substrate, a glass substrate or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A drive circuit for outputting to an output node a potential corresponding to an input potential, comprising:
a first level shift circuit outputting a potential produced by level shifting an input potential by a first voltage, in a first potential direction, to produce an output potential of said first level shift circuit, wherein said first level shift circuit includes
a first current limiting element having a first electrode receiving a first power supply potential,
a first transistor of a first conductivity type, having a first electrode receiving a second power supply potential, a second electrode, and an input electrode receiving the input potential, and second transistor of a second conductivity type, having a first electrode and an input electrode connected to the second electrode of said first current limiting element, and having a second electrode connected to the second electrode of said first transistor; and a second level shift circuit outputting a potential produced by level shifting the output potential of said first level shift circuit by a second voltage, in a second potential direction, opposite the first potential direction, to an output node, wherein said second level shift circuit includes
a third transistor of the second conductivity type, having a first electrode receiving a third power supply potential, a second electrode, and an input electrode connected to the second electrode of said first current limiting element, and
a fourth transistor of the first conductivity type, having a first electrode connected to the second electrode of said third transistor, and having a second electrode and an input electrode connected to the output node.

2. The drive circuit according to claim 1, wherein said second level shift circuit further includes a second current limiting element connected between said output node and a line of a fourth power supply potential.

3. The drive circuit according to claim 2, wherein
the first and third power supply potentials are the same potential, and
the second and fourth power supply potential are the same potential.

4. The drive circuit according to claim 2, wherein said first and second current limiting elements are first and second resistance elements, respectively.

5. The drive circuit according to claim 2, wherein
said first current limiting element is a fifth transistor of the first conductivity type having an input electrode receiving a first constant voltage, and
said second current limiting element is a sixth transistor of the second conductivity type having an input electrode receiving a second constant voltage.

6. The drive circuit according to claim further comprising a constant voltage generating circuit generating the first and second constant voltages.

7. A drive circuit for outputting to an output node a potential corresponding to an input potential, comprising:
a first level shift circuit outputting a potential produced by level shifting an input potential by a first voltage, in a first potential direction, to produce an output potential of said level shift circuit;
a second level shift circuit outputting a potential produced by level shifting the output potential of said first level shift circuit by a second voltage, in a second potential direction, opposite the first potential direction, to an output node; and
a pulse generating circuit changing potential at a first node between said first and second level shift circuits pulsewise, in the first potential direction, in response to a change of the input potential in the first potential direction.

8. The drive circuit according to claim 7, wherein said pulse generating circuit includes a capacitor having a first electrode connected to the first node, and having a second electrode at which a potential is caused to change pulsewise in the first potential direction in response to a change of the input potential in the first potential direction.

9. The drive circuit according to claim 8, further comprising:

a first transistor of the first conductivity type, having a first electrode receiving a first power supply potential, and having a second electrode connected to the first node; and
a third level shift circuit generating a potential produced by level shifting the input potential by the sum of the first voltage and a threshold voltage of said first transistor in the first potential direction, and transmitting the potential generated to an input electrode of said first transistor.

10. The drive circuit according to claim 7, wherein said pulse generating circuit includes a switching element, having a first electrode receiving a first power supply potential, having a second electrode connected to the first node, and becoming conductive, pulsewise, in response to a change of the input potential in the first potential direction.

11. The drive circuit according to claim 10, wherein said pulse generating circuit further includes a current cut-off circuit preventing current from flowing between the first node and a second node having a second power supply potential when said switching element is conductive.

12. A drive circuit for outputting to an output node a potential corresponding to an input potential, comprising:
a first level shift circuit outputting a potential produced by level shifting an input potential by a first voltage, in a first potential direction, to produce an output potential of said first level shift circuit;
a second level shift circuit outputting a potential produced by level shifting the output potential of said first level shift circuit by a second voltage, in a second potential direction, opposite the first potential direction, to a first node; and
an offset compensation circuit canceling an offset voltage of said drive circuit, wherein said offset compensation circuit includes:
a first capacitor;
a first switching circuit, transmitting the input potential to a first electrode of said first capacitor and connecting a second electrode of said first capacitor to the first node;
a second switching circuit transmitting the input potential to the second electrode of said first capacitor and transmitting a potential at the first electrode of said first capacitor to said first level shift circuit instead of the input potential; and
a third switching circuit transmitting a potential at the first node to the output node.

13. The drive circuit according to claim 12, wherein said offset compensation circuit further includes a pulse generating circuit changing an analog potential at the first node pulsewise, in the second potential direction, opposite to the first potential direction, during a period when the input potential is applied to the first electrode of said first capacitor by said first switching circuit and the second electrode of said first capacitor is connected to the first node.

14. The drive circuit according to claim 13, wherein said pulse generating circuit includes a second capacitor, having a first electrode connected to the first node, and having a second electrode at which a potential is caused to change in the second potential direction, opposite to the first potential direction, at a prescribed timing.

15. The drive circuit according to claim 13, wherein said pulse generating circuit includes a switching element, having a first electrode connected to the first node, having a second electrode receiving a power supply potential, and becoming conductive, pulsewise, at a prescribed timing.

16. The drive circuit according to claim 15, wherein said pulse generating circuit further includes a current limiting circuit limiting an output current of said second level shift circuit when said switching element is conductive.

17. A drive circuit for outputting to an output node a potential corresponding to an input potential, comprising:
a first level shift circuit outputting a potential produced by level shifting an input potential by a first voltage, in a first potential direction, to produce an output potential of said first level shift circuit;
a second level shift circuit outputting a potential produced by level shifting the output potential of said first level shift circuit by a second voltage, in a second potential direction, opposite the first potential direction, to an output node; and
a third level shift circuit outputting a potential produced by level shifting the input potential by the second voltage in the second potential direction; and
a fourth level shift circuit outputting a potential produced by level shifting an output potential of said third level shift circuit by the first voltage, in the first potential direction, to the output node.

18. The drive circuit according to claim 17, further comprising a capacitor, having a first electrode and a second electrode receiving output potential of said first and third level shift circuits, respectively, and adding a change amount of an output potential of one level shift circuit of said first and third level shift circuits to an output potential of the other of said first and third level shift circuits by capacitive coupling.

19. A drive circuit for outputting to an output node a potential corresponding to an input potential, comprising:
a first level shift circuit outputting a potential produced by level shifting an input potential by a first voltage, in a first potential direction, to produce an output potential of said first level shift circuit;
a second level shift circuit outputting a potential produced by level shifting the output potential of said first level shift circuit by a second voltage, in a potential direction opposite the first potential direction, to a first node;
a third level shift circuit outputting a potential produced by level shifting the input potential by a third voltage, in a second potential direction, to produce an output potential of said third level shift circuit;
a fourth level shift circuit outputting a potential produced by level shifting the output potential of said third level shift circuit by a fourth voltage, in a potential direction opposite the second potential direction, to a second node;
a first offset compensation circuit canceling an offset voltage of said first and second level shift circuits; and
a second offset compensation circuit canceling an offset voltage of said third and fourth level shift circuits, wherein
said first offset compensation circuits includes
a first capacitor,
a first switching circuit transmitting the input potential to a first electrode of said first capacitor and connecting a second electrode of said first capacitor to the first node,
a second switching circuit transmitting the input potential to the second electrode of said first level shift circuit instead of transmitting the input potential, and
a third switching circuit transmitting the potential at the first node to the output node, and
said second offset compensation circuit includes a second capacitor,
a fourth switching circuit transmitting the input potential to a first electrode of said second capacitor and connecting the second electrode of said second capacitor to the second node,
a fifth switching circuit transmitting the input potential to the second electrode of said second capacitor and transmitting the potential at the first electrode of said second capacitor to said third level shift circuit instead of transmitting the input potential, and
a sixth switching circuit transmitting the potential at the second node to the output node.

20. The drive circuit according to claim 19, wherein said first level shift circuit includes
a first current limiting element having a first electrode receiving a first power supply potential, and
a first transistor of a first conductivity type, having a first electrode connected to a second electrode of said first current limiting element, a second electrode receiving a second power supply potential, and an input electrode receiving the input potential,
said second level shift circuit includes a second transistor of a second conductivity type, having a first electrode receiving a third power supply potential, a second electrode connected to the first node, and an input electrode connected to the second electrode of said first current limiting element,
said third level shift circuit includes
a second current limiting element having a first electrode receiving a fourth power supply potential, and
a third transistor of the second conductivity type having a first electrode connected to a second electrode of said second current limiting element, a second electrode receiving a fifth power supply potential, and an input electrode receiving the input potential, and
said fourth level shift circuit includes a fourth transistor of the first conductivity type, having a first electrode receiving a sixth power supply potential, a second electrode connected to the second node, and an input electrode connected to the second electrode of said second current limiting element.

21. The drive circuit according to claim 20, wherein said first level shift circuit further includes a fifth transistor of the second conductivity type, having a first electrode and an input electrode connected to the second electrode of said first current limiting element, and a second electrode connected to the first electrode of said first transistor,
said second level shift circuit further includes a sixth transistor of the first conductivity type, having a first electrode connected to the second electrode of said second transistor, and a second electrode and an input electrode connected the first node,
said third level shift circuit further includes a seventh transistor of the first conductivity type, having a first electrode and an input electrode connected to the second electrode of said second current limiting element, and a second electrode connected to the first electrode of said first transistor, and
said fourth level shift circuit further includes an eighth transistor of the second conductivity type, having a first electrode connected to the second electrode of said second transistor, and a second electrode and an input electrode connected to the second node.

* * * * *